United States Patent
Tsuji

(10) Patent No.: US 11,646,304 B2
(45) Date of Patent: May 9, 2023

(54) SEMICONDUCTOR DEVICE MANUFACTURING METHOD

(71) Applicant: DAICEL CORPORATION, Osaka (JP)

(72) Inventor: Naoko Tsuji, Tokyo (JP)

(73) Assignee: DAICEL CORPORATION, Osaka (JP)

(*) Notice: Subject to any disclaimer, the term of this patent is extended or adjusted under 35 U.S.C. 154(b) by 103 days.

(21) Appl. No.: 17/286,738

(22) PCT Filed: Oct. 18, 2019

(86) PCT No.: PCT/JP2019/041196
§ 371 (c)(1),
(2) Date: Apr. 19, 2021

(87) PCT Pub. No.: WO2020/085256
PCT Pub. Date: Apr. 30, 2020

(65) Prior Publication Data
US 2021/0384183 A1 Dec. 9, 2021

(30) Foreign Application Priority Data

Oct. 23, 2018 (JP) ............................. JP2018-199010

(51) Int. Cl.
*H01L 25/00* (2006.01)
*C09J 129/14* (2006.01)
(Continued)

(52) U.S. Cl.
CPC ............ *H01L 25/50* (2013.01); *C09J 129/14* (2013.01); *C09J 167/02* (2013.01); *C09J 171/02* (2013.01);
(Continued)

(58) Field of Classification Search
CPC ............ H01L 21/568; H01L 2021/6006; H01L 21/683–68792;
(Continued)

(56) References Cited

U.S. PATENT DOCUMENTS 8,415,202 B2   4/2013  Ohba
10,947,425 B2  3/2021  Koduma et al.
(Continued)

FOREIGN PATENT DOCUMENTS

JP   2015-119110 A   6/2015
JP   2016-4835 A     1/2016
(Continued)

OTHER PUBLICATIONS

Written Opinion of the International Searching Authority and International Search Report dated Dec. 3, 2019, for International Application No. PCT/JP2019/041196, with English translations.
(Continued)

*Primary Examiner* — Julio J Maldonado
*Assistant Examiner* — Stanetta D Isaac
(74) *Attorney, Agent, or Firm* — Birch, Stewart, Kolasch & Birch, LLP

(57) ABSTRACT

Provided is a technique suitable for multilayering thin semiconductor elements via adhesive bonding while avoiding wafer damage in a method of manufacturing a semiconductor device, the method in which semiconductor elements are multilayered through laminating wafers in which the semiconductor elements are fabricated. The method of the present invention includes bonding and removing. In the bonding step, a back surface 1*b* side of a thinned wafer 1T in a reinforced wafer 1R having a laminated structure including a supporting substrate S, a temporary adhesive layer 2, and the thinned wafer 1T is bonded via an adhesive to an element forming surface 3*a* of a wafer 3. A temporary
(Continued)

adhesive for forming the temporary adhesive layer 2 contains a polyvalent vinyl ether compound, a compound having two or more hydroxy groups or carboxy groups and thus capable of forming a polymer with the polyvalent vinyl ether compound, and a thermoplastic resin. The adhesive contains a polymerizable group-containing polyorganosilsesquioxane. In the removing step, a temporary adhesion by the temporary adhesive layer 2 between the supporting substrate S and the thinned wafer 1T is released to remove the supporting substrate S.

21 Claims, 14 Drawing Sheets

(51) Int. Cl.
| | |
|---|---|
| C09J 167/02 | (2006.01) |
| C09J 171/02 | (2006.01) |
| C09J 183/04 | (2006.01) |
| H01L 21/304 | (2006.01) |
| H01L 21/683 | (2006.01) |
| H01L 21/768 | (2006.01) |
| H01L 21/78 | (2006.01) |
| H01L 23/00 | (2006.01) |

(52) U.S. Cl.
CPC .......... *C09J 183/04* (2013.01); *H01L 21/304* (2013.01); *H01L 21/6835* (2013.01); *H01L 21/76898* (2013.01); *H01L 21/7806* (2013.01); *H01L 24/29* (2013.01); *H01L 24/83* (2013.01); *H01L 2224/2919* (2013.01); *H01L 2224/83855* (2013.01); *H01L 2924/0675* (2013.01); *H01L 2924/0685* (2013.01); *H01L 2924/0715* (2013.01)

(58) Field of Classification Search
CPC ..... H01L 2221/68304–68395; H01L 33/0093; H01L 51/003; H01L 21/304; H01L 21/3046; H01L 21/02013; H01L 21/02021; H01L 21/463; B24B 7/228; B24B 9/065

See application file for complete search history.

(56) References Cited

U.S. PATENT DOCUMENTS

| | | |
|---|---|---|
| 2011/0165730 A1 | 7/2011 | Ohba |
| 2016/0163579 A1* | 6/2016 | Nakamura ............ B32B 37/182 428/189 |
| 2019/0119534 A1 | 4/2019 | Koduma et al. |

FOREIGN PATENT DOCUMENTS

| | | |
|---|---|---|
| JP | 2016-178162 A | 10/2016 |
| JP | 2017-132919 A | 8/2017 |
| KR | 10-2010-0066942 A | 6/2010 |
| WO | WO 2010/032729 A1 | 3/2010 |
| WO | WO 2016/204115 A1 | 12/2016 |
| WO | WO 2017/061416 A1 | 4/2017 |

OTHER PUBLICATIONS

Written Opinion of the International Searching Authority and International Search Report dated Jan. 7, 2020, for International Application No. PCT/JP2019/041197, with English translations.
Written Opinion of the International Searching Authority and International Search Report dated Jan. 7, 2020, for International Application No. PCT/JP2019/041198, with English translations.
Written Opinion of the International Searching Authority and International Search Report dated Jan. 7, 2020, for International Application No. PCT/JP2019/041202, with English translations.
Korean Office Action for corresponding Korean Application No. 10-2021-7014956, dated Jul. 25, 2022.

* cited by examiner (a)

(b)

(c)

SEMICONDUCTOR DEVICE MANUFACTURING METHOD

TECHNICAL FIELD

The present invention relates to a method of manufacturing a semiconductor device having a laminated structure including a plurality of semiconductor elements. The present application claims priority to the Japanese Patent Application No. 2018-199010 filed in Japan on Oct. 23, 2018, the contents of which are incorporated herein.

BACKGROUND ART

In recent years, primarily for the purpose of further increasing the density of semiconductor devices, technology for manufacturing semiconductor devices having a three-dimensional structure in which a plurality of semiconductor chips or semiconductor elements is integrated in their thickness direction has been developed. One of such a technology widely known is a wafer-on-wafer (WOW) process. In the WOW process, a structure is such that a predetermined number of semiconductor wafers, within which a plurality of semiconductor elements is fabricated for each of the semiconductor wafers. In such a structure, the semiconductor elements are arranged in multilayers in their thickness direction, and the wafer laminate is divided into individual semiconductor devices through dicing.

The lamination of each semiconductor wafer in the WOW process is performed, for example, as follows. First, a semiconductor wafer to be laminated is bonded to a predetermined supporting substrate via an adhesive. The semiconductor wafer has a surface (element forming surface) on a side on which a plurality of semiconductor elements are formed through transistor formation, wiring formation, or the like, and a back surface opposite from the element forming surface, and the element forming surface side of the semiconductor wafer is affixed via an adhesive to the supporting substrate. Then, the semiconductor wafer in a state of being supported by the supporting substrate is thinned by grinding the back surface side of the semiconductor wafer. Then, the back surface side of the semiconductor wafer thus thinned (having the supporting substrate on the element forming surface side) is bonded via an adhesive to a thick base wafer or to a thin semiconductor wafer laminated on the base wafer in advance. Thereafter, the supporting substrate is removed from the element forming surface side of the semiconductor wafer laminated with the supporting substrate (supporting substrate removal). Such a WOW process is described, for example, in Patent Documents 1 and 2 listed below.

CITATION LIST

Patent Document

Patent Document 1: WO 2010/032729
Patent Document 2: JP 2016-178162 A

SUMMARY OF INVENTION

Technical Problem

For a technique to perform the supporting substrate removal in the WOW process as described above, grinding removal and mechanical peeling of the supporting substrate are known. However, these techniques are apt to apply strong localized stress to the laminated thin semiconductor wafer and thus likely to damage the wafer.

The present invention was conceived under the circumstances as described above, and an object of the present invention is to provide a technique suitable for multilayering thin wafers via adhesive bonding while avoiding wafer damage in a method of manufacturing a semiconductor device, the method in which semiconductor elements are multilayered through laminating wafers in which the semiconductor elements are fabricated.

Solution to Problem

A method of manufacturing a semiconductor device, the method provided by the present invention, includes steps of preparing, thinning, bonding, and removing as described below.

In the preparing step, a reinforced wafer is prepared. The reinforced wafer has a laminated structure including a wafer having an element forming surface and a back surface opposite from the element forming surface, a supporting substrate, and a temporary adhesive layer located between the element forming surface side of the wafer and the supporting substrate. The element forming surface of the wafer is a side of the surface on which a plurality of semiconductor elements is formed through transistor formation, wiring formation, or the like. The temporary adhesive layer is for achieving a temporary adhesion between the supporting substrate and the wafer, and a temporary adhesive for forming the temporary adhesive layer contains a polyvalent vinyl ether compound, a compound having two or more hydroxy groups or carboxy groups that are capable of forming an acetal bond by reacting with a vinyl ether group of the polyvalent vinyl ether compound so as to form a polymer with the polyvalent vinyl ether compound, and a thermoplastic resin. The temporary adhesive layer in the reinforced wafer is formed by solidification by formation of the polymer in the temporary adhesive interposed between the wafer and the supporting substrate.

In the thinning step, the wafer in such a reinforced wafer is ground from the back surface side of the wafer and thinned. This forms a thinned wafer in a state of being supported by the supporting substrate.

In the bonding step, an element forming surface side of a base wafer having the element forming surface and a back surface opposite from the element forming surface is bonded via an adhesive to the back surface side of the thinned wafer described above of the reinforced wafer. The adhesive contains a polymerizable group-containing polyorganosilsesquioxane (i.e., a polyorganosilsesquioxane having a polymerizable functional group). The present bonding step preferably includes a curing treatment to cure the adhesive at a temperature lower than a softening point of the polymer in the temporary adhesive layer. In such a bonding step, for example, the adhesive is coated on one or both surfaces to be bonded (the element forming surface of the base wafer, the back surface of the thinned wafer), the surfaces to be bonded are affixed via the adhesive, and the adhesive is cured after the affixing. In addition, in the bonding step, prior to the coating of the adhesive, one or both of the surfaces to be bonded may be treated with a silane coupling agent.

In the removing step, the temporary adhesion by the temporary adhesive layer between the supporting substrate and the thinned wafer in the reinforced wafer having undergone the bonding step described above is released to remove the supporting substrate. The present removing step preferably includes a softening treatment to soften the temporary adhesive layer at a temperature higher than the softening point of the polymer in the temporary adhesive layer.

As described above, the present method of manufacturing a semiconductor device includes a bonding step for wafer-to-wafer bonding with the adhesive containing a polymerizable group-containing polyorganosilsesquioxane. The polymerizable group-containing polyorganosilsesquioxane is suitable for achieving a relatively low polymerization temperature or curing temperature of, for example, approximately 30 to 200° C. and is suitable for achieving high heat resistance after curing. Thus, the wafer-to-wafer adhesive bonding with the adhesive containing the polymerizable group-containing polyorganosilsesquioxane is suitable for achieving high heat resistance in an adhesive layer to be formed between the wafers as well as achieving lower curing temperature for forming the adhesive layer and thus preventing damages to the elements in the wafer as an adherend.

In the present method of manufacturing a semiconductor device, as described above, the wafer (the wafer of the reinforced wafer) affixed to the supporting substrate via the temporary adhesive layer for achieving the temporary adhesion is thinned and then bonded to the base wafer (bonding step), and then the supporting substrate is removed from the thinned wafer (removing step). In addition, as described above, the temporary adhesive for forming the temporary adhesive layer contains a polyvalent vinyl ether compound, a compound having two or more hydroxy groups or carboxy groups that are capable of forming an acetal bond by reacting with a vinyl ether group of the polyvalent vinyl ether compound so as to form a polymer with the polyvalent vinyl ether compound, and a thermoplastic resin. The temporary adhesive thus configured is suitable, in the form of the temporary adhesive layer formed by solidification between the supporting substrate and the wafer, for achieving a relatively high softening temperature of, for example, approximately 130 to 250° C. while ensuring high adhesive strength that can withstand the grinding or the like in the thinning step of the wafer.

The temporary adhesive layer described above in the reinforced wafer to be subjected to the bonding step is thus suitable for achieving a relatively high softening temperature, and the adhesive (adhesive containing a polymerizable group-containing polyorganosilsesquioxane) used in the above bonding is suitable for achieving a relatively low curing temperature and high heat resistance after curing as described above. This composite configuration is suitable for performing each bonding and performing each subsequent removing both in combination. That is, the composite configuration is suitable for performing the bonding at a relatively low temperature condition to achieve a good adhesive bonding of the thinned wafer to the base wafer while maintaining the temporary adhesion of the supporting substrate and the thinned wafer in the reinforced wafer as well as for performing the subsequent removing at a relatively high temperature condition to soften the temporary adhesive layer to remove the supporting substrate from the thinned wafer while maintaining the adhesive bonding between the base wafer and the thinned wafer. The configuration of releasing the temporary adhesion by the temporary adhesive layer through softening the temporary adhesive layer in removing the supporting substrate from the thinned wafer is suitable for avoiding or preventing a strong stress applied locally to the thinned wafer to avoid damage to the wafer.

As described above, the present method of manufacturing a semiconductor device is suitable for multilayering thin wafers via adhesive bonding while avoiding wafer damage.

Known examples of the adhesive used for bonding semiconductor wafers themselves or bonding electronic components themselves include thermosetting adhesives containing benzocyclobutene (BCB). To appropriately cure a BCB-containing thermosetting adhesive, high temperature heating at approximately 220 to 350° C. is required. Thus, in the use of a BCB-containing thermosetting for wafer-to-wafer bonding in the bonding step of the WOW process, the bonding needs to undergo high temperature heating at approximately 220 to 350° C. However, the practical application of an adhesive that can maintain the temporary adhesion without softening under such a high temperature condition but can also be properly softened in the subsequent removing step faces technical challenges. Thus, in the use of a BCB-containing thermosetting adhesive for wafer-to-wafer bonding in the bonding step in the WOW process, it is practically difficult to employ a temporary adhesive that can release the temporary adhesion through softening in the removing step. On the other hand, known examples of the adhesive used for bonding semiconductor wafers themselves or bonding electronic components themselves also include thermosetting adhesives containing a novolac epoxy resin. The thermosetting adhesive containing a novolac epoxy resin can cure at a temperature lower than a BCB-containing thermosetting adhesive, but has a problem in that when exposed to a high temperature process (e.g., from 260 to 280° C.), such as a lead-free solder reflowing, in a manufacturing process of a semiconductor device, the adhesive component is apt to degrade and reduce the adhesion.

In contrast, the method of manufacturing a semiconductor device of the present invention employs the adhesive containing a polymerizable group-containing polyorganosilsesquioxane described above as the adhesive for wafer-to-wafer bonding rather than a BCB-containing thermosetting adhesive or a novolac epoxy resin-containing thermosetting adhesive. In addition, the present method employs the temporary adhesive layer described above (containing a polyvalent vinyl ether compound, a compound having two or more hydroxy groups or carboxy groups and thus capable of forming a polymer with the polyvalent vinyl ether compound, and a thermoplastic resin) to form the temporary adhesive layer in the reinforced wafer and provides a technique suitable for multilayering thin wafers via adhesive bonding while avoiding wafer damage.

The present method of manufacturing a semiconductor device preferably further includes preparing at least one additional reinforced wafer, thinning for each additional reinforced wafer, additional bonding for each additional reinforced wafer, and removing after the additional bonding. The additional reinforced wafer has a laminated structure including a wafer having an element forming surface and a back surface opposite from the element forming surface, a supporting substrate, and a temporary adhesive layer between the element forming surface side of the wafer and the supporting substrate. The temporary adhesive layer is formed from the temporary adhesive described above. In the thinning step for each additional reinforced wafer, the wafer in such an additional reinforced wafer is ground from the back surface side of the wafer to form a thinned wafer. In the additional bonding for each additional reinforced wafer, the back surface side of the thinned wafer in the additional reinforced wafer is bonded to the element forming surface side of the thinned wafer on the base wafer via the above adhesive (the adhesive containing the polymerizable group-containing polyorganosilsesquioxane). The thinned wafer on the base wafer is a thinned wafer bonded to the base wafer in the bonding step described above or a thinned wafer additionally laminated on the thinned wafer in a preceding additional bonding. The present additional bonding preferably includes a curing treatment to cure the adhesive at a temperature lower than a softening point of the polymer in the temporary adhesive layer. In such an additional bonding, for example, the adhesive is coated on one or both surfaces to be bonded (the element forming surface of one thinned wafer, the back surface of the other thinned wafer), the surfaces to be bonded are affixed via the adhesive, and the adhesive is cured after the affixing. In addition, in the additional bonding, prior to the coating of the adhesive, one or both of the surfaces to be bonded may be treated with a silane coupling agent. Then, in the removing step after the additional bonding step, the temporary adhesion by the temporary adhesive layer between the supporting substrate and the thinned wafer in the additional reinforced wafer is released to remove the supporting substrate. The present additional removing step preferably includes a softening treatment to soften the temporary adhesive layer at a temperature higher than the softening point of the polymer in the temporary adhesive layer. The configuration as described above is suitable for further multilayering thin wafers via adhesive bonding while avoiding wafer damage.

The present method of manufacturing a semiconductor device preferably further includes forming a through electrode in a wafer laminate obtained through the removing step. The through electrode formed in this through electrode forming extends through an inside of a wafer laminate from an element forming surface of a thinned wafer located at one end in a lamination direction in the wafer laminate to an element forming surface of a base wafer located at another end in the lamination direction in the wafer laminate. Such a configuration allows the semiconductor elements to be appropriately electrically connected at short distances in a semiconductor device to be manufactured. Thus, the configuration is suitable for achieving an efficient digital signal processing, for reducing attenuation of the high-frequency signal, and also for reducing power consumption in a semiconductor device to be manufactured.

The present method of manufacturing a semiconductor device preferably further includes thinning the base wafer by grinding on the back surface side in the base wafer. The present thinning step allows the base wafer to be thinned to a predetermined thickness. Such a configuration is suitable for reducing the thickness of a semiconductor device to be manufactured.

The present method of manufacturing a semiconductor device may further include through electrode forming as follows and subsequent base wafer thinning. In the through electrode forming step, a through electrode extending through an inside of a wafer laminate, the wafer laminate obtained through the removing step, from an element forming surface of a thinned wafer located at one end in a lamination direction in the wafer laminate to a position exceeding an element forming surface in the lamination direction in the wafer laminate is formed. In the base wafer thinning step after such a through electrode forming step, the base wafer is thinned by grinding on the back surface side of the base wafer to expose the through electrode on the back surface side. In the wafer laminate having undergone the present base wafer thinning, step the through electrode is exposed on the element forming surface of the thinned wafer located at one end in a wafer lamination direction and is exposed on the back surface of the base wafer located at another end in the wafer lamination direction. Such a configuration is suitable for appropriately electrically connect the semiconductor elements at short distances in a semiconductor device to be manufactured while reducing the thickness of the semiconductor device.

When the present method of manufacturing a semiconductor device includes the above base wafer thinning step, the present method preferably further includes bonding an element forming surface side of a thinned wafer located at one end of a wafer laminate in a lamination direction, the wafer laminate obtained through one base wafer thinning step, to an element forming surface side of a thinned wafer located at one end of a wafer laminate in a lamination direction, the wafer laminate obtained through another base wafer thinning step (face-to-face bonding). Alternatively, the present method may further include bonding an element forming surface side of a thinned wafer located at one end of a wafer laminate in a lamination direction, the wafer laminate obtained through one base wafer thinning step, to a back surface side of a base wafer located at one end of a wafer laminate in a lamination direction, the wafer laminate obtained through another base wafer thinning step (face-to-back bonding). Alternatively, the present method may further include bonding a back surface side of a base wafer located at one end of a wafer laminate in a lamination direction, the wafer laminate obtained through one base wafer thinning step, to a back surface side of a base wafer located at one end in a lamination direction in a wafer laminate, the wafer laminate obtained through another base wafer thinning step (back-to-back bonding). These configurations are suitable for efficiently further multilayering wafers or semiconductor elements.

DESCRIPTION OF EMBODIMENTS

Figure 1:
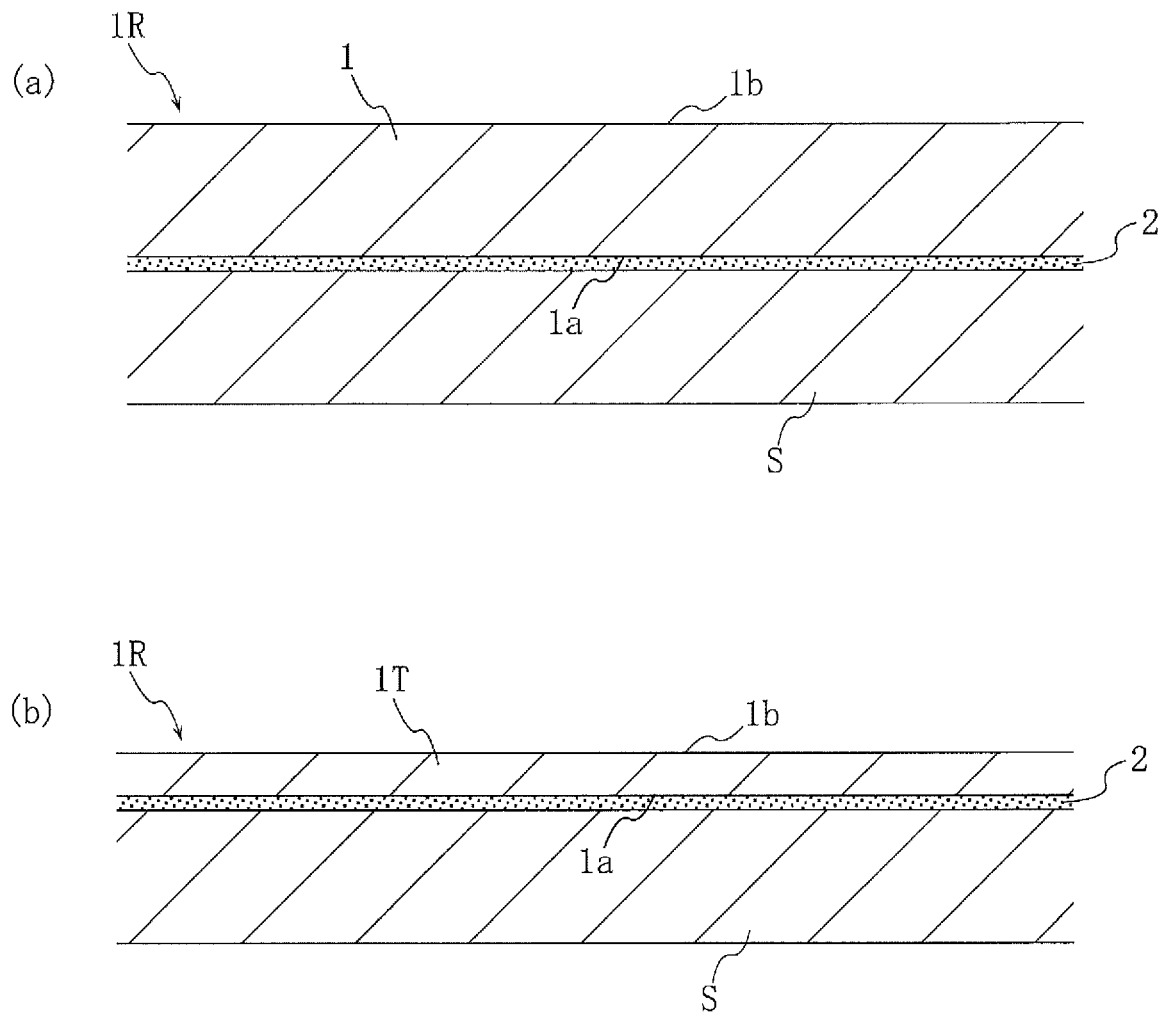
FIG. 1 illustrates some processes in a method of manufacturing a semiconductor device according to an embodiment of the present invention.
Figure 2:
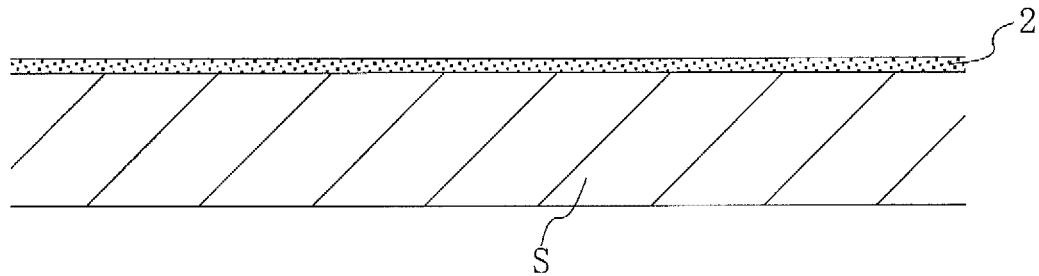
FIG. 2 illustrates some processes in a method of manufacturing a semiconductor device according to an embodiment of the present invention.
Figure 2:
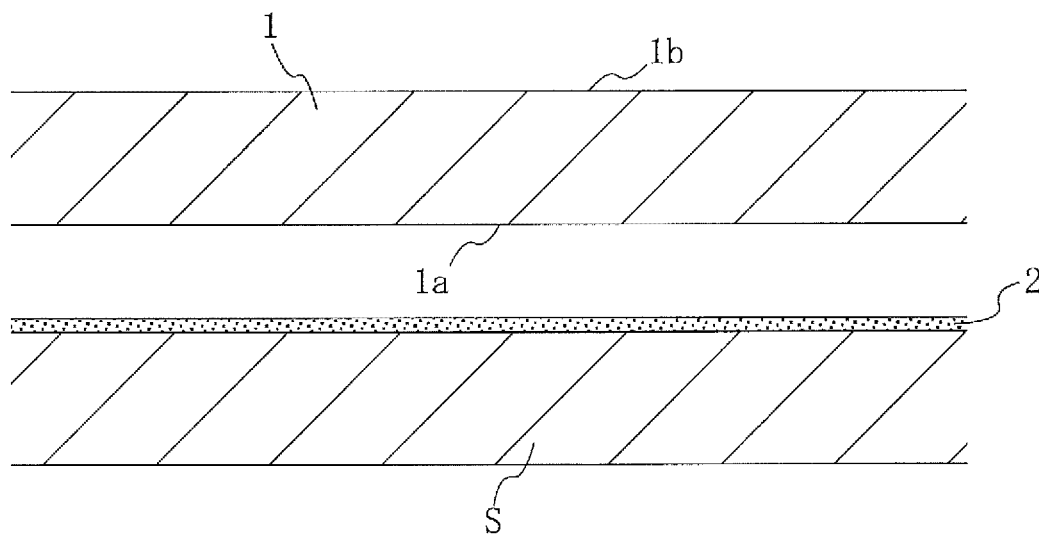
Figure 2:
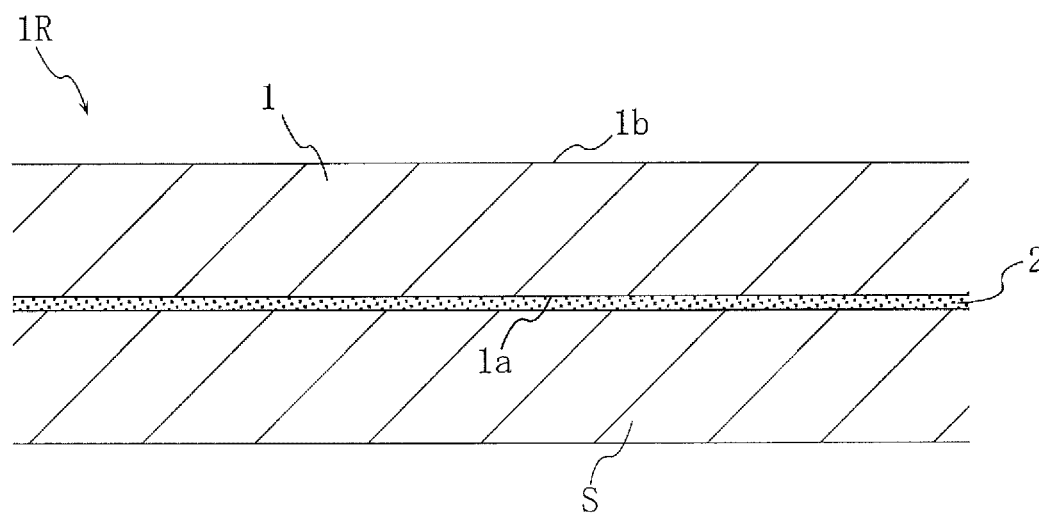

FIG. 1 to FIG. 9 illustrate a method of manufacturing a semiconductor device according to an embodiment of the present invention. This manufacturing method is a method of manufacturing a semiconductor device having a three-dimensional structure in which semiconductor elements are integrated in their thickness direction, and FIG. 1 to FIG. 9 illustrate manufacturing processes in partial cross-sectional views.

In the present method of manufacturing a semiconductor device, first, a reinforced wafer 1R as illustrated in FIG. 1(a) is prepared (preparing step). The reinforced wafer 1R has a laminated structure including a wafer 1, a supporting substrate S, and a temporary adhesive layer 2 between the wafer 1 and the supporting substrate S.

The wafer 1 is a wafer having a semiconductor wafer main body in which a semiconductor element can be fabricated, and has an element forming surface 1a and a back surface 1b opposite from the element forming surface 1a. In the present embodiment, the element forming surface of the wafer is a surface on the side on which a plurality of semiconductor elements (not illustrated) is formed in the wafer through transistor formation. Each semiconductor element of the wafer 1 has, for example, a multi-layered wiring structure portion including an exposed electrode pad on a surface. Alternatively, the wafer 1 may be a wafer in which various semiconductor elements are already fabricated on the side of the element forming surface 1a, and a wiring structure necessary for the semiconductor elements is subsequently formed on the element forming surface 1a. Examples of a constituent material for forming the semiconductor wafer main body of the wafer 1 include silicon (Si), germanium (Ge), silicon carbide (SiC), gallium arsenide (GaAs), gallium nitride (GaN), and indium phosphide (InP). The thickness of such a wafer 1 is preferably not greater than 1000 μm, more preferably not greater than 900 μm, and more preferably not greater than 800 μm from the perspective of reducing the grinding time in grinding described later. In addition, the thickness of the wafer 1 is, for example, not less than 500 μm.

The supporting substrate S in the reinforced wafer 1R is for reinforcing the wafer 1 to be thinned through thinning described below. Examples of the supporting substrate S include silicon wafers and glass wafers. From the perspective of ensuring a function as a reinforcing element, the thickness of the supporting substrate S is preferably not less than 300 μm, more preferably not less than 500 μm, and more preferably not less than 700 μm. In addition, the thickness of the supporting substrate S is, for example, not greater than 800 μm. Such a supporting substrate S is bonded to the side of the element forming surface 1a of the wafer 1 via the temporary adhesive layer 2.

The temporary adhesive layer 2 is for achieving a temporary adhesion between the wafer 1 and the supporting substrate S, the temporary adhesion that can be subsequently released. The temporary adhesive for forming such a temporary adhesive layer 2 contains at least a polyvalent vinyl ether compound (A), a compound (B) having two or more hydroxy groups or carboxy groups that are capable of forming an acetal bond by reacting with a vinyl ether group of the polyvalent vinyl ether compound (A) so as to form a polymer with the polyvalent vinyl ether compound (A), and a thermoplastic resin (C). Each component in the temporary adhesive is as specifically described later.

Such reinforced wafer 1R thus configured can be produced, for example, through processes as follows. First, as illustrated in FIG. 2(a), the temporary adhesive layer 2 is formed on the supporting substrate S. Specifically, a temporary adhesive for forming the temporary adhesive layer 2 is coated on the supporting substrate S, for example, by spin coating to form a temporary adhesive coating. The coating is dried by heating, and the temporary adhesive layer 2 can be formed. The temperature of the heating is, for example, from 100 to 300° C., and may be constant or may be changed stepwise. The heating time is, for example, from 30 seconds to 30 minutes. Next, as illustrated in FIG. 2(b) and FIG. 2(c), the supporting substrate S and the wafer 1 are bonded via the temporary adhesive layer 2. As described above, the wafer 1 has the element forming surface 1a and the back surface 1b opposite from the element forming surface 1a. In the present preparing, for example, the supporting substrate S and the wafer 1 are affixed via the temporary adhesive layer 2 under pressure, then the temporary adhesive layer 2 is solidified through heating to form a polymer having a softening point in a high-temperature range, and the supporting substrate S and the wafer 1 are adhered with the temporary adhesive layer 2. In the affixing, the pressure is, for example, from 300 to 5000 g/cm$^2$, and the temperature is, for example, from 30 to 200° C. In addition, in the bonding with the temporary adhesive layer 2, the heating temperature is, for example, from 100 to 300° C. and preferably from 100 to 250° C., and the heating time is, for example, from 30 seconds to 30 minutes and preferably from 3 to 12 minutes. The heating temperature may be constant or may be changed stepwise. As described above, the reinforced wafer 1R having a laminated structure including the wafer 1, the supporting substrate S, and the temporary adhesive layer 2 between the wafer 1 and the supporting substrate S.

The polyhydric vinyl ether compound (A) described above in the temporary adhesive is a compound having two or more vinyl ether groups in a molecule and is represented, for example, by Formula (a) below.

[Chem. 1]

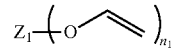

(a)

In Formula (a), $Z_1$ represents a group in which $n_1$ hydrogen atoms are removed from a structural formula of a saturated or unsaturated aliphatic hydrocarbon, a saturated or unsaturated alicyclic hydrocarbon, an aromatic hydrocarbon, a heterocyclic compound, or a bonded body in which any of these are bonded via a single bond or a linking group.

In addition, in Formula (a), $n_1$ represents an integer of 2 or greater, for example, an integer from 2 to 5, and preferably an integer of 2 or 3.

Among the groups in which $n_1$ hydrogen atoms are removed from a structural formula of a saturated or unsaturated aliphatic hydrocarbon, examples of the group in which two hydrogen atoms are removed from a structural formula of a saturated or unsaturated aliphatic hydrocarbon may include linear or branched alkylene groups, such as a methylene group, an ethylene group, a propylene group, a trimethylene group, a tetramethylene group, a pentamethylene group, a hexamethylene groups, an octamethylene group, a decamethylene group, and a dodecamethylene group; and linear or branched alkenylene groups, such as a vinylene group, a 1-propenylene group, and 3-methyl-2-butenylene group. The alkylene group has, for example, from 1 to 20 carbon atoms and preferably has from 1 to 10 carbon atoms. The alkenylene group has, for example, from 2 to 20 carbon atoms and preferably has from 2 to 10 carbon atoms. Examples of the group in which three or more hydrogen atoms are removed from a structural formula of a saturated or unsaturated aliphatic hydrocarbon may include groups in which one or more hydrogen atoms are further removed from the structural formula of any of these groups exemplified.

Among the groups in which $n_1$ hydrogen atoms are removed from a structural formula of a saturated or unsaturated alicyclic hydrocarbon, examples of the group in which two hydrogen atoms are removed from a structural formula of a saturated or unsaturated alicyclic hydrocarbon may include cycloalkylene groups of a 3- to 15-membered ring, such as a 1,2-cyclopentylene group, a 1,3-cyclopentylene group, a 1,2-cyclohexylene group, a 1,3-cyclohexylene group, and a 1,4-cyclohexylene group; cycloalkenylene groups of a 3- to 15-membered ring, such as a cyclopentenylene group and a cyclohexenylene group; cycloalkylidene groups of a 3- to 15-membered ring, such as a cyclopentylidene group and a cyclohexylidene group; and divalent bridged cyclic hydrocarbon groups of a 4- to 15-membered ring, such as an adamantanediyl group, a norbornanediyl group, a norbornenediyl group, an isobornanediyl group, a tricyclodecanediyl group, a tricycloundecanediyl group, and a tetracyclododecanediyl group. Examples of the group in which three or more hydrogen atoms are removed from a structural formula of a saturated or unsaturated alicyclic hydrocarbon may include groups in which one or more hydrogen atoms are further removed from the structural formula of any of these groups exemplified.

Examples of the aromatic hydrocarbon may include benzene, naphthalene, and anthracene.

The heterocyclic compound includes aromatic heterocyclic compounds and non-aromatic heterocyclic compounds. Examples of such heterocyclic compounds may include heterocyclic compounds containing an oxygen atom as a heteroatom (e.g., 5-membered rings, such as furan, tetrahydrofuran, oxazole, isooxazole, and γ-butyrolactone; 6-membered rings, such as 4-oxo-4H-pyran, tetrahydropyran, and morpholine; fused rings, such as benzofuran, isobenzofuran, 4-oxo-4H-chromene, chroman, and isochroman; and bridged rings, such as 3-oxatricyclo[4.3.1.1$^{4,8}$]undecane-2-one and 3-oxatricyclo[4.2.1.0$^{4,8}$]nonane-2-one), heterocyclic compounds containing a sulfur atom as a heteroatom (e.g., 5-membered rings, such as thiophene, thiazole, isothiazole, and thiadiazole; 6-membered rings, such as 4-oxo-4H-thiopyran; and fused rings such as benzothiophene), and heterocyclic compounds containing a nitrogen atom as a heteroatom (e.g., 5-membered rings, such as pyrrole, pyrrolidine, pyrazole, imidazole, and triazole; 6-membered rings, such as pyridine, pyridazine, pyrimidine, pyrazine, piperidine, and piperazine; and fused rings, such as indole, indoline, quinoline, acridine, naphthyridine, quinazoline, and purine).

Examples of the linking group may include divalent to tetravalent hydrocarbon groups, a carbonyl group (—CO—), an ether bond (—O—), a sulfide bond (—S—), an ester bond (—COO—), an amide bond (—CONH—), a carbonate bond (—OCOO—), a urethane bond (—NHCOO—), an —NR— bond (R represents a hydrogen atom, an alkyl group, or an acyl group), and groups in which a plurality of these groups are linked. Among the divalent to tetravalent hydrocarbon groups, examples of the divalent hydrocarbon group may include linear or branched alkylene groups having from 1 to 10 carbon atoms, such as a methylene group, a methylmethylene group, a dimethylmethylene group, an ethylene group, a propylene group, and a trimethylene group; and alicyclic hydrocarbon groups having from 4 to 15 carbon atoms (in particular, cycloalkylene groups), such as a 1,2-cyclopentylene group, a 1,3-cyclopentylene group, a cyclopentylidene group, a 1,2-cyclohexylene group, a 1,3-cyclohexylene group, a 1,4-cyclohexylene group, and a cyclohexylidene group. Examples of the trivalent hydrocarbon group may include a group in which one hydrogen atom is removed from a structural formula of the divalent hydrocarbon group. Examples of the tetravalent hydrocarbon group may include a group in which two hydrogen atoms are removed from a structural formula of the divalent hydrocarbon group.

$Z_1$ may have one or two or more substituents. Examples of the substituent may include alkyl groups, cycloalkyl groups, alkenyl groups, cycloalkenyl groups, aryl groups, hydroxy groups, carboxy groups, nitro groups, amino groups, mercapto groups, halogen atoms, $C_{2-10}$ hydrocarbon groups substituted with a halogen atom, hydrocarbon groups containing a functional group containing a heteroatom (such as oxygen or sulfur), and a group in which two or more of these groups are bonded. Examples of the alkyl groups include $C_{1-4}$ alkyl groups, such as a methyl group and an ethyl group. Examples of the cycloalkyl groups include $C_{3-10}$ cycloalkyl groups. Examples of the alkenyl groups include $C_{2-10}$ alkenyl groups, such as a vinyl group. Examples of the cycloalkenyl groups include $C_{3-10}$ cycloalkenyl groups. Examples of the aryl groups include $C_{6-15}$ aryl groups, such as a phenyl group and a naphthyl group. Examples of the hydrocarbon groups containing a heteroatom-containing functional group include $C_{1-4}$ alkoxy groups and $C_{2-6}$ acyloxy groups.

Specific examples of the polyvalent vinyl ether compound (A) may include 1,4-butanediol divinyl ether, diethylene glycol divinyl ether, and triethylene glycol divinyl ether, and compounds represented by Formulas (a-1) to (a-21) below.

[Chem. 2]

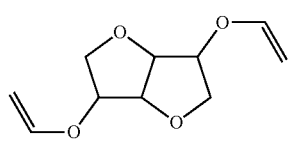

(a-1)

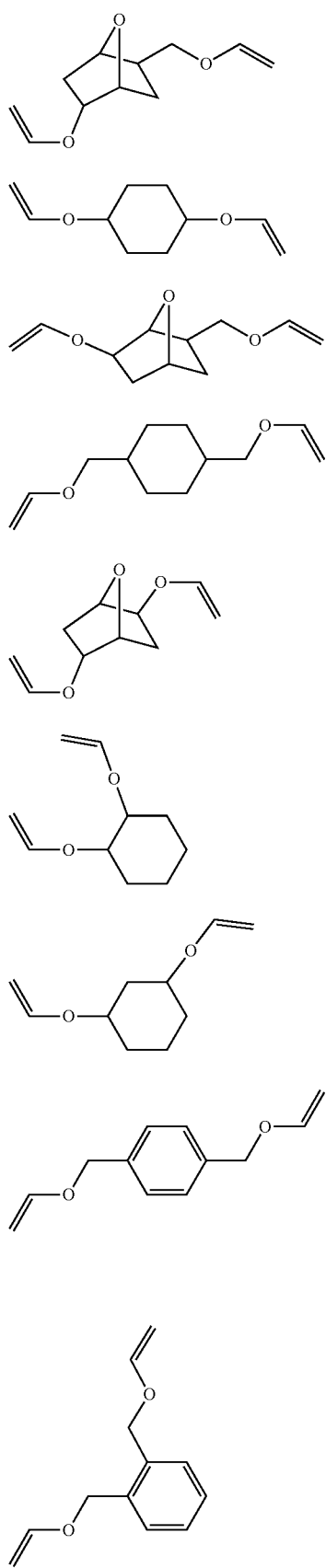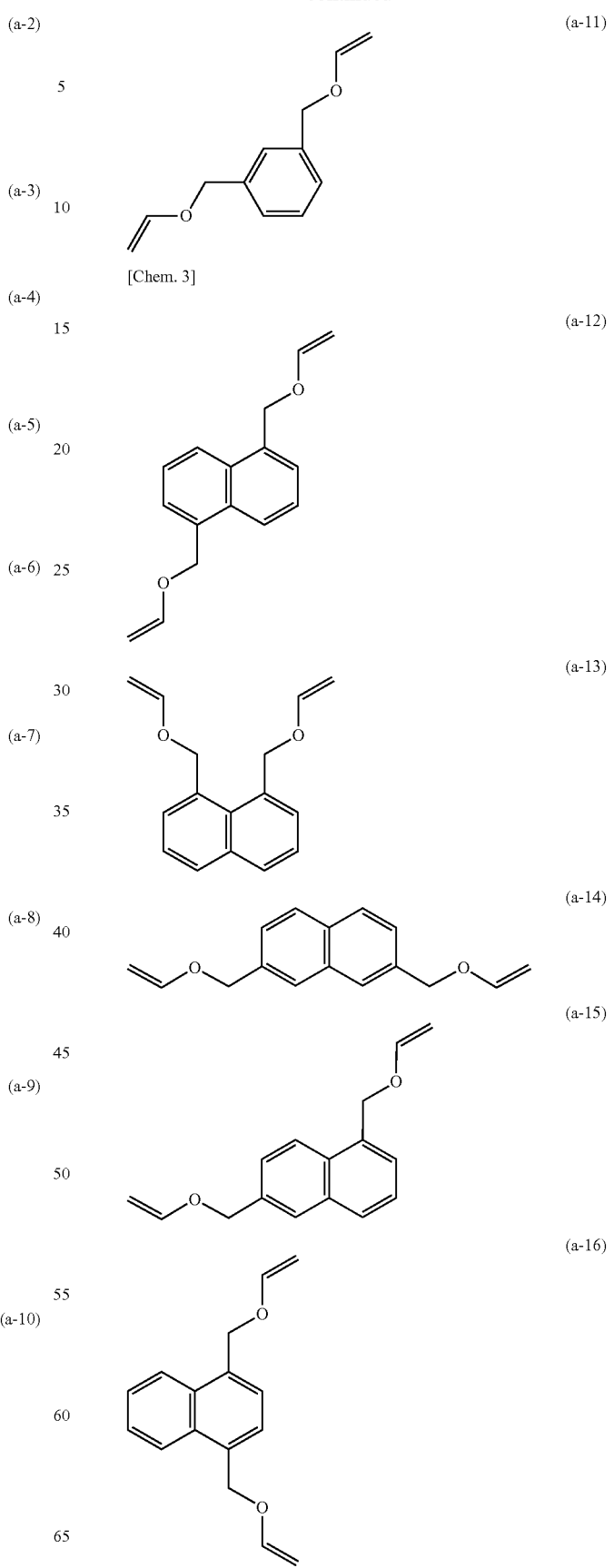

-continued

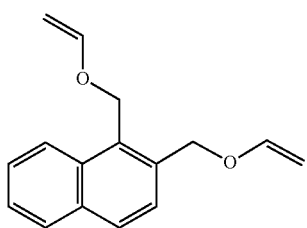
(a-17)

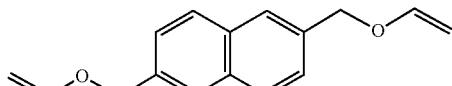
(a-18)

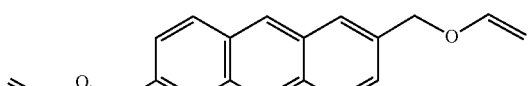
(a-19)

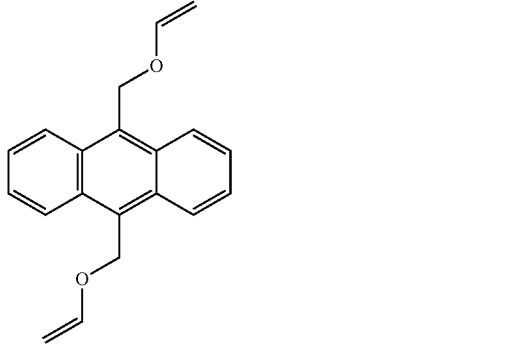
(a-20)

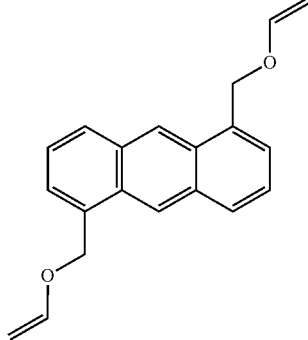
(a-21)

From the perspective of forming a polymer having a high softening point in the temporary adhesive described above, $Z_1$ above in the polyvalent vinyl ether compound (A) is preferably a group in which $n_1$ hydrogen atoms are removed from a structural formula of a saturated or unsaturated aliphatic hydrocarbon, or a bonded body in which a plurality of the hydrocarbons is bonded via a linking group; more preferably a group in which $n_1$ hydrogen atoms are removed from a structural formula of a saturated aliphatic hydrocarbon or a bonded body in which a plurality of the hydrocarbons is bonded via a linking group; and more preferably a group in which $n_1$ hydrogen atoms are removed from a structural formula of a linear alkylene group having from 1 to 20 carbon atoms, a branched alkylene group having from 2 to 20 carbon atoms, or a bonded body in which a plurality of the alkylene groups is bonded via a linking group.

The polyvalent vinyl ether compound (A) is most preferably at least one compound selected from the group consisting of 1,4-butanediol divinyl ether, diethylene glycol divinyl ether, and triethylene glycol divinyl ether.

As described above, the compound (B) in the temporary adhesive is a compound having two or more hydroxy groups or carboxy groups that are capable of forming an acetal bond by reacting with a vinyl ether group of the polyvalent vinyl ether compound (A) so as to form a polymer with the polyvalent vinyl ether compound (A), and, for example, a compound having two or more constituent units (repeating units) represented by Formula (b) below.

[Chem. 4]

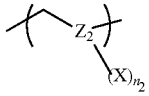

(b)

In Formula (b), X represents a hydroxy group or a carboxy group. $n_2$ X's may be identical or different from each other.

In Formula (b), $n_2$ represents an integer of 1 or greater. From the perspective of ease of obtaining and ease of dissolving in a solvent in preparing the temporary adhesive described above, and from the perspective of forming a polymer having a high softening point in the temporary adhesive, $n_2$ is preferably an integer from 1 to 3 and more preferably an integer of 1 or 2.

The number of constituent units (repeating units) represented by Formula (b) above in the compound (B) is 2 or greater, and from the perspective of forming a polymer having a high softening point in the temporary adhesive described above, the number is preferably an integer from 2 to 40 and more preferably an integer from 10 to 30.

In Formula (b), $Z_2$ represents a group in which ($n_2+2$) hydrogen atoms are removed from a structural formula of a saturated or unsaturated aliphatic hydrocarbon, a saturated or unsaturated alicyclic hydrocarbon, an aromatic hydrocarbon, a heterocyclic compound, or a bonded body in which any of these are bonded via a single bond or a linking group. Examples of the structural formula of a saturated or unsaturated aliphatic hydrocarbon, a saturated or unsaturated alicyclic hydrocarbon, an aromatic hydrocarbon, a heterocyclic compound, or a bonded body in which any of these are bonded via a single bond or a linking group may include examples similar to the examples in $Z_1$ described above.

The compound (B) is preferably a styrene polymer, a (meth)acrylic polymer, a polyvinyl alcohol, a novolac resin, and a resole resin, and more preferably a compound having two or more of at least one type of constituent unit (repeating unit) selected from the group consisting of Formulas (b-1) to (b-6) below.

[Chem. 5]

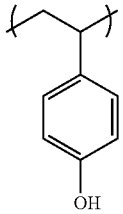

(b-1)

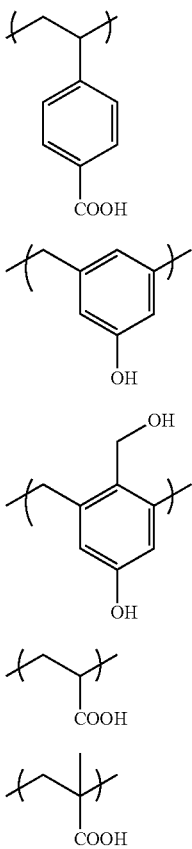

When a compound in which X in Formula (b) is a hydroxy group is employed as the compound (B), the proportion of the constituent units represented by Formula (b) in the total amount of the compound (B) is preferably not less than 30 mass %, more preferably not less than 50 mass %, and more preferably not less than 60 mass %. In addition, the proportion of the constituent units represented by Formula (b) in the total amount of the compound (B) is preferably not less than 30 mol % and more preferably not less than 50 mol %.

When a compound in which X in Formula (b) is a carboxy group is employed as the compound (B), the proportion of the constituent units represented by Formula (b) in the total amount of the compound (B) is preferably not less than 1 mass %, more preferably not less than 5 mass %, and more preferably not less than 10 mass %.

The proportion of the constituent units represented by Formula (b) within the above range is suitable for ensuring a sufficient distance between crosslinking points and a sufficient number of crosslinking points in the compound (B). Thus, the ratio is suitable for ensuring weight average molecular weight and a high softening point to a polymer obtained by polymerization of the compound (B) and the compound (A) described above in the temporary adhesive described above, and in turn suitable for ensuring high adhesion retentivity in the temporary adhesive layer 2 formed from the temporary adhesive in high temperature environments.

The compound (B) may be a homopolymer having only the constituent units represented by Formula (b) or may be a copolymer having the constituent units represented by Formula (b) and any other constituent unit. When the compound (B) is a copolymer, the compound (B) may be any of a block copolymer, a graft copolymer, and a random copolymer.

The any other constituent unit in the compound (B) is a constituent unit derived from a polymerizable monomer, the constituent unit having neither a hydroxy group nor a carboxy group, and examples of the polymerizable monomer include olefins, aromatic vinyl compounds, unsaturated carboxylic acid esters, carboxylic acid vinyl esters, and unsaturated dicarboxylic acid diesters. Examples of the olefins include chain olefins (in particular, $C_{2-12}$ alkenes), such as ethylene, propylene, and 1-butene; and cyclic olefins (in particular, $C_{3-10}$ cycloalkenes), such as cyclopentene, cyclohexene, cycloheptene, norbornene, 5-methyl-2-norbornene, and tetracyclododecene. Examples of the aromatic vinyl compounds include $C_6$-14 aromatic vinyl compounds, such as styrene, vinyl toluene, α-methylstyrene, 1-propenylbenzene, 1-vinylnaphthalene, 2-vinylnaphthalene, 3-vinylpyridine, 3-vinylfuran, 3-vinylthiophene, 3-vinylquinoline, indene, methylindene, ethylindene, and dimethylindene. Examples of the unsaturated carboxylic acid esters include esters, such as ethyl (meth)acrylate, butyl (meth)acrylate, isobutyl (meth)acrylate, 2-ethylhexyl (meth) acrylate, and dicyclopentanyl (meth)acrylate, obtained by reacting an unsaturated carboxylic acid (e.g., (meth)acrylic acid) with an alcohol (R"—OH) (The R" is a group in which one hydrogen atom is removed from a structural formula of a saturated or unsaturated aliphatic hydrocarbon, a saturated or unsaturated alicyclic hydrocarbon, an aromatic hydrocarbon, a heterocyclic compound, or a bonded body in which any of these are bonded via a single bond or a linking group. Examples of R" may include monovalent groups corresponding to the divalent groups exemplified for $Z_1$ in Formula (a) above). Examples of the carboxylic acid vinyl esters include $C_{1-16}$ fatty acid vinyl esters, such as vinyl acetate, vinyl propionate, vinyl caprylate, and vinyl caproate. Examples of the unsaturated dicarboxylic acid diesters may include maleic acid di $C_{1-10}$ alkyl esters, such as diethyl maleate, dibutyl maleate, dioctyl maleate, and 2-ethylhexyl maleate; and fumaric acid diesters corresponding to these esters. One of these esters can be used alone or two or more in combination.

When the compound (B) is a copolymer, the compound (B) is preferably a compound containing the constituent units represented by Formula (b) above, and a constituent unit derived from at least one polymerizable monomer selected from the group consisting of a chain olefin, a cyclic olefin, an aromatic vinyl compound, an unsaturated carboxylic acid ester, a carboxylic acid vinyl ester, and an unsaturated dicarboxylic acid diester.

The softening point ($T_1$) of the compound (B) is, for example, not lower than 50° C., preferably not lower than 80° C., and more preferably not lower than 100° C. Such a configuration is suitable for achieving a high softening point for a polymer obtained by polymerization of the compound (B) and the polyvalent vinyl ether compound (A) described above. In addition, from the perspective of ensuring proper fluidity to achieve good coating properties in the temporary adhesive described above, $T_1$ is, for example, not higher than 250° C., preferably not higher than 200° C., and more preferably not higher than 150° C.

$T_1$ can be adjusted for example, by controlling the weight average molecular weight (by the GPC method calibrated with polystyrene standards) of the compound (B). The weight average molecular weight of the compound (B) is, for example, not lower than 1500, preferably from 1800 to 10000, and more preferably from 2000 to 5000.

The thermoplastic resin (C) described above in the temporary adhesive needs to be a compound having thermoplasticity and capable of imparting flexibility to an adhesive composition when contained in the adhesive composition. Examples of such a thermoplastic resin (C) may include polycondensation resins, such as polyvinyl acetal resins, polyester resins, polyurethane resins, polyamide resins, poly(thio)ether resins, polycarbonate resins, polysulfone resins, and polyimide resins; vinyl polymerized resins, such as polyolefin resins, (meth)acrylic resins, styrene resins, and vinyl resins; and resins derived from natural products, such as cellulose derivatives. One of these resins can be used alone or two or more in combination. The configuration in which the temporary adhesive described above contains such a thermoplastic resin (C) is suitable for imparting flexibility or pliability in the temporary adhesive layer 2 to be formed, suitable for preventing the occurrence of spontaneous peeling or a crack also in an environment where the temperature changes rapidly, and is suitable for ensuring excellent adhesiveness.

The thermoplastic resin (C) in the temporary adhesive is preferably at least one selected from the group consisting of polyvinyl acetal resins, polyester resins, polyurethane resins, and polyamide resins. From the perspective of easily imparting flexibility in the temporary adhesive or the temporary adhesive layer 2, and from the perspective of easily removing a glue residue if chemical interaction to an adherend, such as a wafer, reduces, and a glue residue remains on the adherend after peeling, the temporary adhesive preferably contains a polyester resin as the thermoplastic resin (C). Furthermore, in addition to the perspective of easily imparting flexibility in the temporary adhesive or the temporary adhesive layer 2 and the perspective of easily removing a glue residue on an adherend, from the perspective of ensuring high adhesion to an adherend, the temporary adhesive preferably contains a polyester resin and a polyvinyl acetal resin as the thermoplastic resins (C).

Examples of the polyvinyl acetal resin may include resins having at least a constituent unit represented by the formula below, the constituent unit obtained by reacting an aldehyde (RCHO) with a polyvinyl alcohol. Examples of the aldehyde (RCHO) include compounds in which R in the structural formula (R in the formula below is also the same) is a hydrogen atom, a linear $C_{1-5}$ alkyl group, a branched $C_{2-5}$ alkyl group, or a $C_{6-10}$ aryl group. Examples specifically include formaldehyde, butyraldehyde, and benzaldehyde. Such a polyvinyl acetal resin may have any other constituent unit in addition to the constituent unit represented by the formula below. That is, the polyvinyl acetal resin includes a homopolymer and a copolymer. Examples of such a polyvinyl acetal resin may specifically include polyvinyl formal and polyvinyl butyral, and a commercially available product, for example, "S-LEC KS-1 (trade name)" or "S-LEC KS-10 (trade name)" (both available from Sekisui Chemical Co., Ltd.) can be used.

[Chem. 6]

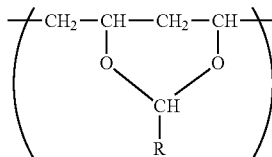

Examples of the polyester resin include polyesters obtained by polycondensation of a diol component and a dicarboxylic acid component. Examples of the diol component include aliphatic $C_{2-12}$ diols, such as ethylene glycol; polyoxy $C_{2-4}$ alkylene glycols, such as diethylene glycol; alicyclic $C_{5-15}$ diols, such as cyclohexanedimethanol; and aromatic $C_{6-20}$ diols, such as bisphenol A. Examples of the dicarboxylic acid component include aromatic $C_{8-20}$ dicarboxylic acids, such as terephthalic acid; aliphatic $C_{2-40}$ dicarboxylic acids, such as adipic acid; and alicyclic $C_{8-15}$ dicarboxylic acids, such as cyclohexanedicarboxylic acid. Examples of the polyester resin also include polyesters obtained by polycondensation of oxycarboxylic acid. Examples of the oxycarboxylic acid include aliphatic $C_{2-6}$ oxycarboxylic acids, such as lactic acid, and aromatic $C_{7-19}$ oxycarboxylic acids, such as hydroxybenzoic acid. Examples of the polyester resin also include polyesters obtained by ring-opening polymerization of lactone. Examples of the lactone include $C_{4-12}$ lactones, such as ε-caprolactone, δ-valerolactone, and γ-butyrolactone. Examples of the polyester resin also include polyesters containing a urethane bond obtained by reacting a polyester diol and a diisocyanate. The polyester resin includes a homopolyester and a copolyester. In addition, as the polyester resin, a commercially available product, for example, "Placcel H1P (trade name)" (available from Daicel Corporation) can be used.

Examples of the polyurethane resins may include resins obtained by reaction between a diisocyanate and a polyol, and a chain extender used as necessary. Examples of the diisocyanate include aliphatic diisocyanates, such as hexamethylene diisocyanate; alicyclic diisocyanates, such as isophorone diisocyanate; and aromatic diisocyanates, such as tolylene diisocyanate. Examples of the polyol include polyester diols, polyether diols, and polycarbonate diols. Examples of the chain extender include $C_{2-10}$ alkylene diols, such as ethylene glycol; aliphatic diamines, such as ethylene diamine; alicyclic diamines, such as isophorone diamine; and aromatic diamines, such as phenylene diamine.

Examples of the polyamide resins may include polyamides obtained by polycondensation of a diamine component and a dicarboxylic acid component, polyamides obtained by polycondensation of an aminocarboxylic acid, polyamides obtained by ring-opening polymerization of a lactam, and polyesteramides obtained by polycondensation of a diamine component, a dicarboxylic acid component, and a diol component. Examples of the diamine component include $C_{4-10}$ alkylene diamines, such as hexamethylene diamine. Examples of the dicarboxylic acid component include $C_{4-20}$ alkylene dicarboxylic acids, such as adipic acid. Examples of the aminocarboxylic acids include $C_{4-20}$ aminocarboxylic acids, such as ω-aminoundecanoic acid. Examples of the lactam include $C_{4-20}$ lactams, such as ω-laurolactam. Examples of the diol component include $C_{2-12}$ alkylene diols, such as ethylene glycol. In addition, the polyamide resins include homopolyamides and copolyamides.

The softening point ($T_2$) of the thermoplastic resin (C) is preferably at least 10° C. higher than the heat curing temperature of a permanent adhesive described later used in combination with the temporary adhesive containing the thermoplastic resin (C) in the method of manufacturing a semiconductor device according to an embodiment of the present invention. The difference between the heat curing temperature of the permanent adhesive and $T_2$ is, for example, from 10 to 40° C. and preferably from 20 to 30° C.

$T_2$ can be adjusted, for example, by controlling the weight average molecular weight (Mw: by the GPC method calibrated with polystyrene standards) of the thermoplastic resin (C). The weight average molecular weight of the thermoplastic resin (C) is, for example, from 1500 to 100000, preferably from 2000 to 80000, more preferably from 3000 to 50000, more preferably from 10000 to 45000, and more preferably from 15000 to 35000.

In the temporary adhesive containing at least the polyvalent vinyl ether compound (A), the compound (B), and the thermoplastic resin (C) as described above, the softening point ($T_3$) of the polymer of the polyvalent vinyl ether compound (A) and the compound (B) is at least 10° C. higher than the heat curing temperature of a permanent adhesive described later used in combination with the temporary adhesive in the method of manufacturing a semiconductor device according to an embodiment of the present invention. The difference between the heat curing temperature of the permanent adhesive and $T_3$ is, for example, from 10 to 40° C. and preferably from 20 to 30° C.

When the heat curing temperature of the permanent adhesive described later is, for example, 120° C., the content of the polyvalent vinyl ether compound (A) in the temporary adhesive is in an amount corresponding to an amount of vinyl ether groups in the polyvalent vinyl ether compound (A) from, for example, 0.01 to 10 mol, preferably an amount from 0.05 to 5 mol, more preferably from 0.07 to 1 mol, and more preferably from 0.08 to 0.5 mol relative to a total amount of 1 mol of hydroxy groups and carboxy groups in the compound (B) in the temporary adhesive.

The content of the thermoplastic resin (C) in the temporary adhesive is, for example, from 0.1 to 3 parts by mass, preferably from 0.2 to 2 parts by mass, and more preferably from 0.3 to 1 part by mass relative to 1 part by mass of the compound (B) in the temporary adhesive.

The total content of the polyvalent vinyl ether compound (A), the compound (B), and the thermoplastic resin (C) in the temporary adhesive is, for example, from 70 to 99.9 mass %, preferably from 80 to 99 mass %, more preferably from 85 to 95 mass %, and more preferably from 85 to 90 mass % of the total non-volatile content of the temporary adhesive.

The temporary adhesive may further contain a polymerization accelerator. Examples of the polymerization accelerator may include a monovalent carboxylic acid represented by Formula (d) below and a monovalent alcohol represented by Formula (e) below. One of these polymerization accelerators can be used alone or two or more in combination. The configuration in which the temporary adhesive contains a polymerization accelerator is suitable for accelerating the polymerization reaction of the polyvalent vinyl ether compound (A) and the compound (B). The configuration is suitable for forming a polymer having an equivalent softening point or higher softening point even in lowering the heating temperature during polymerization in comparison with using an adhesive containing no polymerization accelerator and thus is suitable for ensuring adhesiveness in the temporary adhesive 2 in high temperature environments (e.g., approximately from 160 to 180° C.).

$$Z_3\text{---COOH} \quad (d)$$

where $Z_3$ represents a group that may have a substituent other than a carboxy group, the group in which one hydrogen atom is removed from a structural formula of one selected from the group consisting of saturated or unsaturated aliphatic hydrocarbons, saturated or unsaturated alicyclic hydrocarbons, and aromatic hydrocarbons.

$$Z_4\text{---OH} \quad (e)$$

where $Z_4$ represents a group that may have a substituent other than a hydroxy group, the group in which one hydrogen atom is removed from a structural formula of an aromatic hydrocarbon.

Examples of the saturated or unsaturated aliphatic hydrocarbon, saturated or unsaturated alicyclic hydrocarbon, and aromatic hydrocarbon in $Z_3$ in Formula (d) above may include saturated or unsaturated aliphatic hydrocarbons, saturated or unsaturated alicyclic hydrocarbons, and aromatic hydrocarbons exemplified for $Z_1$ in Formula (a) above. Examples of the substituent that may be included in $Z_3$ may include examples of the substituent that may be included in $Z_1$ excluding a carboxy group. In addition, examples of the aromatic hydrocarbon in $Z_4$ in Formula (e) above may include aromatic hydrocarbons exemplified for $Z_1$ in Formula (a) above. Examples of the substituent that may be included in $Z_4$ may include examples of the substituent that may be included in $Z_1$ excluding a hydroxy group.

When a polymerization accelerator is contained in the temporary adhesive, the pKa (acid dissociation constant) of the polymerization accelerator is preferably from 3 to 8 and more preferably from 4 to 6. Such a configuration is suitable for inhibiting unintended polymerization and the resulting increase in viscosity or the like in the temporary adhesive to ensure storage stability, as well as for ensuring the polymerization promoting effect by the polymerization accelerator in forming the temporary adhesive layer 2 from the temporary adhesive.

The monovalent carboxylic acid represented by Formula (d) is preferably compounds (including geometric isomers) shown below.

[Chem. 7]

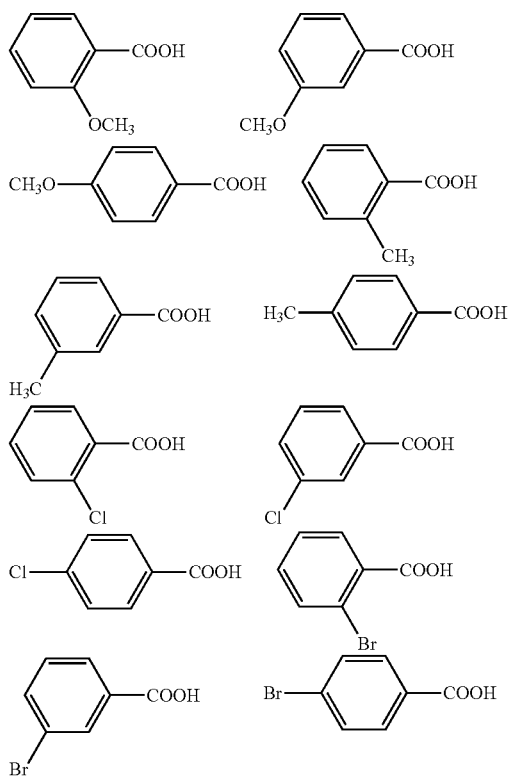

-continued

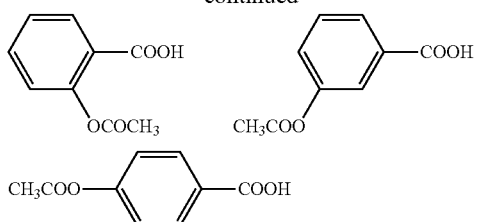

[Chem. 8]

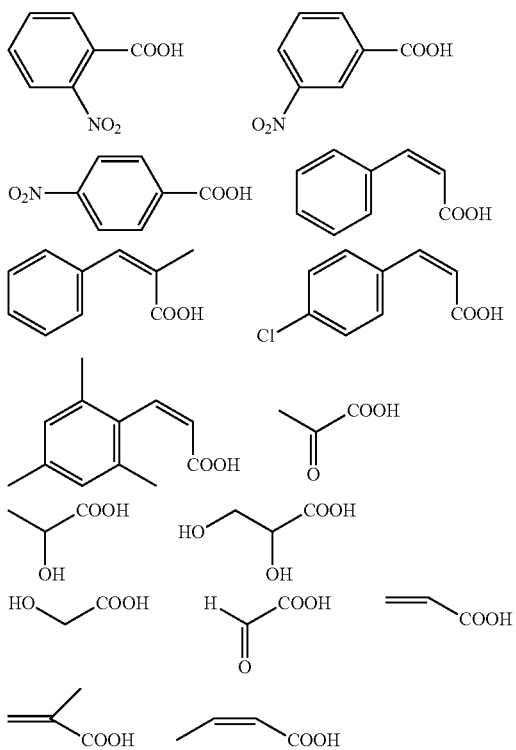

The monovalent alcohol represented by Formula (e) is preferably compounds shown below.

[Chem. 9]

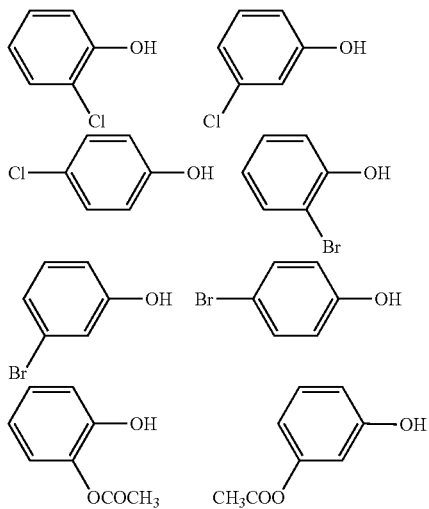

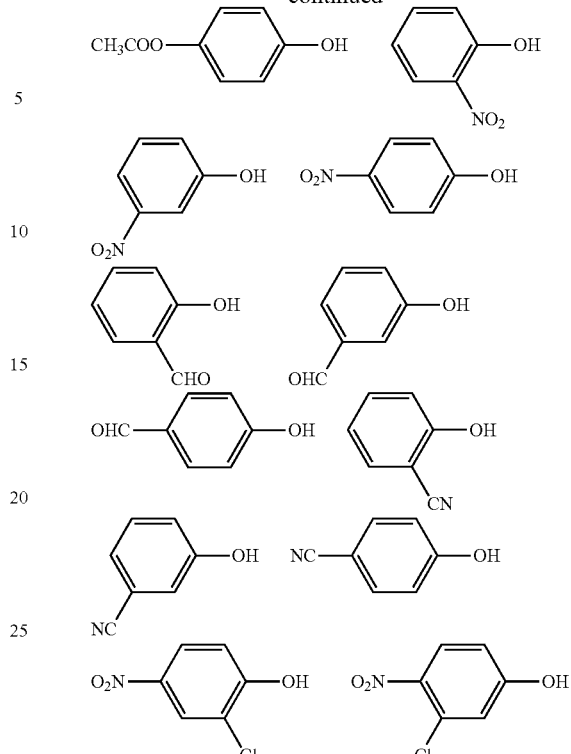

When a polymerization accelerator is contained in the temporary adhesive, the content of the polymerization accelerator is, for example, approximately from 0.01 to 5 parts by mass, preferably from 0.1 to 3 parts by mass, and more preferably from 0.3 to 1 part by mass relative to 1 part by mass of the polyvalent vinyl ether compound (A) contained in the temporary adhesive.

The temporary adhesive may further contain an antioxidant. The configuration in which the temporary adhesive contains an antioxidant is suitable for preventing oxidation of the compound (B) and the thermoplastic resin (C) described above in the temporary adhesive during heat treatment of the temporary adhesive. The antioxidation of the compound (B) and the thermoplastic resin (C) in the temporary adhesive is suitable for ensuring solubility of a softened composition obtained by heat-treating the temporary adhesive layer 2 formed from the temporary adhesive. Thus, the antioxidation is suitable for removing a glue residue if remains on an adherend, such as a wafer, after peeling the temporary adhesive layer 2 from the adherend through heat treatment.

Examples of the antioxidant may include phenolic antioxidants, phosphorus antioxidants, thioester antioxidants, and amine antioxidants. One of these antioxidants can be used alone or two or more in combination. Phenolic antioxidants have a particularly excellent antioxidant effect during heat treatment and thus are preferred as an antioxidant in the temporary adhesive.

Examples of the phenolic antioxidants may include pentaerythritol tetrakis[3(3,5-di-t-butyl-4-hydroxyphenyl)propionate], thiodiethylene bis[3-(3,5-di-t-butyl-4-hydroxyphenyl)propionate], octadecyl 3-(3,5-di-t-butyl-4-hydroxyphenyl)propionate, N,N'-hexamethylene bis[3-(3,5-di-t-butyl-4-hydroxyphenyl)propionamide], octyl 3-(4-hydroxy-3,5-diisopropylphenyl)propionate, 1,3,5-tris(4- hydroxy-3,5-di-t-butylbenzyl)-2,4,6-trimethylbenzene, 2,4-bis(dodecylthiomethyl)-6-methylphenol, and calcium bis[3,5-di(t-butyl)-4-hydroxybenzyl(ethoxy)phosphinate]. As the phenolic antioxidant, a commercially available product under the trade name, for example, "Irganox 1010", "Irganox 1035", "Irganox 1076", "Irganox 1098", "Irganox 1135", "Irganox 1330", "Irganox 1726", or "Irganox 1425WL" (all available from BASF) can be used.

When an antioxidant is contained in the temporary adhesive, the content of the antioxidant is, for example, from 0.01 to 15 parts by mass, preferably from 0.1 to 12 parts by mass, and more preferably from 0.5 to 10 parts by mass relative to 100 parts by mass of the total of the compound (B) and the thermoplastic resin (C) contained in the temporary adhesive.

The temporary adhesive may further contain additional component as necessary. Examples of the additional component may include an acid generator, a surfactant, a solvent, a leveling agent, a silane coupling agent, and a foaming agent. One of these components can be used alone or two or more in combination.

When a surfactant is contained in the temporary adhesive, the content of the surfactant in the temporary adhesive is preferably approximately from 0.01 to 1 mass %. Such a configuration is suitable for preventing repelling during the coating of the temporary adhesive and is suitable for ensuring the uniformity of the coating. Examples of such a surfactant include products under the trade names "F-444", "F-447", "F-554", "F-556", and "F-557" (all are fluorine oligomers available from DIC Corporation), a product under the trade name "BYK-350" (an acrylic polymer available from BYK), and products under the trade names "A-1420", "A-1620", and "A-1630" (all are fluorine-containing alcohols available from Daikin Industries, Ltd.). One of these surfactants can be used alone or two or more in combination.

The temporary adhesive preferably contains a solvent from the perspective of adjusting the viscosity of the temporary adhesive. Examples of the solvent include toluene, hexane, isopropanol, methyl isobutyl ketone, cyclopentanone, cyclohexanone, propylene glycol monomethyl ether acetate, propylene glycol monomethyl ether, and γ-butyrolactone. One of these solvents can be used alone or two or more in combination. When the temporary adhesive contains a solvent, the solvent content in the temporary adhesive is, for example, from 55 to 80 mass %.

The temporary adhesive can be prepared by stirring and mixing the components while air bubbles are removed under vacuum as necessary. The temperature of the mixture during stirring and mixing is preferably approximately from 10 to 80° C. For stirring and mixing, a rotation-revolution mixer, a single-axis or multi-axis extruder, a planetary mixer, a kneader, or a resolver can be used.

The viscosity of the temporary adhesive (viscosity measured under conditions of 25° C. and a shear rate of 50/s) is, for example, approximately from 30 to 2000 mPa·s, preferably from 300 to 1500 mPa·s, and more preferably from 500 to 1500 mPa·s. Such a configuration is suitable for ensuring the coating properties of the temporary adhesive and uniformly coating the temporary adhesive on the surface of an adherend, such as a wafer.

The temporary adhesive as described above is coated on the surface of an adherend, such as a wafer, and then heat-treated. This allows vinyl ether groups of the polyvalent vinyl ether compound (A) and hydroxy groups and/or carboxy groups of the compound (B) in the temporary adhesive to be bonded with acetal bonds to form a polymer from the polyvalent vinyl ether compound (A) and the compound (B). For example, when a temporary adhesive containing a compound represented by Formula (a') below as the polyvalent vinyl ether compound (A) and containing a compound having a constituent unit represented by Formula (b') below as the compound (B) is heat-treated to polymerize both compounds, a polymer represented by Formula (P) below is produced.

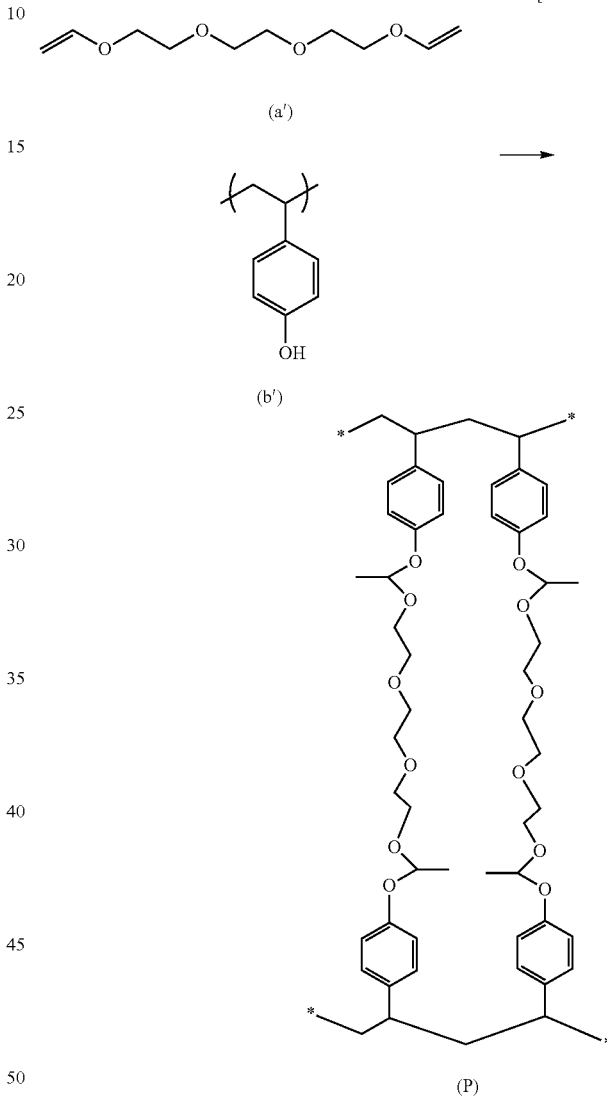

The softening point ($T_3$) of the polymer obtained by heat-treating the temporary adhesive can be controlled by adjusting the relative amounts of the polyvalent vinyl ether compound (A) and the compound (B). When the heat curing temperature of a permanent adhesive described later used in combination with the temporary adhesive is 120° C., the softening point ($T_3$) of the polymer is, for example, not lower than 130° C., preferably from 130 to 170° C., and more preferably from 140 to 160° C.

Each softening point of the polymer of the polyvalent vinyl ether compound (A) and the compound (B), the polyvalent vinyl ether compound (A), the compound (B), and the thermoplastic resin (C) can be measured using a Koka flow tester under the flow conditions below.

Flow Conditions

Pressure: 100 kg/cm$^2$

Speed: 6° C./min

Nozzle: 1 mm φ×10 mm

In addition, the softening point of the temporary adhesive layer formed from the temporary adhesive is the temperature determined as follows. First, 0.1 g of the temporary adhesive is coated on a first glass plate at a thickness of 10 μm to form a coating of the temporary adhesive. Then, a second glass plate is overlaid on the coating. Then, this is heat-treated to polymerize the polyvalent vinyl ether compound (A) and the compound (B) in the temporary adhesive between the first and second glass plates to cure the temporary adhesive, thus bonding both glass plates via the temporary adhesive. The heat treatment includes, for example, heating at 140° C. for 2 minutes, followed by heating at 200° C. for 2 minutes, and followed by heating at 230° C. for 4 minutes. Such adhesive bonding provides a laminate having a laminated structure of the first glass plate, the second glass plate, and the temporary adhesive layer between the first and second glass plates. For this laminate, in a state where the second glass plate is fixed, the first glass plate is pulled in the horizontal direction (in-plane direction of the glass plate) by applying a stress of 2 kg under heating, and the temperature at which the first glass plate starts to move is measured. The temperature determined as described above is taken as the softening point.

In the present method of manufacturing a semiconductor device, then, as illustrated in FIG. 1(b), the wafer 1 is thinned in the reinforced wafer 1R (thinning step). Specifically, the wafer 1 in a state of being supported by the supporting substrate S is thinned to a predetermined thickness by grinding from the back surface 1b side of the wafer 1 using a grinder to form a thinned wafer 1T. The thickness of the wafer 1 after thinning (thinned wafer 1T) is, for example, from 1 to 20 m.

Figure 3:
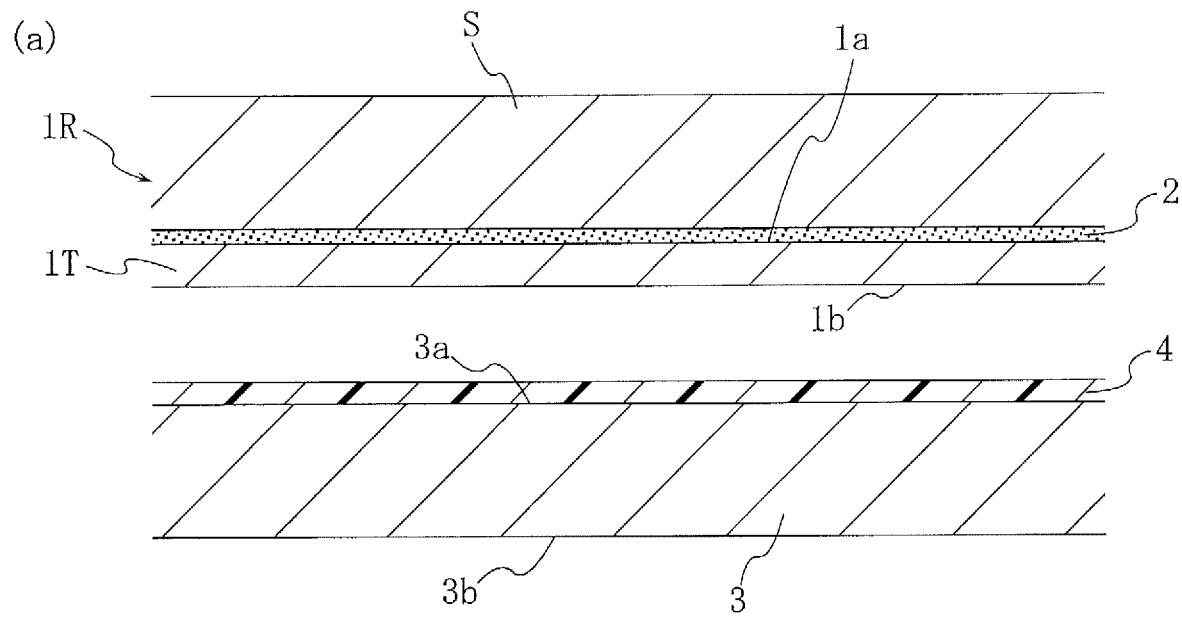
FIG. 3 illustrates some processes in a method of manufacturing a semiconductor device according to an embodiment of the present invention.
Figure 3:
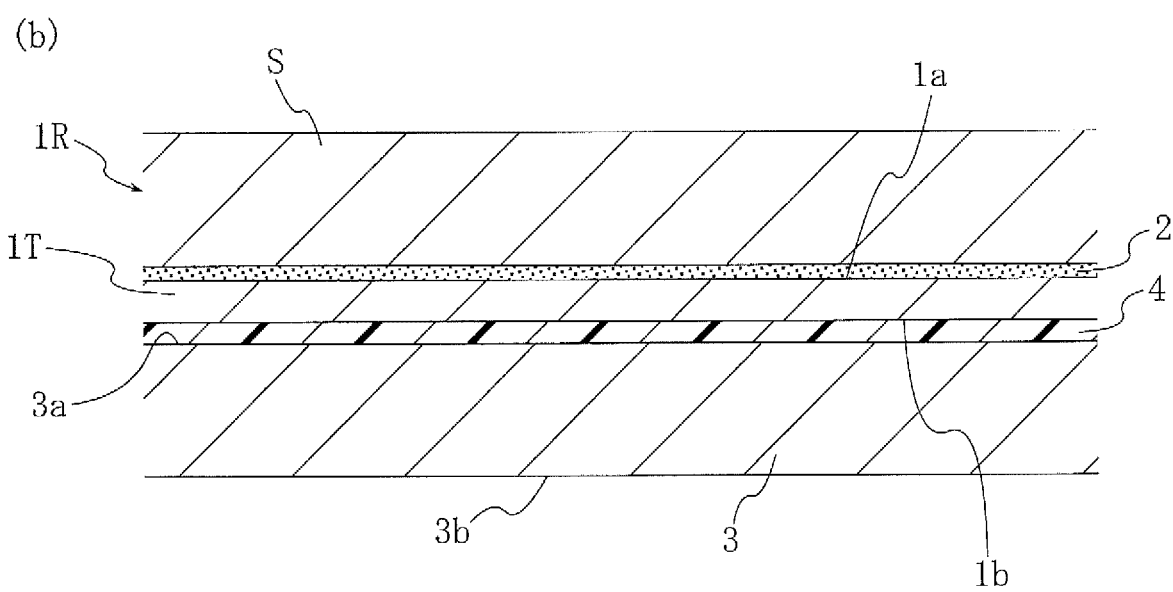
Figure 4:
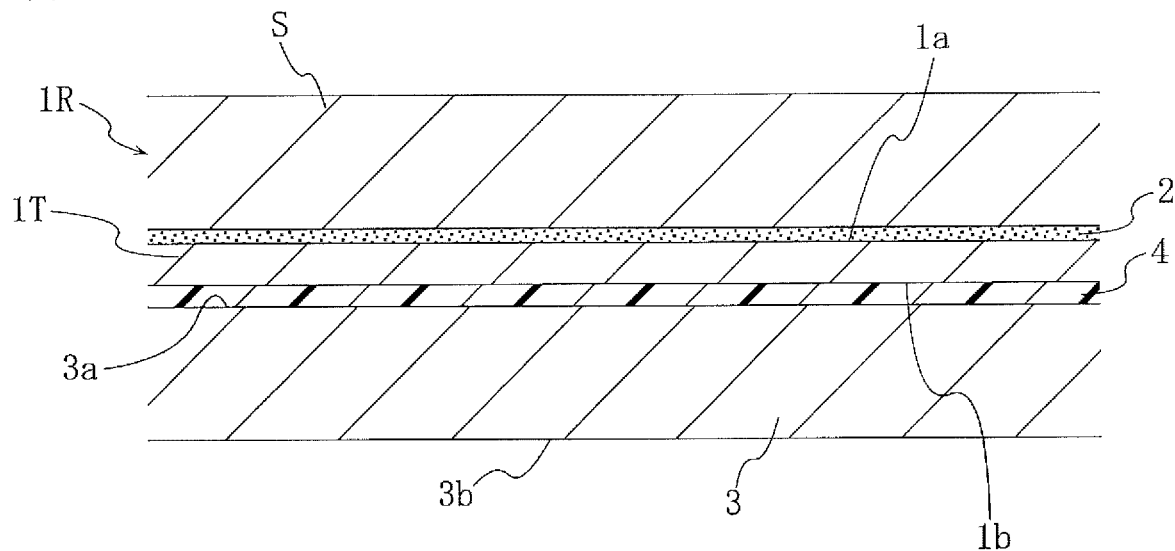
FIG. 4 illustrates some processes in a method of manufacturing a semiconductor device according to an embodiment of the present invention.
Figure 4:
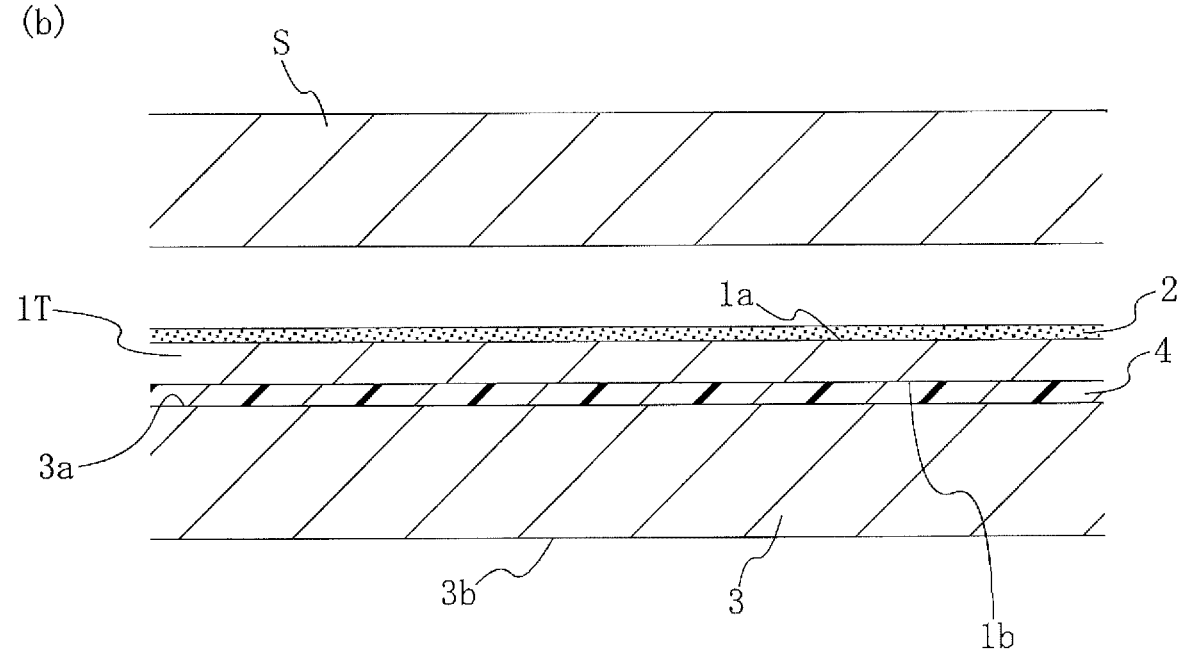
Figure 5:
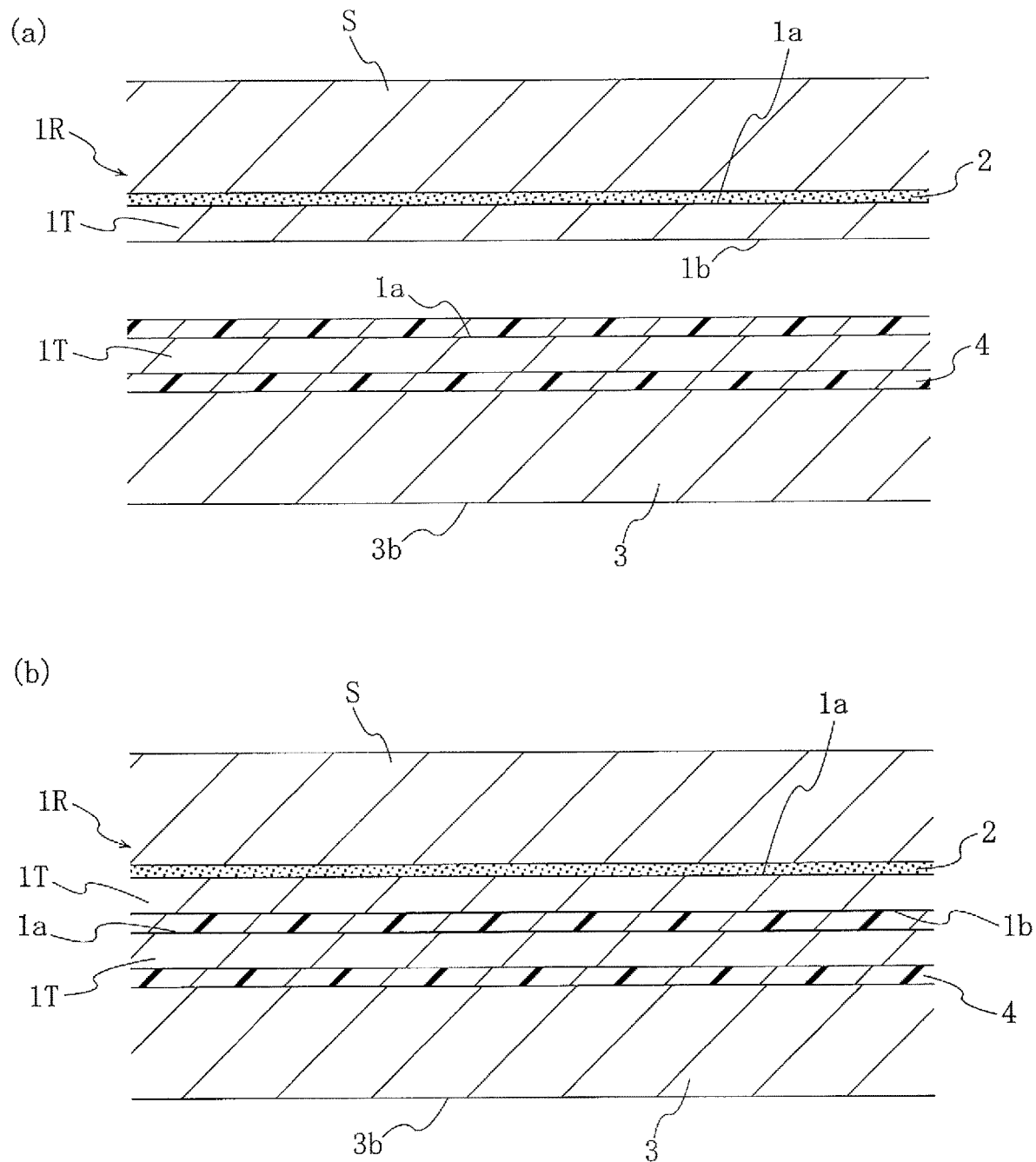
FIG. 5 illustrates some processes in a method of manufacturing a semiconductor device according to an embodiment of the present invention.
Figure 6:
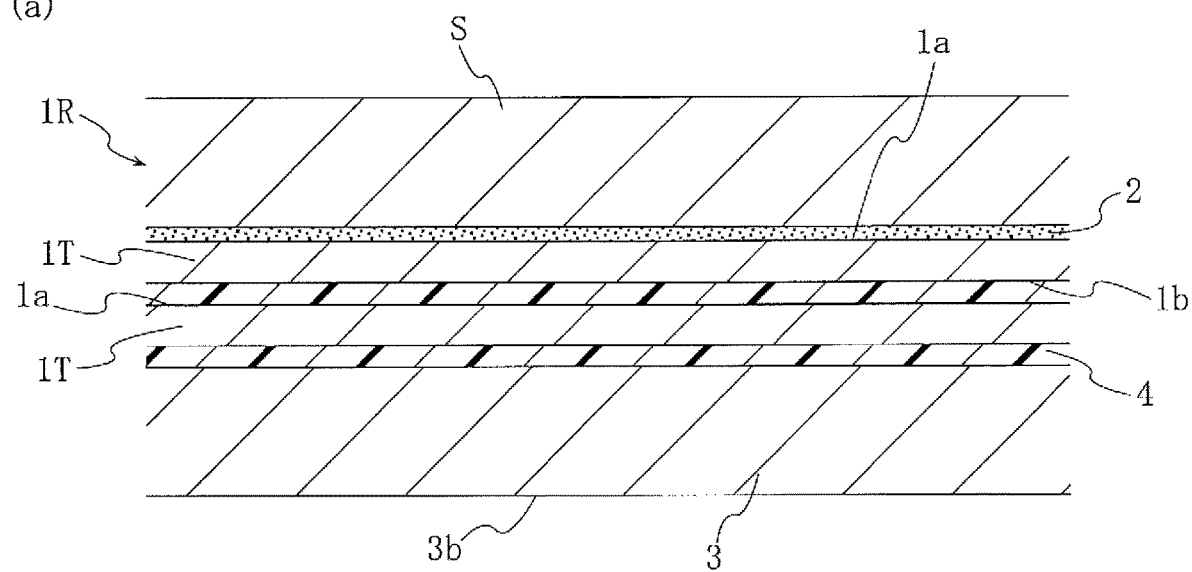
FIG. 6 illustrates some processes in a method of manufacturing a semiconductor device according to an embodiment of the present invention.
Figure 6:
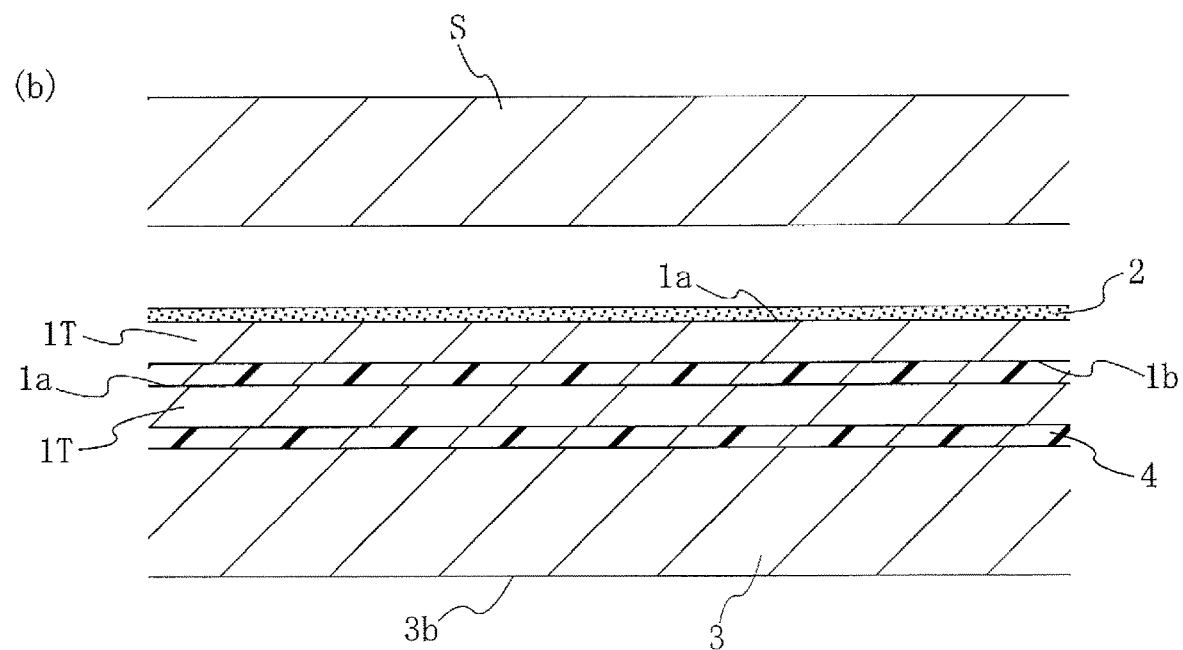

Then, for example, as illustrated in FIG. 3, the thinned wafer 1T side of the reinforced wafer 1R is bonded to a wafer 3, which is a base wafer, via an adhesive 4 (bonding step).

The wafer 3 is a base wafer having a semiconductor wafer main body in which a semiconductor element can be fabricated, and has an element forming surface 3a and a back surface 3b opposite from the element forming surface 3a. The wafer 3 is a semiconductor wafer in which various semiconductor elements (not illustrated) are already fabricated on the element forming surface 3a side, and a wiring structure (not illustrated) necessary for the semiconductor elements is already formed on the element forming surface 3a. As the constituent material for forming the semiconductor wafer main body of the wafer 3, for example, the materials listed above as constituent materials for forming the semiconductor wafer main body of the wafer 1 can be employed. The thickness of the wafer 3, which is the base wafer, is preferably not less than 300 μm, more preferably not less than 500 μm, and more preferably not less than 700 μm from the perspective of ensuring strength of the wafer 3 during the manufacturing process. From the perspective of reducing the grinding time in grinding on the wafer 3, the grinding described later, the thickness of the wafer 3 is preferably not greater than 1000 μm, more preferably not greater than 900 μm, and more preferably not greater than 800 μm.

The adhesive 4 is a thermosetting adhesive for achieving a wafer-to-wafer bonding and contains a polymerizable group-containing polyorganosilsesquioxane (i.e., a polyorganosilsesquioxane having a polymerizable functional group) as a thermosetting resin. The polymerizable functional group contained in the polymerizable group-containing polyorganosilsesquioxane is preferably an epoxy group or a (meth)acryloyloxy group. The polymerizable group-containing polyorganosilsesquioxane is suitable for achieving high heat resistance in an adhesive layer to be formed as well as achieving lower curing temperature for forming the adhesive layer and thus preventing damage to the elements in the wafer as an adherend. The content ratio of the polymerizable group-containing polyorganosilsesquioxane in the adhesive 4 is, for example, not less than 70 mass %, preferably from 80 to 99.8 mass %, and more preferably from 90 to 99.5 mass %.

In the present embodiment, the polymerizable group-containing polyorganosilsesquioxane contained in the adhesive 4 contains, as siloxane constituent units, a first constituent unit [RSiO$_{3/2}$] containing at least a constituent unit represented by Formula (1) below and a second constituent unit [RSiO$_{2/2}$(OR')] containing at least a constituent unit represented by Formula (2) below (R and R' in the second constituent unit may be identical or different). These constituent units belong to what are called T units in the siloxane constituent units, and in the present embodiment, the constituent unit [RSiO$_{3/2}$] is a T$_3$ form, and the constituent unit [RSiO$_{2/2}$(OR')] is a T$_2$ form. In the T$_3$ form, the silicon atom is bonded to three oxygen atoms, each oxygen atom also bonded to a silicon atom in another siloxane constituent unit. In the T$_2$ form, the silicon atom is bonded to two oxygen atoms, each oxygen atom also bonded to a silicon atom in another siloxane constituent unit, and bonded to an oxygen of an alkoxy group. Both such a T$_3$ form and a T$_2$ form belong to T units as siloxane constituent units as described above and are partial structures of polymerizable group-containing polyorganosilsesquioxanes that can be formed by hydrolysis of a silane compound having three hydrolyzable functional groups and a subsequent condensation reaction.

[Chem. 11]

$$[R^1SiO_{3/2}] \qquad (1)$$

$$[R^1SiO_{2/2}(OR^2)] \qquad (2)$$

R$^1$ in Formula (1) and R$^1$ in Formula (2) each represent a group containing an epoxy group or a (meth)acryloyloxy group, and R$^2$ in Formula (2) represents a hydrogen atom or an alkyl group having from 1 to 4 carbon atoms.

Examples of R$^1$ in Formula (1) and Formula (2) when each R$^1$ is an epoxy group-containing group include groups represented by Formulas (3) to (6) below. Each of R$^3$, R$^4$, R$^5$, and R$^6$ in Formulas (3) to (6) represents a linear or branched alkylene group having, for example, from 1 to 10 carbon atoms. Examples of such an alkylene group include a methylene group, a methylmethylene group, a dimethylmethylene group, an ethylene group, a propylene group, a trimethylene group, a tetramethylene group, a pentamethylene group, a hexamethylene group, and a decamethylene group. From the perspective of achieving high heat resistance and reducing shrinkage during curing in the adhesive layer to be formed from the adhesive 4, each R$^1$ as an epoxy group-containing group in Formula (1) and Formula (2) is preferably an epoxy group-containing group represented by Formula (3) or an epoxy group-containing group represented by Formula (4) and more preferably a 2-(3,4-epoxycyclohexyl)ethyl group, which is a group represented by Formula (3) where R$^3$ is an ethylene group.

[Chem. 12]

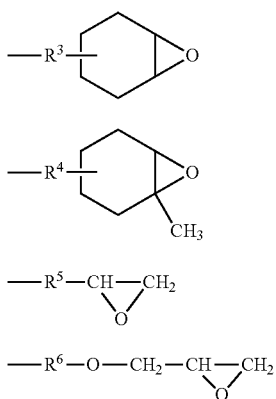

(3)

(4)

—R⁵—CH—CH₂
       \O/

(5)

—R⁶—O—CH₂—CH—CH₂
              \O/

(6)

As described above, $R^2$ in Formula (2) above represents a hydrogen atom or an alkyl group having from 1 to 4 carbon atoms, and thus, $OR^2$ in Formula (2) represents a hydroxy group or an alkoxy group having from 1 to 4 carbon atoms. Examples of the alkoxy group having from 1 to 4 carbon atoms include a methoxy group, an ethoxy group, a propoxy group, an isopropoxy group, a butoxy group, and an isobutyloxy group.

The polymerizable group-containing polyorganosilsesquioxane contained in the adhesive 4 may contain one type of constituent unit represented by Formula (1) above or may contain two or more types. The polymerizable group-containing polyorganosilsesquioxane may contain one type of constituent unit represented by Formula (2) above or may contain two or more types.

The polymerizable group-containing polyorganosilsesquioxane described above contained in the adhesive 4 may contain, as the above $T_3$ form, a constituent unit represented by Formula (7) below in addition to the constituent unit represented by Formula (1). $R^7$ in Formula (7) represents a hydrogen atom, a substituted or unsubstituted alkyl group, a substituted or unsubstituted alkenyl group, a substituted or unsubstituted cycloalkyl group, a substituted or unsubstituted aryl group, or a substituted or unsubstituted aralkyl group. $R^7$ in Formula (7) is preferably a substituted or unsubstituted alkyl group, a substituted or unsubstituted alkenyl group, or a substituted or unsubstituted aryl group, and more preferably a phenyl group.

[Chem. 13]

$$[R^7SiO_{3/2}] \tag{7}$$

Examples of the alkyl group described above for $R^7$ include a methyl group, an ethyl group, a propyl group, an n-butyl group, an isopropyl group, an isobutyl group, an s-butyl group, a t-butyl group, and an isopentyl group. Examples of the alkenyl group described above for $R^7$ include a vinyl group, an allyl group, and an isopropenyl group. Examples of the cycloalkyl group described above for $R^7$ include a cyclobutyl group, a cyclopentyl group, and a cyclohexyl group. Examples of the aryl group described above for $R^7$ include a phenyl group, a tolyl group, and a naphthyl group. Examples of the aralkyl group described above for $R^7$ include a benzyl group and a phenethyl group.

Examples of the substituent of the alkyl group, alkenyl group, cycloalkyl group, aryl group, and aralkyl group described above for $R^7$ include an ether group; an ester group; a carbonyl group; a siloxane group; a halogen atoms, such as a fluorine atom; an acryl group; a methacryl group; a mercapto group; an amino group; and a hydroxyl group.

The polymerizable group-containing polyorganosilsesquioxane described above contained in the adhesive 4 may contain, as the above $T_2$ form, a constituent unit represented by Formula (8) below in addition to the constituent unit represented by Formula (2). $R^7$ in Formula (8) represents a hydrogen atom, a substituted or unsubstituted alkyl group, a substituted or unsubstituted alkenyl group, a substituted or unsubstituted cycloalkyl group, a substituted or unsubstituted aryl group, or a substituted or unsubstituted aralkyl group and is specifically the same as $R^7$ in Formula (7) above. $R^2$ in Formula (8) represents a hydrogen atom or an alkyl group having from 1 to 4 carbon atoms and is specifically the same as $R^2$ in Formula (2) above.

[Chem. 14]

$$[R^7SiO_{2/2}(OR^2)] \tag{8}$$

The polymerizable group-containing polyorganosilsesquioxane described above contained in the adhesive 4 may contain in its siloxane constituent unit at least one type selected from the group consisting of what is called an M unit $[R^3SiO_{1/2}]$, what is called a D unit $[R_2SiO_{2/2}]$, and what is called a Q unit $[SiO_{4/2}]$ in addition to the first and second constituent units described above, which are T units.

The polymerizable group-containing polyorganosilsesquioxane may have any of a cage, incomplete cage, ladder, or random silsesquioxane structure or may have a combined structure of two or more of these silsesquioxane structures.

In all the siloxane constituent units of the polymerizable group-containing polyorganosilsesquioxane in the adhesive 4, the value of the molar ratio of the $T_3$ form to the $T_2$ form (i.e., $T_3$ form/$T_2$ form) is, for example, from 5 to 500, and the lower limit is preferably 10. The upper limit is preferably 100 and more preferably 50. For the polymerizable group-containing polyorganosilsesquioxane, adjustment of the value of [$T_3$ form/$T_2$ form] to the range improves compatibility with components other than the polymerizable group-containing polyorganosilsesquioxane contained in the adhesive 4, improving handleability. The value of [$T_3$ form/$T_2$ form] in the polymerizable group-containing polyorganosilsesquioxane from 5 to 500 means that the presence amount of the $T_2$ form is relatively small relative to the $T_3$ form, and the hydrolysis and the condensation reaction of silanol are more advanced.

The value of the molar ratio ($T_3$ form/$T_2$ form) in the polymerizable group-containing polyorganosilsesquioxane can be determined, for example, by $^{29}$Si-NMR spectroscopy measurements. In the $^{29}$Si-NMR spectrum, the silicon atom in the first constituent unit ($T_3$ form) described above and the silicon atom in the second constituent unit ($T_2$ form) described above indicate peaks or signals with different chemical shifts. The value of the molar ratio can be determined from the area ratio of these peaks. The $^{29}$Si-NMR spectrum of the polymerizable group-containing polyorganosilsesquioxane can be measured, for example, with the following instrument according to the following conditions.

Measuring instrument: "JNM-ECA500NMR (trade name)" (available from JEOL Ltd.)
Solvent: Deuteriochloroform
Number of scans: 1800 scans
Measurement temperature: 25° C.

The number average molecular weight (Mn) of the polymerizable group-containing polyorganosilsesquioxane contained in the adhesive 4 is preferably from 1000 to 50000, more preferably from 1500 to 10000, more preferably from 2000 to 8000, and more preferably from 2000 to 7000. The polymerizable group-containing polyorganosilsesquioxane with a number average molecular weight of not lower than 1000 improves insulating properties, heat resistance, crack resistance, and adhesiveness of a cured product or the adhesive layer to be formed. On the other hand, the polymerizable group-containing polyorganosilsesquioxane with a molecular weight of not higher than 50000 improves compatibility of the polymerizable group-containing polyorganosilsesquioxane in the adhesive 4 with other components and improves insulating properties, heat resistance, and crack resistance of a cured product or the adhesive layer to be formed.

The molecular weight dispersity (Mw/Mn) of the polymerizable group-containing polyorganosilsesquioxane contained in the adhesive 4 is preferably from 1.0 to 4.0, more preferably from 1.1 to 3.0, and more preferably from 1.2 to 2.7. The polymerizable group-containing polyorganosilsesquioxane with a molecular weight dispersity of not greater than 4.0 further increases heat resistance, crack resistance, and adhesiveness of a cured product or the adhesive layer to be formed. On the other hand, the polymerizable group-containing polyorganosilsesquioxane with a molecular weight dispersity of not less than 1.0 allows the adhesive composition to easily become liquid, tending to improve its handleability.

The number average molecular weight (Mn) and the weight average molecular weight (Mw) of the polymerizable group-containing polyorganosilsesquioxane are values determined by gel permeation chromatography (GPC) and calculated on the basis of polystyrene. The number average molecular weight (Mn) and the weight average molecular weight (Mw) of the polymerizable group-containing polyorganosilsesquioxane can be measured using, for example, an HPLC instrument ("LC-20AD (trade name)" available from Shimadzu Corporation) according to the following conditions.

Column: Two Shodex KF-801 (upstream side, available from Showa Denko K.K.), Shodex KF-802 (available from Showa Denko K.K.), and Shodex KF-803 (downstream side, available from Showa Denko K.K.) are connected in series
Measurement temperature: 40° C.
Eluent: Tetrahydrofuran (THF)
Sample concentration: From 0.1 to 0.2 mass %
Flow rate: 1 mL/min
Standard sample: Polystyrene
Detector: A UV-VIS detector ("SPD-20A (trade name)" available from Shimadzu Corporation)

The polymerizable group-containing polyorganosilsesquioxane as described above can be manufactured by hydrolysis of a silane compound having three hydrolyzable functional groups and a subsequent condensation reaction. The raw material used in the manufacturing includes at least a compound represented by Formula (9) below and, as necessary, a compound represented by Formula (10) below. The compound represented by Formula (9) is for forming the constituent unit represented by Formula (1) above and the constituent unit represented by Formula (2) above. The compound represented by Formula (10) is for forming the constituent unit represented by Formula (7) above and the constituent unit represented by Formula (8) above.

[Chem. 15]

$$R^1SX^1_3 \quad (9)$$

$$R^7SiX^2_3 \quad (10)$$

$R^1$ in Formula (9) represents a group containing a polymerizable group and is specifically the same as $R^1$ in Formulas (1) and (2) above. $X^1$ in Formula (9) represents an alkoxy group or a halogen atom. Examples of the alkoxy group include alkoxy groups having from 1 to 4 carbon atoms, such as a methoxy group, an ethoxy group, a propoxy group, an isopropyloxy group, a butoxy group, and an isobutyloxy group. Examples of the halogen atom as $X^1$ include a fluorine atom, a chlorine atom, a bromine atom, and an iodine atom. $X^1$ is preferably an alkoxy group and more preferably a methoxy group or an ethoxy group. In Formula (9), three $X^1$'s may be identical or different from each other.

$R^7$ in Formula (10) represents a substituted or unsubstituted aryl group, a substituted or unsubstituted aralkyl group, a substituted or unsubstituted cycloalkyl group, a substituted or unsubstituted alkyl group, or a substituted or unsubstituted alkenyl group and is specifically the same as $R^7$ in Formulas (7) and (8) above. $X^2$ in Formula (10) represents an alkoxy group or a halogen atom and is specifically the same as $X^1$ in Formula (9) above.

The raw material used in the manufacturing of the polymerizable group-containing polyorganosilsesquioxane described above may further contain an additional hydrolyzable silane compound. Examples of such a compound include a hydrolyzable trifunctional silane compound other than the compounds represented by Formulas (9) and (10) above, a hydrolyzable monofunctional silane compound that is to form an M unit, a hydrolyzable bifunctional silane compound that is to form a D unit, and a hydrolyzable tetrafunctional silane compound that is to form a Q unit.

The amount of the hydrolyzable silane compound as the raw material to be used and its composition is appropriately adjusted according to a structure of the polymerizable group-containing polyorganosilsesquioxane intended to be manufactured. For example, the amount of the compound represented by Formula (9) above to be used is, for example, from 55 to 100 mol % and preferably from 65 to 100 mol % relative to the total amount of the hydrolyzable silane compound to be used. The amount of the compound represented by Formula (10) above to be used is, for example, from 0 to 70 mol % relative to the total amount of the hydrolyzable silane compound to be used. The total amount of the compound represented by Formula (9) and the compound represented by Formula (10) to be used relative to the total amount of the hydrolyzable silane compound to be used is, for example, from 60 to 100 mol %, preferably from 70 to 100 mol %, and more preferably from 80 to 100 mol %.

In using two or more hydrolysable silane compounds in the manufacturing of the polymerizable group-containing polyorganosilsesquioxane, the hydrolysis and the condensation reaction for each hydrolyzable silane compound can be performed simultaneously or sequentially.

The hydrolysis and the condensation reaction described above are preferably performed in the presence of one or two or more of solvents. Examples of a preferred solvent include ethers, such as diethyl ether, dimethoxyethane, tetrahydrofuran, and dioxane; and ketones, such as acetone, methyl ethyl ketone, and methyl isobutyl ketone. The amount of the solvent to be used is appropriately adjusted according to the reaction time and the like within a range of, for example, not greater than 2000 parts by mass per 100 parts by mass of the hydrolyzable silane compound.

The hydrolysis and the condensation reaction described above are preferably allowed to proceed in the presence of one or two or more catalysts and water. The catalyst may be an acid catalyst or may be an alkali catalyst. The amount of the catalyst to be used is appropriately adjusted within a range of, for example, 0.002 to 0.2 mol per mol of the hydrolyzable silane compound. The amount of the water to be used is appropriately adjusted within a range from, for example, 0.5 to 20 mol per mol of the hydrolyzable silane compound.

The hydrolysis and the condensation reaction of the hydrolyzable silane compound may be performed in one stage or may be performed in two or more stages. In manufacturing the polymerizable group-containing polyorganosilsesquioxane having a value of the molar ratio (T3 form/T2 form) of not less than 5, the reaction temperature of the hydrolysis and the condensation reaction in the first stage is, for example, from 40 to 100° C. and preferably from 45 to 80° C. The reaction time of the hydrolysis and the condensation reaction in the first stage is, for example, from 0.1 to 10 hours and preferably from 1.5 to 8 hours. The reaction temperature of the hydrolysis and the condensation reaction in the second stage is preferably from 5 to 200° C. and more preferably from 30 to 100° C. Control of the reaction temperature in the above range tends to enable more efficient control of the value of the molar ratio (T3 form/T2 form) and the number average molecular weight in the desired ranges. In addition, the reaction time of the hydrolysis and the condensation reaction in the second stage is not particularly limited but is preferably from 0.5 to 1000 hours and more preferably from 1 to 500 hours. Furthermore, the hydrolysis and the condensation reaction described above can be performed under normal pressure, under increased pressure, or under reduced pressure. The hydrolysis and the condensation reaction described above is preferably performed under an atmosphere of an inert gas, such as nitrogen or argon.

The hydrolysis and the condensation reaction of the hydrolyzable silane compound as described above provide the polymerizable group-containing polyorganosilsesquioxane described above. After the completion of the reaction, the catalyst is preferably neutralized to prevent ring-opening of the polymerizable group. The polymerizable group-containing polyorganosilsesquioxane thus obtained is purified as necessary.

The adhesive 4 preferably contains at least one curing catalyst in addition to the polymerizable group-containing polyorganosilsesquioxane, for example, manufactured as described above.

Examples of the curing catalyst when the adhesive 4 contains an epoxy group-containing polyorganosilsesquioxane include thermal cationic polymerization initiators. Examples of the curing catalyst when the adhesive 4 contains a (meth)acryloyloxy group-containing polyorganosilsesquioxane include thermal radical polymerization initiators. The content of the curing catalyst in the adhesive 4 is preferably from 0.1 to 3.0 parts by mass per 100 parts by mass of the polymerizable group-containing polyorganosilsesquioxane.

Examples of the thermal cationic polymerization initiator described above include various types of thermal cationic polymerization initiators, such as arylsulfonium salts, aluminum chelates, and boron trifluoride amine complexes. Examples of the arylsulfonium salts include hexafluoroantimonate salts. Examples of the aluminum chelates include ethyl acetoacetate aluminum diisopropylate and aluminum tris(ethyl acetoacetate). Examples of the boron trifluoride amine complexes include a boron trifluoride monoethyl amine complex, a boron trifluoride imidazole complex, and a boron trifluoride piperidine complex.

Examples of the thermal radical polymerization initiators described above include thermal radical polymerization initiators of types, such as azo compounds and peroxides. Examples of the azo compounds include 2,2'-azobisisobutyronitrile, 2,2'-azobis(2,4-dimethylvaleronitrile), 2,2'-azobis(4-methoxy-2,4-dimethylvaleronitrile), dimethyl-2,2'-azobis(2-methylpropionate), dimethyl 2,2'-azobis (isobutyrate), diethyl-2,2'-azobis(2-methylpropionate), and dibutyl-2,2'-azobis(2-methylpropionate). Examples of the peroxides include benzoyl peroxide, t-butyl peroxy-2-ethylhexanoate, 2,5-dimethyl-2,5-di(2-ethylhexanoyl) peroxyhexane, t-butyl peroxybenzoate, t-butyl peroxide, cumene hydroperoxide, dicumyl peroxide, di-t-butyl peroxide, 2,5-dimethyl-2,5-dibutyl peroxyhexane, 2,4-dichlorobenzoyl peroxide, 1,4-di(2-t-butylperoxyisopropyl) benzene, 1,1-bis (t-butylperoxy)-3,3,5-trimethylcyclohexane, methyl ethyl ketone peroxide, and 1,1,3,3-tetramethylbutyl peroxy-2-ethylhexanoate.

The adhesive 4 may contain one or two or more additional curable compounds in addition to the polymerizable group-containing polyorganosilsesquioxane described above. Examples of the curable compound include epoxy compounds other than the polymerizable group-containing polyorganosilsesquioxane described above, (meth)acryloyloxy group-containing compounds, vinyl group-containing compounds, oxetane compounds, and vinyl ether compounds.

Examples of the epoxy compounds other than the polymerizable group-containing polyorganosilsesquioxane described above include alicyclic epoxy compounds (alicyclic epoxy resins), aromatic epoxy compounds (aromatic epoxy resins), and aliphatic epoxy compounds (aliphatic epoxy resins). Examples of the alicyclic epoxy compounds include 3,4,3',4'-diepoxybicyclohexane, 2,2-bis(3,4-epoxycyclohexyl)propane, 1,2-bis(3,4-epoxycyclohexyl)ethane, 2,3-bis(3,4-epoxycyclohexyl)oxirane, bis(3,4-epoxycyclohexylmethyl)ether, and an 1,2-epoxy-4-(2-oxiranyl)cyclohexane adduct of 2,2-bis(hydroxymethyl)-1-butanol (e.g., "EHPE3150" available from Daicel Corporation).

Examples of the aromatic epoxy compounds include epibis-type glycidyl ether epoxy resins and novolac-alkyl-type glycidyl ether epoxy resins.

Examples of the aliphatic epoxy compounds include glycidyl ethers of a q-hydric alcohol (q is a natural number) having no cyclic structure, glycidyl esters of a monocarboxylic acid or a polycarboxylic acid, and epoxy compounds of fat and oil having a double bond. Examples of the epoxy compounds of fat and oil having a double bond include epoxidized linseed oil, epoxidized soybean oil, and epoxidized castor oil.

Examples of the (meth)acryloyloxy group-containing compounds described above include trimethylolpropane tri (meth)acrylate, ditrimethylolpropane tetra(meth)acrylate, pentaerythritol tri(meth)acrylate, pentaerythritol tetra(meth) acrylate, dipentaerythritol penta(meth)acrylate, dipentaerythritol hexa(meth)acrylate, glycerin tri(meth)acrylate, tris(2-hydroxyethyl) isocyanurate tri(meth)acrylate, ethylene glycol di(meth)acrylate, 1,3-butanediol di(meth)acrylate, 1,4-butanediol di(meth)acrylate, 1,6-hexanediol di(meth)acrylate, neopentyl glycol di(meth)acrylate, diethylene glycol di(meth)acrylate, triethylene glycol di(meth)acrylate, dipropylene glycol di(meth)acrylate, bis(2-hydroxyethyl) isocyanurate di(meth)acrylate, dicyclopentanyl diacrylate, epoxy acrylate, urethane acrylate, unsaturated polyester, polyester acrylate, polyether acrylate, vinyl acrylate, silicone acrylate, and polystyrylethyl methacrylate. In addition, examples of the (meth)acryloyloxy group-containing compounds described above also include "DA-141" available from Nagase ChemteX Corporation, "Aronix M-211B" and "Aronix M-208" available from Toagosei Co., Ltd., and "NK Ester", "ABE-300", "A-BPE-4", "A-BPE-10", "A-BPE-20", "A-BPE-30", "BPE-100", "BPE-200", "BPE-500", "BPE-900", and "BPE-1300N" available from Shin-Nakamura Chemical Co., Ltd.

Examples of the vinyl group-containing compounds include styrene and divinylbenzene.

Examples of the oxetane compounds include 3,3-bis(vinyloxymethyl)oxetane, 3-ethyl-3-(hydroxymethyl)oxetane, 3-ethyl-3-(2-ethylhexyloxymethyl)oxetane, 3-ethyl-3-(hydroxymethyl)oxetane, 3-ethyl-3-[(phenoxy)methyl]oxetane, 3-ethyl-3-(hexyloxymethyl)oxetane, 3-ethyl-3-(chloromethyl)oxetane, and 3,3-bis(chloromethyl)oxetane.

Examples of the vinyl ether compounds include 2-hydroxyethyl vinyl ether, 3-hydroxypropyl vinyl ether, 2-hydroxypropyl vinyl ether, 2-hydroxyisopropyl vinyl ether, 4-hydroxybutyl vinyl ether, 3-hydroxybutyl vinyl ether, 2-hydroxybutyl vinyl ether, 3-hydroxyisobutyl vinyl ether, 2-hydroxyisobutyl vinyl ether, 1-methyl-3-hydroxypropyl vinyl ether, 1-methyl-2-hydroxypropyl vinyl ether, 1-hydroxymethylpropyl vinyl ether, 4-hydroxycyclohexyl vinyl ether, 1,6-hexanediol monovinyl ether, 1,6-hexanediol divinyl ether, 1,8-octanediol divinyl ether, p-xylene glycol monovinyl ether, p-xylene glycol divinyl ether, m-xylene glycol monovinyl ether, m-xylene glycol divinyl ether, o-xylene glycol monovinyl ether, o-xylene glycol divinyl ether, diethylene glycol monovinyl ether, diethylene glycol divinyl ether, triethylene glycol monovinyl ether, and triethylene glycol divinyl ether.

The adhesive 4 preferably contains a solvent to adjust its coating properties or the like. Examples of the solvent include propylene glycol monomethyl ether acetate, methyl ethyl ketone, methyl isobutyl ketone, cyclohexanone, toluene, xylene, ethyl acetate, butyl acetate, 3-methoxybutyl acetate, methoxypropyl acetate, ethylene glycol monomethyl ether acetate, methanol, ethanol, isopropyl alcohol, 1-butanol, 1-methoxy-2-propanol, 3-methoxybutanol, ethoxyethanol, diisopropyl ether, ethylene glycol dimethyl ether, and tetrahydrofuran.

The adhesive 4 may further contain an additive of various types, such as a silane coupling agent, an antifoaming agent, an antioxidant, an antiblocking agent, a leveling agent, a surfactant, an extender, an anticorrosive agent, an antistatic agent, and a plasticizer.

With regard to the heat resistance of the adhesive 4, the pyrolysis temperature of the adhesive 4 is preferably not lower than 200° C., more preferably not lower than 260° C., and more preferably not lower than 300° C. The pyrolysis temperature is a temperature in a curve obtained by thermogravimetric analysis performed using a differential thermal-thermogravimetric simultaneous analyzer, that is, a curve representing temperature dependence of thermal gravity in a predetermined temperature range for a sample to be analyzed, the temperature indicated by a point of intersection of a tangent to a portion where there is no weight loss or the weight is gradually decreasing at a constant rate at the initial temperature increasing process and a tangent at an inflection point within a portion where a significant weight loss is occurring at the middle temperature increasing process subsequent to the initial temperature increasing process. As the differential thermal-thermogravimetric simultaneous analyzer, for example, "TG-DTA6300 (trade name)" available from Seiko Instruments Inc. can be used.

In the bonding according to the present method of manufacturing a semiconductor device, the element forming surface 3a side of the wafer 3 is bonded via the adhesive 4 as described above to the back surface 1b side of the thinned wafer 1T in the reinforced wafer 1R.

Specifically, first, the adhesive 4 is coated by spin coating on one or both surfaces to be bonded (the element forming surface 3a of the wafer 3, the back surface 1b of the thinned wafer 1T) to form an adhesive layer. FIG. 3(a) illustrates by way of example coating the adhesive 4 on the element forming surface 3a of the wafer 3. In addition, prior to the coating of the adhesive 4, one or both surfaces to be bonded may be treated with a silane coupling agent. Then, the adhesive 4 (adhesive layer) is dried and solidified by heating. The heating temperature in the heating is, for example, from 50 to 150° C., and the heating time is, for example, from 5 to 120 minutes. The heating temperature may be constant or may be changed stepwise. Then, the surfaces to be bonded are affixed via the adhesive 4 (adhesive layer). In this affixing, the pressure is, for example, from 300 to 5000 g/cm$^2$, and the temperature is, for example, from 30 to 200° C. and preferably in a range of not lower than room temperature and not higher than 80° C. Thereafter, the adhesive 4 is cured by heating between the surfaces to be bonded. The heating temperature for curing is, for example, from 30 to 200° C. and preferably from 50 to 190° C. The heating time for curing is, for example, from 5 to 120 minutes. The heating temperature may be constant or may be changed stepwise. The thickness of the adhesive layer after curing the adhesive 4 is, for example, from 0.5 to 20 µm. The above configuration of curing the adhesive 4 at a relatively low temperature in the present bonding to achieve adhesive bonding is suitable for reducing dimensional change of the adhesive 4 interposed between the wafers during affixing and also suitable for preventing damage to the elements in the wafer as an adherend.

In the present method of manufacturing a semiconductor device, then, as illustrated in FIG. 4(a) and FIG. 4(b), the temporary adhesion by the temporary adhesive layer 2 between the supporting substrate S and the thinned wafer 1T in the reinforced wafer 1R is released to remove the supporting substrate S (removing step). The removing step preferably includes a softening treatment to soften the temporary adhesive layer 2 at a temperature higher than the softening point ($T_3$) of the polymer described above in the temporary adhesive layer 2, that is, the polymer of the polyvalent vinyl ether compound (A) and the compound (B). The heating temperature of the temporary adhesive layer in this softening treatment is preferably not lower than 170° C., and, for example, not higher than 250° C., preferably not higher than 240° C., and more preferably not higher than 230° C. In the present removing step, for example, after such a softening treatment, the supporting substrate S is slid relative to the wafer 1, and the supporting substrate S is separated or removed. After removing the reinforced wafer 1R, if the temporary adhesive remains on the wafer 1, the temporary adhesive is removed. In this removing operation, one or two or more solvents in which the temporary adhesive is readily soluble can be used. Examples of such solvents include cyclohexanone, propylene glycol monomethyl ether, propylene glycol monomethyl ether acetate, acetone, ethyl acetate, butyl acetate, and methyl isobutyl ketone. For the wafer 1 in the reinforced wafer 1R described above not including a wiring structure including an insulating film or a wiring pattern on the element forming surface 1a side of the wafer 1, a wiring structure is formed on the element forming surface 1a of the thinned wafer 1T after the present removing step. The same applies after the removing step described below.

In the method of manufacturing a semiconductor device of the present embodiment, a predetermined number of the reinforced wafers 1R (illustrated in FIG. 1(a)) are additionally prepared separately from the reinforced wafer 1R described above. As described above, the reinforced wafer 1R has a laminated structure including the wafer 1 having the element forming surface 1a and the back surface 1b, the supporting substrate S, and the temporary adhesive layer 2 between the wafer 1 and the supporting substrate S. The temporary adhesive layer 2 is formed from the temporary adhesive described above. Then, in each reinforced wafer 1R, the wafer 1 is thinned as illustrated in FIG. 1(b). Specifically, in each reinforced wafer 1R, the wafer 1 in a state of being supported by the supporting substrate S is thinned to a predetermined thickness by grinding from the back surface 1b side of the wafer 1 using a grinder to form a thinned wafer 1T. The thickness of the wafer 1 after thinning (thinned wafer 1T) is, for example, from 1 to 20 m.

Then, as illustrated in FIG. 5(a) and FIG. 5(b), the element forming surface 1a side of the thinned wafer 1T laminated on the wafer 3, which is the base wafer, is bonded via the adhesive 4 described above to the back surface 1b side of the thinned wafer 1T in the additional reinforced wafer 1R (additional bonding step).

Specifically, first, the adhesive 4 is coated by spin coating on one or both surfaces to be bonded (the element forming surface 1a of one thinned wafer 1T, the back surface 1b of the other thinned wafer 1T) to form an adhesive layer. FIG. 5(a) illustrates by way of example coating the adhesive 4 on the element forming surface 1a of one thinned wafer 1T. In addition, prior to the coating of the adhesive 4, one or both surfaces to be bonded may be treated with a silane coupling agent. Then, the adhesive 4 (adhesive layer) is dried and solidified by heating. The heating temperature in the heating is, for example, from 50 to 150° C., and the heating time is, for example, from 5 to 120 minutes. The heating temperature may be constant or may be changed stepwise. Then, the surfaces to be bonded are affixed via the adhesive 4 (adhesive layer). In this affixing, the pressure is, for example, from 300 to 5000 g/cm$^2$, and the temperature is, for example, from 30 to 200° C. and preferably in a range of not lower than room temperature and not higher than 80° C. Thereafter, the adhesive 4 is cured by heating between the surfaces to be bonded. The heating temperature for curing is, for example, from 30 to 200° C. and preferably from 50 to 190° C., and the heating time for curing is, for example, from 5 to 120 minutes. The heating temperature may be constant or may be changed stepwise. The thickness of the adhesive layer after curing the adhesive 4 is, for example, from 0.5 to 20 μm. The above configuration of curing the adhesive 4 at a relatively low temperature in the present additional bonding step to achieve adhesive bonding is suitable for reducing dimensional change of the adhesive 4 interposed between the wafers during affixing and also suitable for preventing damage to the elements in the wafer as an adherend.

In the present method of manufacturing a semiconductor device, then, as illustrated in FIG. 6(a) and FIG. 6(b), the temporary adhesion by the temporary adhesive layer 2 between the supporting substrate S and the thinned wafer 1T in the reinforced wafer 1R further laminated is released to remove the supporting substrate S (removing step after the additional bonding). The present removing step after the additional bonding preferably includes a softening treatment to soften the temporary adhesive layer 2 at a temperature higher than the softening point ($T_3$) of the polymer described above in the temporary adhesive layer 2, that is, the polymer of the polyvalent vinyl ether compound (A) and the compound (B). The heating temperature of the temporary adhesive layer in this softening treatment is preferably not lower than 170° C., and, for example, not higher than 250° C., preferably not higher than 240° C., and more preferably not higher than 230° C. In the present removing step after the additional bonding, for example, after such a softening treatment, the supporting substrate S is slid relative to the wafer 1, and the supporting substrate S is separated or removed. After removing the reinforced wafer 1R, if the temporary adhesive remains on the wafer 1, the temporary adhesive is removed.

Figure 7:
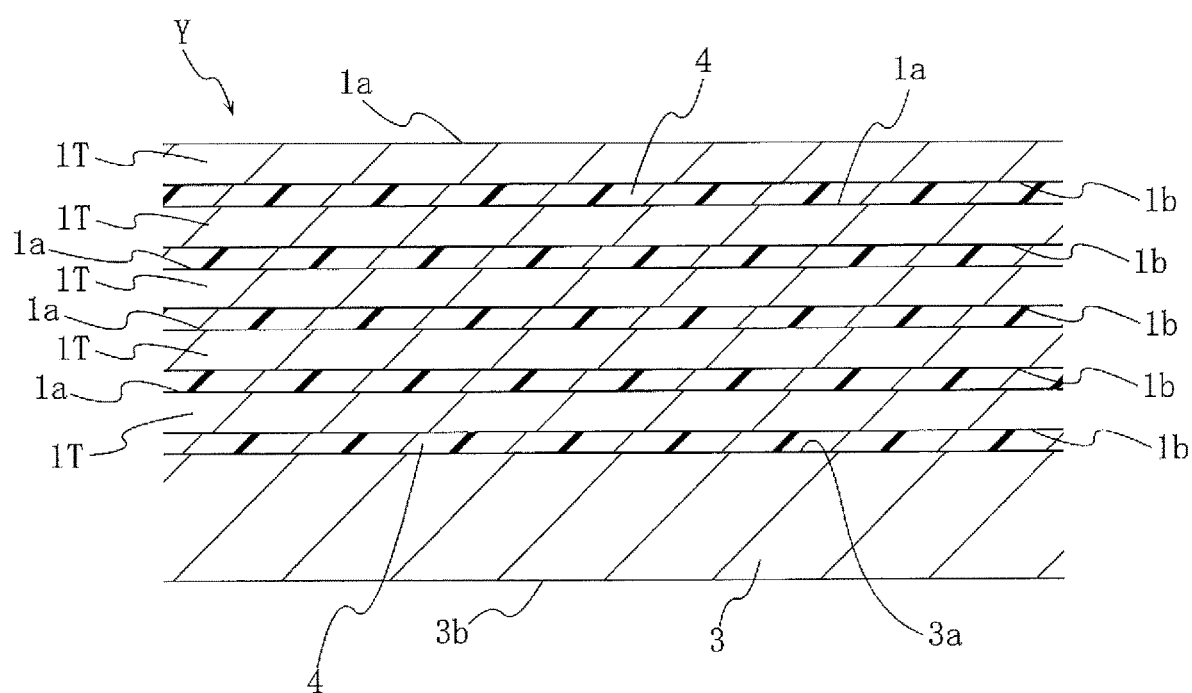
FIG. 7 illustrates some processes in a method of manufacturing a semiconductor device according to an embodiment of the present invention.

In the present method of manufacturing a semiconductor device, a plurality of thinned wafers 1T can be sequentially laminated by repeating a series of processes including a thinning step to thin the wafer 1 of the reinforced wafer 1R (FIG. 1), the additional bonding step described above (FIG. 5), and the subsequent removing step (FIG. 6) for each additional reinforced wafer 1R to be prepared. FIG. 7 illustrates as an example a wafer laminate Y having a configuration in which five thinned wafers 1T are arranged in multilayers on the wafer 3.

Figure 8:
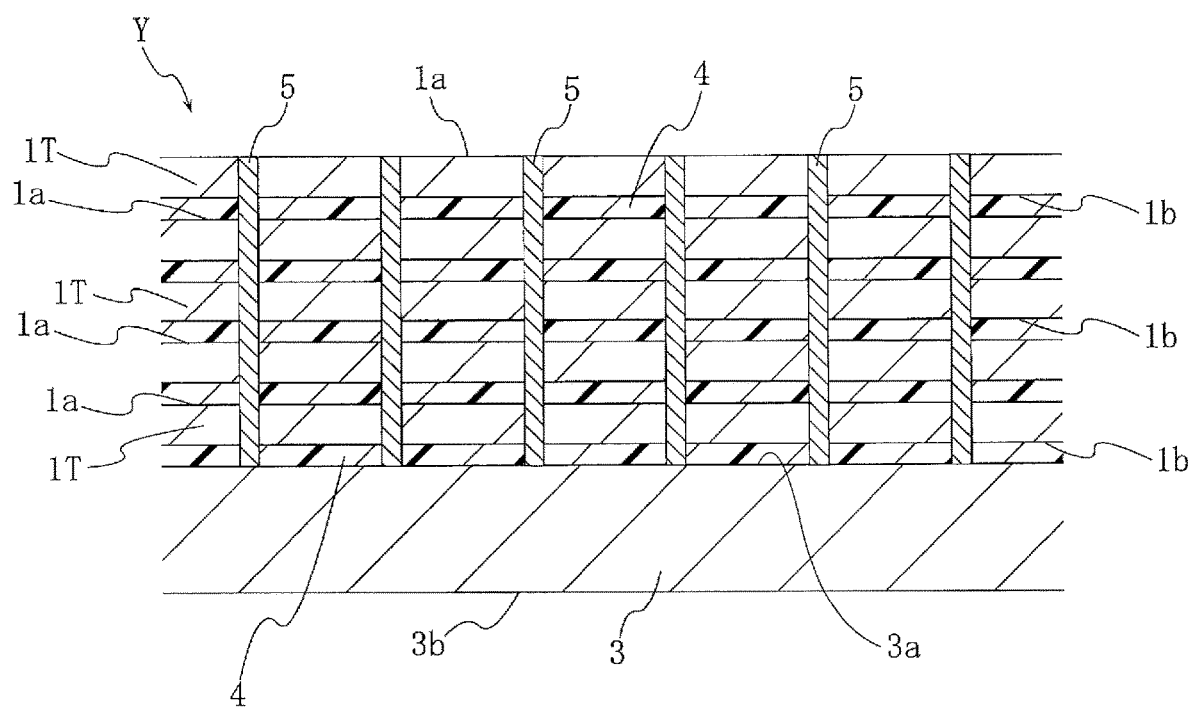
FIG. 8 illustrates some processes in a method of manufacturing a semiconductor device according to an embodiment of the present invention.

Then, as illustrated in FIG. 8, through electrodes 5 are formed (through electrode forming). Through electrodes 5 are for electrically connecting semiconductor elements formed in different wafers in the wafer laminate Y. In the present embodiment, the through electrodes 5 extend through the inside of the wafer laminate Y from the element forming surface 1a of the thinned wafer 1T located at one end of the wafer laminate Y in a lamination direction through the element forming surface 3a of the wafer 3 located at another end of the wafer laminate Y. In the present through electrode forming step, the through electrodes 5 can be formed, for example, through forming openings passing through all the thinned wafers 1T and the adhesives 4 (adhesive layers); forming insulating films (not illustrated) on inner wall surfaces of the openings; forming barrier layers (not illustrated) on the insulating film surfaces; forming seed layers for electroplating (not illustrated) on the barrier layer surfaces; and filling the openings with a conductive material, such as copper, by an electroplating method. Examples of the technique for forming the openings include reactive ion etching. In addition, a technique described, for example, in JP 2016-004835 A may be employed to form the through electrodes 5. The through electrodes 5 to be formed electrically connect specifically wiring structures (not illustrated) each formed on the element forming surface 1a side of each thinned wafer 1T and a wiring structure (not illustrated) formed on the element forming surface 3a side of the wafer 3 to each other. Such through electrodes 5 can appropriately electrically connect the semiconductor elements at short distances in a semiconductor device to be manufactured. Thus, the configuration of forming such through electrodes 5 is suitable for achieving an efficient digital signal processing, for reducing attenuation of the high-frequency signal, and also for reducing power consumption in a semiconductor device to be manufactured.

Figure 9:
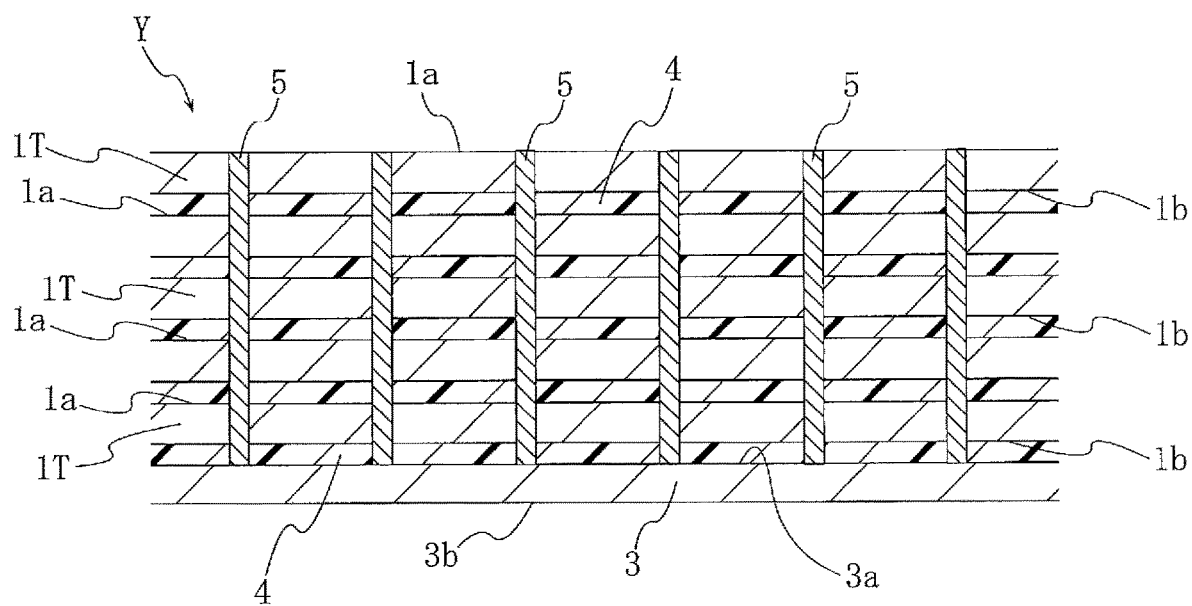
FIG. 9 illustrates some processes in a method of manufacturing a semiconductor device according to an embodiment of the present invention.

In the present method of manufacturing a semiconductor device, the wafer 3, which is the base wafer, may then be thinned as illustrated in FIG. 9. In the present thinning step, the wafer 3 is thinned to a predetermined thickness, for example, by grinding on the back surface 3b side of the wafer 3. The thickness of the wafer 3 after thinning is, for example, from 5 to 400 μm. Such a configuration is suitable for reducing the thickness of a semiconductor device to be manufactured.

Thereafter, an insulating film (not illustrated) may be formed on the element forming surface 1a of the thinned wafer 1T laminated last, and an external connection bump (not illustrated) may be formed on the insulating film.

Alternatively, a through electrode (not illustrated) extending through the wafer 3 after thinning and electrically connected to a wiring structure (not illustrated) in the element forming surface 3a side of the wafer 3 may be formed, and an external connection bump (not illustrated) electrically connected to the through electrode may be formed on the back surface 3b side of the wafer 3.

As described above, the semiconductor device having a three-dimensional structure in which semiconductor elements are integrated in their thickness direction can be manufactured. This semiconductor device may be divided into individual pieces by dicing.

As described above, the present method of manufacturing a semiconductor device includes bonding (FIG. 3 and FIG. 5) for wafer-to-wafer bonding with the adhesive 4 containing a polymerizable group-containing polyorganosilsesquioxane. The polymerizable group-containing polyorganosilsesquioxane is suitable for achieving a relatively low polymerization temperature or curing temperature of, for example, approximately 30 to 200° C. and is suitable for achieving high heat resistance after curing. Thus, the wafer-to-wafer adhesive bonding with the adhesive 4 containing the polymerizable group-containing polyorganosilsesquioxane is suitable for achieving high heat resistance in the adhesive layer to be formed between the wafers as well as achieving lower curing temperature for forming the adhesive layer and thus preventing damage to the elements in the wafer 1 as an adherend.

In the present method of manufacturing a semiconductor device, as described above, the wafer 1 (the wafer 1 of the reinforced wafer 1R) affixed to the supporting substrate S via the temporary adhesive layer 2 is thinned and then bonded to the wafer 3, and then the supporting substrate S is removed from the thinned wafer 1T. In addition, as described above, the temporary adhesive for forming the temporary adhesive layer 2 contains a polyvalent vinyl ether compound, a compound having two or more hydroxy groups or carboxy groups that are capable of forming an acetal bond by reacting with a vinyl ether group of the polyvalent vinyl ether compound so as to form a polymer with the polyvalent vinyl ether compound, and a thermoplastic resin. The temporary adhesive thus configured is suitable, in the form of the temporary adhesive layer 2 formed by curing between the supporting substrate S and the wafer 1, for achieving a relatively high softening temperature of, for example, approximately 130 to 250° C. while ensuring high adhesive strength that can withstand the grinding or the like in the thinning step of the wafer 1.

The temporary adhesive layer 2 described above in the reinforced wafer 1R to be subjected to the bonding (FIG. 3 and FIG. 5) is thus suitable for achieving a relatively high softening temperature, and the adhesive 4 used in the above bonding is suitable for achieving a relatively low curing temperature and high heat resistance after curing as described above. This composite configuration in the present embodiment is suitable for performing each bonding and performing each subsequent removing both in combination. That is, the composite configuration is suitable for performing the bonding at a relatively low temperature condition to achieve a good adhesive bonding of an upper wafer (the thinned wafer 1T) to a lower wafer (the wafer 3 or the thinned wafer 1T) while maintaining the temporary adhesion of the supporting substrate S and the thinned wafer 1T in the reinforced wafer 1R as well as for performing the subsequent removing at a relatively high temperature condition to soften the temporary adhesive layer 2 to remove the supporting substrate S from the thinned wafer 1T while maintaining the wafer-to-wafer adhesive bonding. The configuration of releasing the temporary adhesion by the temporary adhesive layer 2 through softening the temporary adhesive layer 2 in removing the supporting substrate S from the thinned wafer 1T is suitable for avoiding or preventing a strong stress applied locally to the thinned wafer 1T to avoid damage to the thinned wafer 1T.

As described above, the present method of manufacturing a semiconductor device is suitable for multilayering the thinned wafers 1T via adhesive bonding while avoiding wafer damage.

Figure 10:
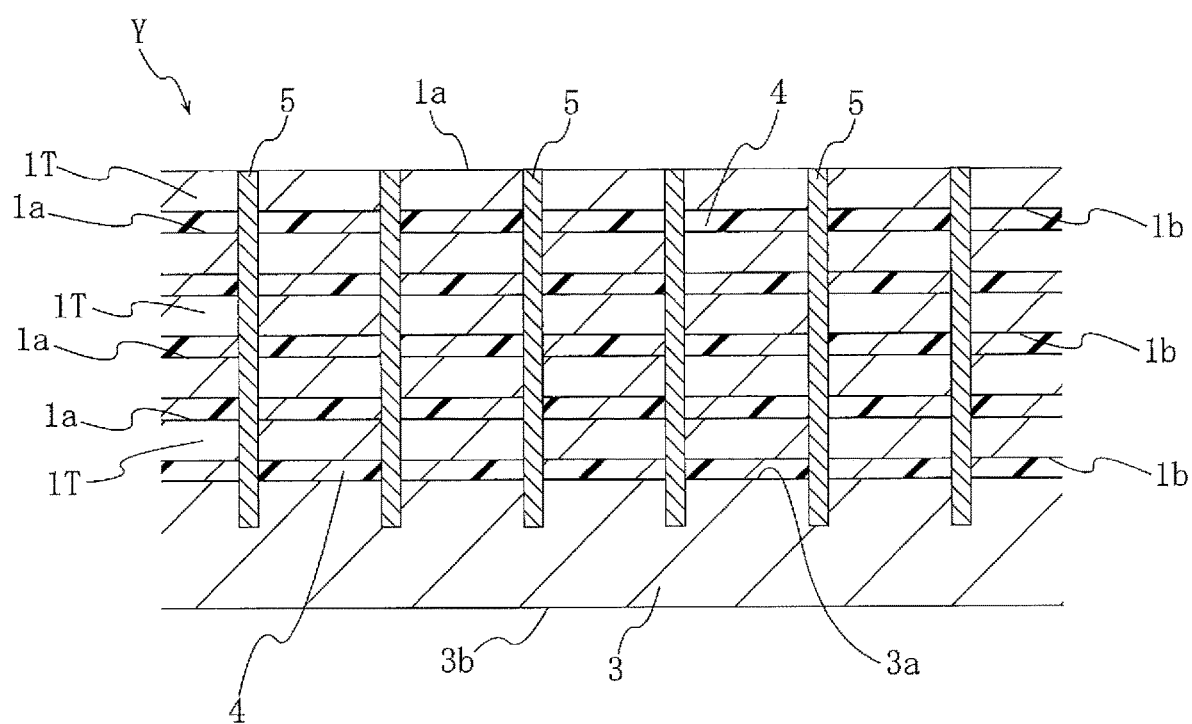
FIG. 10 illustrates some processes in a method of manufacturing a semiconductor device according to an embodiment of the present invention.

In the present embodiment, the through electrodes 5 as illustrated in FIG. 10 may be formed instead of the through electrodes 5 as illustrated in FIG. 8 in the wafer laminate Y described above as illustrated in FIG. 7 (through electrode forming).

The through electrodes 5 illustrated in FIG. 10 are for electrically connecting semiconductor elements formed in different wafers in the wafer laminate Y. The through electrodes 5 extend through the inside of the wafer laminate Y from the element forming surface 1a of the thinned wafer 1T located at one end of the wafer laminate Y in a lamination direction through a position exceeding the element forming surface 3a of the wafer 3 located at another end of the wafer laminate Y. In the present through electrode forming, the through electrodes 5 illustrated in FIG. 10 can be formed, for example, through forming openings passing through all the thinned wafers 1T and the adhesives 4 (adhesive layers) and penetrating into the wafer 3 (base wafer); forming insulating films (not illustrated) on inner wall surfaces of the openings; forming barrier layers (not illustrated) on the insulating film surfaces; forming seed layers for electroplating (not illustrated) on the barrier layer surfaces; and filling the openings with a conductive material, such as copper, by an electroplating method. Examples of the technique for forming the openings include reactive ion etching. In addition, a technique described, for example, in JP 2016-004835 A may be employed to form the through electrodes 5. The through electrodes 5 to be formed electrically connect specifically wiring structures (not illustrated) each formed on the element forming surface 1a side of each thinned wafer 1T and a wiring structure (not illustrated) formed on the element forming surface 3a side of the wafer 3 to each other. Such through electrodes 5 can appropriately electrically connect the semiconductor elements at short distances in a semiconductor device to be manufactured. Thus, the configuration of forming such through electrodes 5 is suitable for achieving an efficient digital signal processing, for reducing attenuation of the high-frequency signal, and also for reducing power consumption in a semiconductor device to be manufactured.

Figure 11:
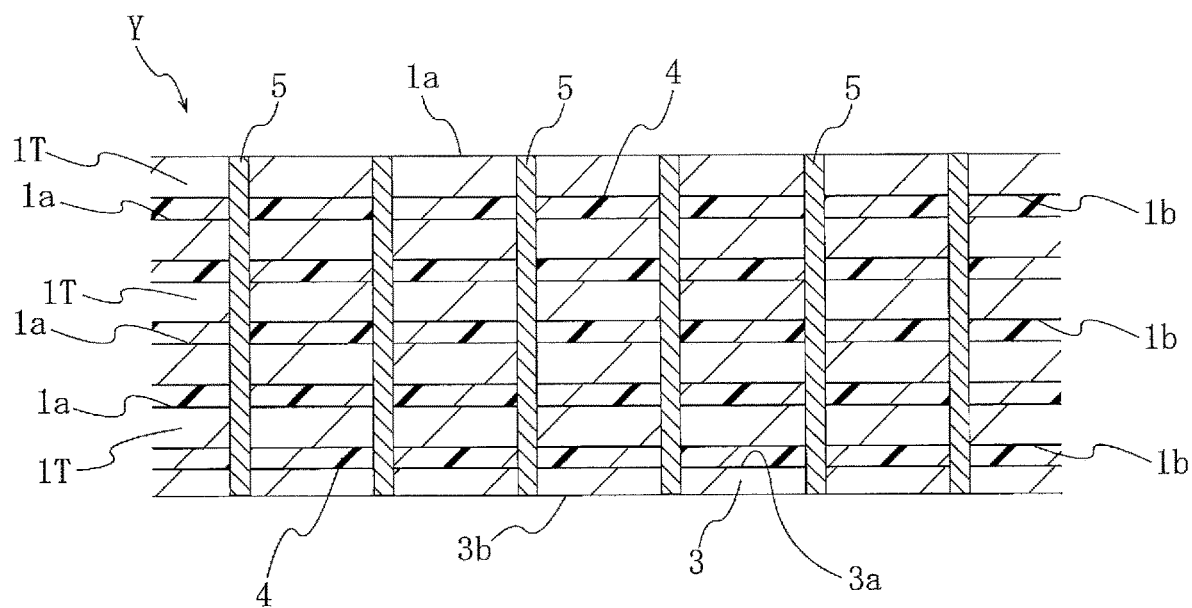
FIG. 11 illustrates some processes in a method of manufacturing a semiconductor device according to an embodiment of the present invention.

After such a through electrode forming, the wafer 3, which is the base wafer, may be thinned to expose the through electrodes 5 on the back surface side of the wafer 3 as illustrated in FIG. 11 (base wafer thinning step). In the wafer laminate Y having undergone the present thinning step, the through electrodes 5 are exposed on the element forming surface 1a of the thinned wafer 1T located at one end in a wafer lamination direction and is exposed on the back surface 3b of the wafer 3 located at another end in the wafer lamination direction. In the present thinning step, the wafer 3 is thinned to a predetermined thickness, for example, by grinding on the back surface 3b side of the wafer 3. The thickness of the wafer 3 after thinning is, for example, from 5 to 200 μm. Such a configuration is suitable for reducing the thickness of a semiconductor device to be manufactured.

Thereafter, an insulating film (not illustrated) may be formed on the element forming surface 1a of the thinned wafer 1T laminated last, and an external connection bump (not illustrated) may be formed on the insulating film.

As described above, the semiconductor device having a three-dimensional structure in which semiconductor elements are integrated in their thickness direction can be manufactured. This semiconductor device may be divided into individual pieces by dicing.

Figure 12:
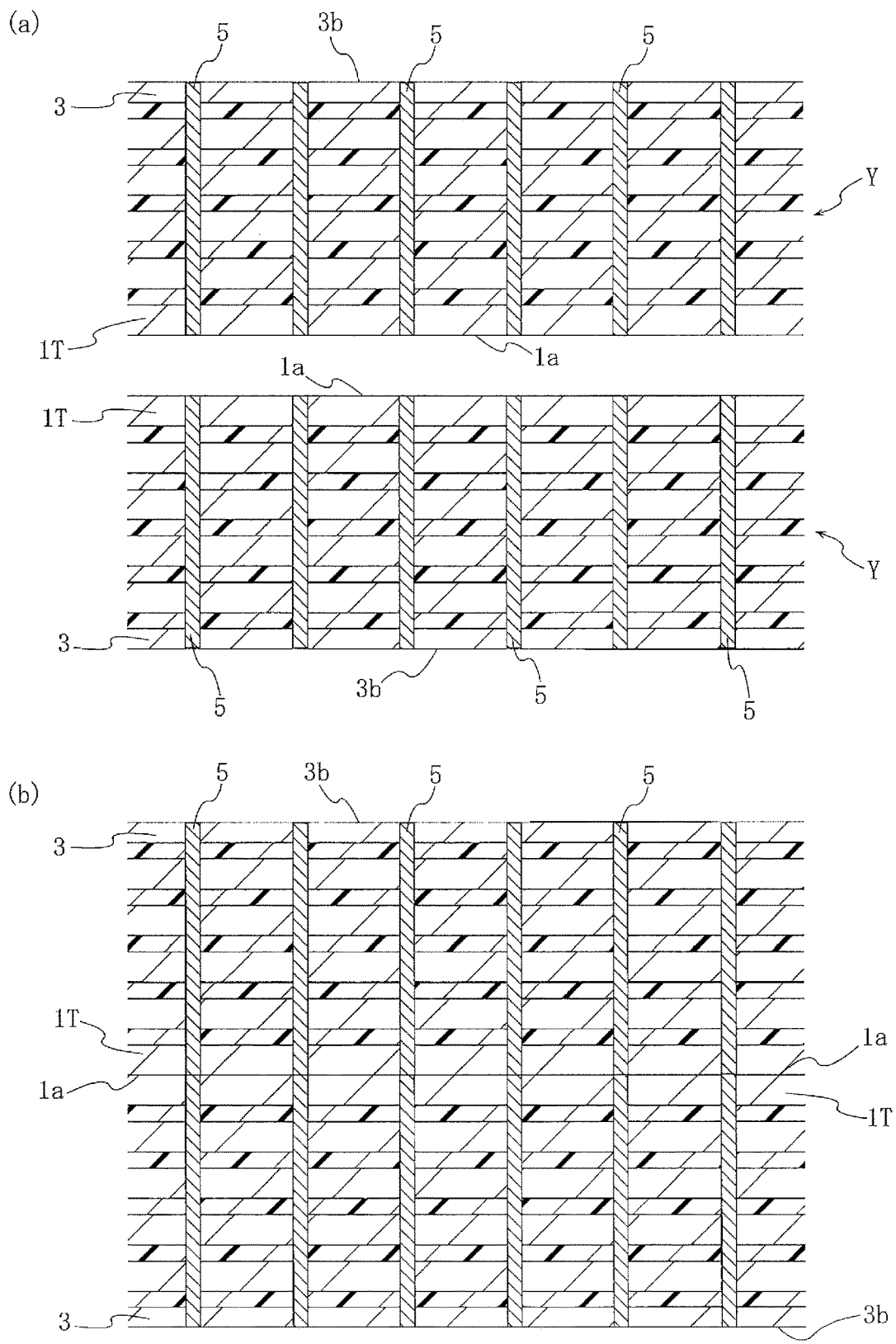
FIG. 12 illustrates some processes in a method of manufacturing a semiconductor device according to an embodiment of the present invention.

In the present embodiment, two wafer laminates Y having undergone the base wafer thinning step described above with reference to FIG. 11 are prepared, and then these wafer laminates Y may be bonded as illustrated in FIG. 12 (bonding between wafer laminates). In the present bonding between wafer laminates, specifically, as illustrated in FIG. 12(a) and FIG. 12(b), the element forming surface 1a side of the thinned wafer 1T located at one end in a lamination direction in one wafer laminate Y is bonded to the element forming surface 1a side of the thinned wafer 1T located at one end in a lamination direction in the other wafer laminate Y while the electrical connections of the through electrodes 5 are achieved between both wafer laminates Y (bonded face-to-face). Examples of the bonding technique include bump bonding in which bumps are interposed between the through electrodes 5 of one wafer laminate Y and the through electrodes 5 of the other wafer laminate Y, and what is called direct bonding. Examples of the direct bonding include inter-electrode direct bonding, such as, for example, Cu—Cu bonding between Cu electrodes (the same applies to a bonding technique in the bonding step between wafer laminates described below). FIG. 12 illustrates as an example face-to-face bonding of the wafer laminates Y to each other by direct bonding.

Figure 13:
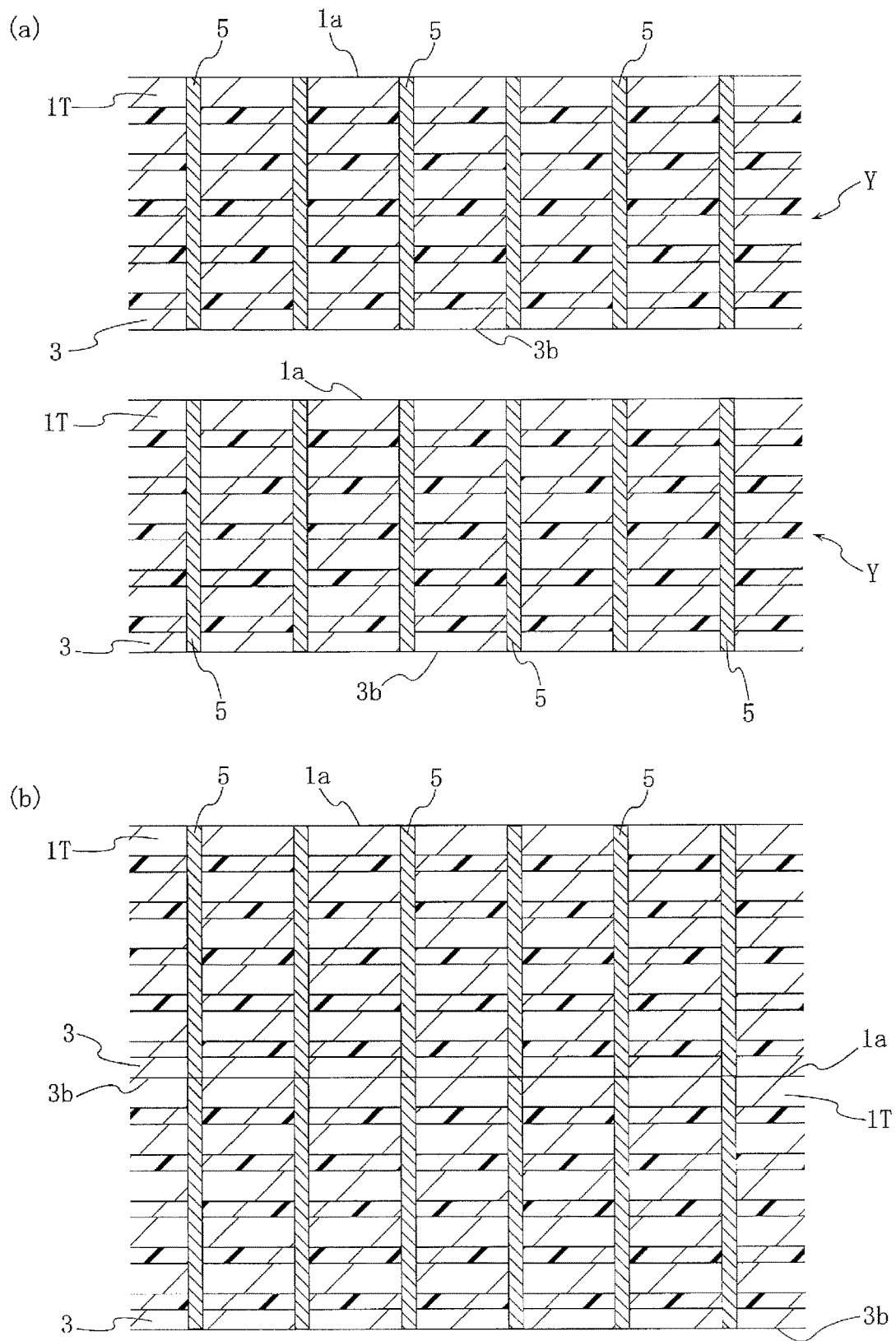
FIG. 13 illustrates some processes in a method of manufacturing a semiconductor device according to an embodiment of the present invention.

In the present embodiment, two wafer laminates Y having undergone the base wafer thinning step described above with reference to FIG. 13 are prepared, and then these wafer laminates Y may be bonded as illustrated in FIG. 13 (bonding between wafer laminates). In the present bonding between wafer laminates, specifically, as illustrated in FIG. 13(a) and FIG. 13(b), the element forming surface 1a side of the thinned wafer 1T located at one end in a lamination direction in one wafer laminate Y is bonded to the back surface 3b side of the wafer 3 located at one end in a lamination direction in the other wafer laminate Y while the electrical connections of the through electrodes 5 are achieved between both wafer laminates Y (bonded face-to-back). Examples of the bonding technique include bump bonding and direct bonding described above. FIG. 13 illustrates as an example face-to-back bonding of the wafer laminates Y to each other by direct bonding.

Figure 14:
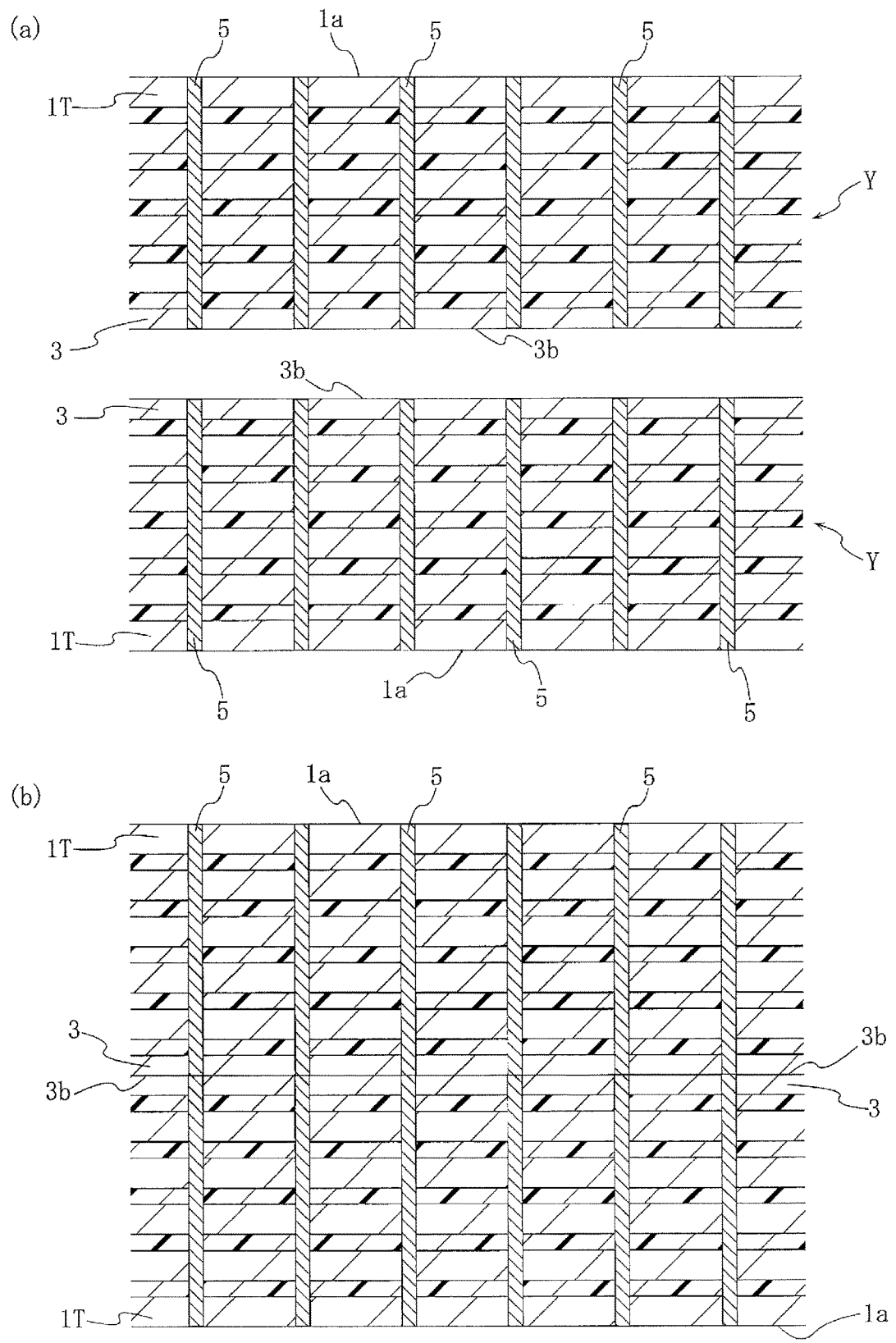
FIG. 14 illustrates some processes in a method of manufacturing a semiconductor device according to an embodiment of the present invention.

In the present embodiment, two wafer laminates Y having undergone the base wafer thinning step described above with reference to FIG. 14 are prepared, and then these wafer laminates Y may be bonded as illustrated in FIG. 14 (bonding between wafer laminates). In the present bonding between wafer laminates, specifically, as illustrated in FIG. 14(a) and FIG. 14(b), the back surface 3b side of the wafer 3 located at one end in a lamination direction in one wafer laminate Y is bonded to the back surface 3b side of the wafer 3 located at one end in a lamination direction in the other wafer laminate Y while the electrical connections of the through electrodes 5 are achieved between both wafer laminates Y (bonded back-to-back). Examples of the bonding technique include bump bonding and direct bonding described above. FIG. 14 illustrates as an example back-to-back bonding of the wafer laminates Y to each other by direct bonding.

The through electrode forming as illustrated in FIG. 10 and the base wafer thinning step as illustrated in FIG. 11 may be followed by the bonding between wafer laminates as illustrated in FIG. 12, FIG. 13, or FIG. 14 to manufacture a semiconductor device having a three-dimensional structure in which semiconductor elements are integrated in their thickness direction. This semiconductor device may be divided into individual pieces by dicing.

The configuration described above undergoing the through electrode forming as illustrated in FIG. 10, the base wafer thinning step as illustrated in FIG. 11, and the bonding between wafer laminates as illustrated in FIG. 12, FIG. 13, or FIG. 14 is suitable for efficiently multilayering wafers or semiconductor elements in a manufacturing processes of a semiconductor device having a three-dimensional structure in which semiconductor elements are integrated in their thickness direction. In addition, the configuration is suitable for increasing the density of semiconductor elements in each wafer when the technique described in JP 2016-004835 A is employed in forming the through electrodes 5 described above. According to the through electrode forming technique described in the above document, a partially conductive portion is formed within each wafer, and these partial conductive portions are connected to each other to form a through electrode. However, these partially conductive portions have different cross-sectional areas (cross-sectional areas in the wafer in-plane direction) between adjacent wafers, resulting in a structure in which the cross-sectional area of the partially conductive portion inevitably gradually increases from wafer to wafer as the number of laminated wafers increases. Such a structure will have a difficulty in increasing the density of semiconductor elements in each wafer as the number of laminated wafers increases. In contrast, the configuration described above undergoing the through electrode forming as illustrated in FIG. 10, the base wafer thinning step as illustrated in FIG. 11, and the bonding step between wafer laminates as illustrated in FIG. 12, FIG. 13, or FIG. 14 is suitable for increasing the density of semiconductor elements in each wafer while increasing the number of laminated wafers.

Example

Production of Adhesive

An adhesive was obtained by mixing 100 parts by mass of an epoxy group-containing polyorganosilsesquioxane obtained as described below, 115 parts by mass of propylene glycol monomethyl ether acetate, 0.45 parts by mass (as a solid content) of an antimony sulfonium salt ("SI-150L (trade name)" available from Sanshin Chemical Industry Co., Ltd.), and 0.05 parts by mass of (4-hydroxyphenyl) dimethylsulfonium methyl sulfite ("SAN-AID SI Auxiliary Agent (trade name)" available from Sanshin Chemical Industry Co., Ltd.).

Synthesis of Epoxy Group-Containing Polyorganosilsesquioxane

In a 300-mL flask equipped with a reflux condenser, a nitrogen gas inlet tube, a stirrer, and a thermometer, while nitrogen gas was introduced, 161.5 mmol (39.79 g) of 2-(3,4-epoxycyclohexyl)ethyltrimethoxysilane, 9 mmol (1.69 g) of phenyltrimethoxysilane, and 165.9 g of acetone as a solvent were mixed, and the temperature was raised to 50° C. Then, to the mixture, 4.7 g of a 5% potassium carbonate aqueous solution (1.7 mmol as potassium carbonate) was added dropwise over 5 minutes, and then 1700 mmol (30.6 g) of water was added dropwise over 20 minutes. No significant temperature rise occurred in the mixture during the drop-wise addition procedure. After the drop-wise addition procedure, a polycondensation reaction was performed at 50° C. for 4 hours while nitrogen gas was introduced into the flask. A product in the reaction solution after the polycondensation reaction, when analyzed, had a number average molecular weight of 1900 and a molecular weight dispersity of 1.5. In addition, the reaction solution allowed to stand to cool was repeatedly washed with water until a lower layer solution (aqueous phase) generated by a phase separation became neutral, then an upper layer solution was collected. The solvent was distilled off from the upper layer solution under conditions of 1 mmHg and 40° C. until the amount of the solvent became 25 mass %, and a colorless transparent liquid product (epoxy group-containing polyorganosilsesquioxane) was obtained.

Production of Wafer Laminate

First, a first silicon wafer and a reinforced second silicon wafer were prepared. The first silicon wafer had a diameter of 300 mm, a thickness of 775 μm, and one surface treated with a silane coupling agent. In the silane coupling agent treatment of the first silicon wafer, a silane coupling agent ("KBE403 (trade name)" available from Shin-Etsu Chemical Co., Ltd.) was coated on one surface of the first silicon wafer by spin coating, followed by heating at 120° C. for 5 minutes. The reinforced second silicon wafer was produced as follows.

First, a composition for forming a temporary adhesive layer was coated by spin coating on a silicon substrate (a diameter of 300 mm and a thickness of 775 μm) serving as a supporting substrate, and a temporary adhesive composition layer was formed. The composition layer was dried by heating at 200° C. for 2 minutes and then at 230° C. for 4 minutes, and a temporary adhesive layer was formed. The composition for forming a temporary adhesive layer was prepared by mixing 0.24 parts by mass of diethylene glycol divinyl ether, 5.4 parts by mass of a p-hydroxystyrene/styrene copolymer ("MARUKA LYNCUR CST-50 (trade name)", a molar ratio of p-hydroxystyrene and styrene of 50:50, a weight average molecular weight of 4400, and a softening point of 150° C., available from Maruzen Petrochemical Co., Ltd.), 1.8 parts by mass of a polyvinyl butyral resin ("S-LEC KS-1 (trade name)", a thermoplastic resin with a molecular weight of $2.7 \times 10^4$ and a softening point of 200° C., available from Sekisui Chemical Co., Ltd.), 1.8 parts by mass of polycaprolactone ("Placcel HIP (trade name)", a thermoplastic resin with a weight average molecular weight of 10000 and a softening point of 100° C., available from Daicel Corporation), 0.18 parts by mass of trans-cinnamic acid (a pKa of 4.44, available from Wako Pure Chemical Industries, Ltd.) as a polymerization accelerator, 0.045 parts by mass of a fluorine oligomer ("F-554 (trade name)" available from DIC Corporation) as a surfactant, and 22 parts by mass of cyclohexane as a solvent. Then, the silicon substrate and the second silicon wafer (a diameter of 300 mm and a thickness of 775 μm) were bonded via the temporary adhesive layer. Specifically, the silicon substrate and the second silicon wafer were affixed via the temporary adhesive layer under pressure under conditions of a temperature of 150° C. and a pressure of 3000 g/cm², then the temporary adhesive layer was solidified by heating at 230° C. for 5 minutes, and the silicon substrate and the second silicon wafer were bonded via the temporary adhesive layer. Then, the second silicon wafer in a state of being supported by the silicon substrate was ground using a grinder (available from DISCO Corporation), and the second silicon wafer was thinned to a thickness of 10 μm. Then, a silane coupling agent ("KBE403 (trade name)" available from Shin-Etsu Chemical Co., Ltd.) was coated by spin coating on the surface (ground surface) of the thinned second silicon wafer, followed by heating at 120° C. for 5 minutes (silane coupling agent treatment). The reinforced second silicon wafer described above was thus produced.

In producing the wafer laminate, then, the adhesive containing the epoxy group-containing polyorganosilsesquioxane was coated by spin coating on the silane coupling agent-treated surface (first surface) of the first silicon wafer, and an adhesive coating was formed. Then, the first silicon wafer having this adhesive coating was heated at 80° C. for 4 minutes and then heated at 100° C. for 2 minutes to dry the adhesive on the first surface of the first silicon wafer, and an adhesive layer with a thickness of 2.5 μm was formed. Then, the first silicon wafer having the adhesive layer and the thinned second silicon wafer in the reinforced second silicon wafer described above were affixed via the adhesive layer on the first silicon wafer under pressure, followed by heating at 150° C. for 30 minutes and then heating at 170° C. for 30 minutes to cure the adhesive layer, and both silicon wafers were bonded to each other. The affixing was performed under conditions of a temperature of 50° C. and a pressure of 3000 g/cm².

Then, in the reinforced second silicon wafer having undergone the adhesive bonding with the first silicon wafer, the temporary adhesion by the temporary adhesive layer between the silicon substrate serving as a supporting substrate and the thinned second silicon wafer was released, and the silicon substrate was removed from the thinned second silicon wafer. Specifically, after heat treatment at 235° C. for 5 minutes, the silicon substrate was slid at a relative speed of 1 mm/sec relative to the thinned second silicon wafer, and the silicon substrate was removed from the thinned second silicon wafer or the wafer laminate including the thinned second silicon wafer. Thereafter, the temporary adhesive residue on the thinned second silicon wafer was removed by washing using propylene glycol monomethyl ether. As described above, the wafer laminate of the present example was produced using the adhesive described above containing the temporary adhesive and the polymerizable group-containing polyorganosilsesquioxane.

To summarize the above, configurations and variations of the present invention are described below.

(1) A method of manufacturing a semiconductor device, the method including:

preparing a reinforced wafer having a laminated structure, the laminated structure including a wafer having an element forming surface and a back surface opposite from the element forming surface, a supporting substrate, and a temporary adhesive layer located between the element forming surface side of the wafer and the supporting substrate;

forming a thinned wafer by grinding the wafer in the reinforced wafer from the back surface side of the wafer;

bonding an element forming surface side of a base wafer to the back surface side of the thinned wafer of the reinforced wafer via an adhesive, the base wafer including the element forming surface and a back surface opposite from the element forming surface; and removing the supporting substrate by releasing a temporary adhesion in the temporary adhesive layer located between the supporting substrate and the thinned wafer in the reinforced wafer;

wherein a temporary adhesive for forming the temporary adhesive layer contains a polyvalent vinyl ether compound, a compound including two or more hydroxy groups or carboxy groups that are capable of forming an acetal bond by reacting with a vinyl ether group of the polyvalent vinyl ether compound so as to form a polymer with the polyvalent vinyl ether compound, and a thermoplastic resin; and the adhesive contains a polymerizable group-containing polyorganosilsesquioxane.

(2) The method of manufacturing a semiconductor device according to (2), wherein the bonding includes a curing treatment to cure the adhesive at a temperature lower than a softening point of the polymer, and the removing includes a softening treatment to soften the temporary adhesive layer at a temperature higher than the softening point of the polymer.

(3) The method of manufacturing a semiconductor device according to (1) or (2), the method further including:

preparing at least one additional reinforced wafer having a laminated structure, the laminated structure including a wafer having an element forming surface and a back surface opposite from the element forming surface, a supporting substrate, and a temporary adhesive layer formed of the temporary adhesive, the temporary adhesive layer being located between the element forming surface side of the wafer and the supporting substrate;

forming a thinned wafer by grinding the wafer in each of the at least one additional reinforced wafer from the back surface side of the wafer;

at least one additional bonding to bond the back surface side of the thinned wafer in the additional reinforced wafer to the element forming surface side of the thinned wafer that is on the base wafer via the adhesive; and at least one removing performed for each of the at least one additional bonding to remove the supporting substrate by releasing a temporary adhesion in the temporary adhesive layer located between the supporting substrate and the thinned wafer in the additional reinforced wafer.

(4) The method of manufacturing a semiconductor device according to (3), wherein the at least one additional bonding includes a curing treatment to cure the adhesive at a temperature lower than a softening point of the polymer, and the removing performed for each of the additional bonding includes a softening treatment to soften the temporary adhesive layer at a temperature higher than the softening point of the polymer.

(5) The method of manufacturing a semiconductor device according to any one of (1) to (4), wherein a constituent material of the wafer is silicon (Si), germanium (Ge), silicon carbide (SiC), gallium arsenide (GaAs), gallium nitride (GaN), or indium phosphide (InP).

(6) The method of manufacturing a semiconductor device according to any one of (1) to (5), wherein a thickness of the wafer is not greater than 1000 μm.

(7) The method of manufacturing a semiconductor device according to any one of (1) to (6), wherein the supporting substrate is a silicon wafer or a glass wafer.

(8) The method of manufacturing a semiconductor device according to (7), wherein the supporting substrate is a silicon wafer.

(9) The method of manufacturing a semiconductor device according to any one of (1) to (8), wherein a thickness of the supporting substrate is not less than 300 μm and not greater than 800 μm.

(10) The method of manufacturing a semiconductor device according to (9), wherein a thickness of the supporting substrate is not less than 700 μm and not greater than 800 μm.

(11) The method of manufacturing a semiconductor device according to any one of (1) to (10), wherein the polyvalent vinyl ether compound is a compound having two or more vinyl ether groups in a molecule represented by Formula (a) above.

(12) The method of manufacturing a semiconductor device according to any one of (1) to (11), wherein the polyvalent vinyl ether compound is at least one compound selected from the group consisting of 1,4-butanediol divinyl ether, diethylene glycol divinyl ether, and triethylene glycol divinyl ether, as well as compounds represented by Formulas (a-1) to (a-21) above.

(13) The method of manufacturing a semiconductor device according to any one of (1) to (11), wherein the polyvalent vinyl ether compound is at least one compound selected from the group consisting of 1,4-butanediol divinyl ether, diethylene glycol divinyl ether, and triethylene glycol divinyl ether.

(14) The method of manufacturing a semiconductor device according to any one of (1) to (11), wherein the polyvalent vinyl ether compound is at least one compound selected from the group consisting of 1,4-butanediol divinyl ether and triethylene glycol divinyl ether.

(15) The method of manufacturing a semiconductor device according to any one of (1) to (11), wherein the polyvalent vinyl ether compound is at least one compound selected from the group consisting of diethylene glycol divinyl ether and triethylene glycol divinyl ether.

(16) The method of manufacturing a semiconductor device according to any one of (1) to (11), wherein the polyvalent vinyl ether compound is at least one compound selected from the group consisting of 1,4-butanediol divinyl ether and diethylene glycol divinyl ether.

(17) The method of manufacturing a semiconductor device according to any one of (1) to (16), wherein the compound capable of forming a polymer with the polyvalent vinyl ether compound is a compound having two or more constituent units (repeating units) represented by Formula (b) above.

(18) The method of manufacturing a semiconductor device according to (17), wherein $n_2$ in Formula (b) above is an integer of 1 to 3.

(19) The method of manufacturing a semiconductor device according to (17) or (18), wherein the number of the constituent units (repeating units) represented by Formula (b) above in the compound capable of forming a polymer with the polyvalent vinyl ether compound is an integer from 2 to 40.

(20) The method of manufacturing a semiconductor device according to any one of (17) to (19), wherein a proportion of the constituent units (repeating units) represented by Formula (b) above in the compound capable of forming a polymer with the polyvalent vinyl ether compound is not less than 30 mass %, and the X is a hydroxy group.

(21) The method of manufacturing a semiconductor device according to any one of (17) to (19), wherein a proportion of the constituent units (repeating units) represented by Formula (b) above in the compound capable of forming a polymer with the polyvalent vinyl ether compound is not less than 1 mass %, and the X is a carboxy group.

(22) The method of manufacturing a semiconductor device according to any one of (17) to (21), wherein the constituent units (repeating units) represented by Formula (b) above are at least one type of constituent unit selected from the group consisting of Formulas (b-1) to (b-6) above.

(23) The method of manufacturing a semiconductor device according to any one of (17) to (21), wherein the constituent units (repeating units) represented by Formula (b) above are at least one type of constituent unit selected from the group consisting of Formulas (b-1), (b-2), (b-3), (b-4), and (b-5) above.

(24) The method of manufacturing a semiconductor device according to any one of (17) to (21), wherein the constituent units (repeating units) represented by Formula (b) above are at least one type of constituent unit selected from the group consisting of Formulas (b-1), (b-2), (b-3), (b-4), and (b-6) above.

(25) The method of manufacturing a semiconductor device according to any one of (17) to (21), wherein the constituent units (repeating units) represented by Formula (b) above are at least one type of constituent unit selected from the group consisting of Formulas (b-1), (b-2), (b-3), (b-5), and (b-6) above.

(26) The method of manufacturing a semiconductor device according to any one of (17) to (21), wherein the constituent units (repeating units) represented by Formula (b) above are at least one type of constituent unit selected from the group consisting of Formulas (b-1), (b-2), (b-4), (b-5), and (b-6) above.

(27) The method of manufacturing a semiconductor device according to any one of (17) to (21), wherein the constituent units (repeating units) represented by Formula (b) above are at least one type of constituent unit selected from the group consisting of Formulas (b-1), (b-3), (b-4), (b-5), and (b-6) above.

(28) The method of manufacturing a semiconductor device according to any one of (17) to (21), wherein the constituent units (repeating units) represented by Formula (b) above are at least one type of constituent unit selected from the group consisting of Formulas (b-1), (b-2), (b-3), and (b-4) above.

(29) The method of manufacturing a semiconductor device according to any one of (17) to (21), wherein the constituent units (repeating units) represented by Formula (b) above are at least one type of constituent unit selected from the group consisting of Formulas (b-1), (b-2), (b-3), and (b-5) above.

(30) The method of manufacturing a semiconductor device according to any one of (17) to (21), wherein the constituent units (repeating units) represented by Formula (b) above are at least one type of constituent unit selected from the group consisting of Formulas (b-1), (b-2), (b-4), and (b-5) above.

(31) The method of manufacturing a semiconductor device according to any one of (17) to (21), wherein the constituent units (repeating units) represented by Formula (b) above are at least one type of constituent unit selected from the group consisting of Formulas (b-1), (b-3), (b-4), and (b-5) above.

(32) The method of manufacturing a semiconductor device according to any one of (17) to (21), wherein the constituent units (repeating units) represented by Formula (b) above are at least one type of constituent unit selected from the group consisting of Formulas (b-1), (b-2), (b-3), and (b-6) above.

(33) The method of manufacturing a semiconductor device according to any one of (17) to (21), wherein the constituent units (repeating units) represented by Formula (b) above are at least one type of constituent unit selected from the group consisting of Formulas (b-1), (b-2), (b-4), and (b-6) above.

(34) The method of manufacturing a semiconductor device according to any one of (17) to (21), wherein the constituent units (repeating units) represented by Formula (b) above are at least one type of constituent unit selected from the group consisting of Formulas (b-1), (b-3), (b-4), and (b-6) above.

(35) The method of manufacturing a semiconductor device according to any one of (17) to (21), wherein the constituent units (repeating units) represented by Formula (b) above are at least one type of constituent unit selected from the group consisting of Formulas (b-1), (b-2), (b-5), and (b-6) above.

(36) The method of manufacturing a semiconductor device according to any one of (17) to (21), wherein the constituent units (repeating units) represented by Formula (b) above are at least one type of constituent unit selected from the group consisting of Formulas (b-1), (b-3), (b-5), and (b-6) above.

(37) The method of manufacturing a semiconductor device according to any one of (17) to (21), wherein the constituent units (repeating units) represented by Formula (b) above are at least one type of constituent unit selected from the group consisting of Formulas (b-1), (b-4), (b-5), and (b-6) above.

(38) The method of manufacturing a semiconductor device according to any one of (17) to (21), wherein the constituent units (repeating units) represented by Formula (b) above are at least one type of constituent unit selected from the group consisting of Formulas (b-1), (b-2), and (b-3) above.

(39) The method of manufacturing a semiconductor device according to any one of (17) to (21), wherein the constituent units (repeating units) represented by Formula (b) above are at least one type of constituent unit selected from the group consisting of Formulas (b-1), (b-2), and (b-4) above.

(40) The method of manufacturing a semiconductor device according to any one of (17) to (21), wherein the constituent units (repeating units) represented by Formula (b) above are at least one type of constituent unit selected from the group consisting of Formulas (b-1), (b-3), and (b-4) above.

(41) The method of manufacturing a semiconductor device according to any one of (17) to (21), wherein the constituent units (repeating units) represented by Formula (b) above are at least one type of constituent unit selected from the group consisting of Formulas (b-1), (b-2), and (b-6) above.

(42) The method of manufacturing a semiconductor device according to any one of (17) to (21), wherein the constituent units (repeating units) represented by Formula (b) above are at least one type of constituent unit selected from the group consisting of Formulas (b-1), (b-3), and (b-6) above.

(43) The method of manufacturing a semiconductor device according to any one of (17) to (21), wherein the constituent units (repeating units) represented by Formula (b) above are at least one type of constituent unit selected from the group consisting of Formulas (b-1), (b-5), and (b-6) above.

(44) The method of manufacturing a semiconductor device according to any one of (17) to (21), wherein the constituent units (repeating units) represented by Formula (b) above are at least one type of constituent unit selected from the group consisting of Formulas (b-1) and (b-2) above.

(45) The method of manufacturing a semiconductor device according to any one of (17) to (21), wherein the constituent units (repeating units) represented by Formula (b) above are at least one type of constituent unit selected from the group consisting of Formulas (b-1) and (b-3) above.

(46) The method of manufacturing a semiconductor device according to any one of (17) to (21), wherein the constituent units (repeating units) represented by Formula (b) above are at least one type of constituent unit selected from the group consisting of Formulas (b-1) and (b-4) above.

(47) The method of manufacturing a semiconductor device according to any one of (17) to (21), wherein the constituent units (repeating units) represented by Formula (b) above are at least one type of constituent unit selected from the group consisting of Formulas (b-1) and (b-5) above.

(48) The method of manufacturing a semiconductor device according to any one of (17) to (21), wherein the constituent units (repeating units) represented by Formula (b) above are at least one type of constituent unit selected from the group consisting of Formulas (b-1) and (b-6) above.

(49) The method of manufacturing a semiconductor device according to any one of (17) to (48), wherein the compound capable of forming a polymer with the polyvalent vinyl ether compound is a homopolymer consisting of the constituent units (repeating units) represented by Formula (b) above.

(50) The method of manufacturing a semiconductor device according to any one of (17) to (48), wherein the compound capable of forming a polymer with the polyvalent vinyl ether compound is a block polymer, a graft polymer, or a random polymer having the constituent units (repeating units) represented by Formula (b) above and any other constituent unit.

(51) The method of manufacturing a semiconductor device according to (50), wherein the any other constituent unit is a constituent unit derived from at least one polymerizable monomer selected from the group consisting of a chain olefin, an aromatic vinyl compound, an unsaturated carboxylic acid ester, a carboxylic acid vinyl ester, and an unsaturated dicarboxylic acid diester.

(52) The method of manufacturing a semiconductor device according to (51), wherein the aromatic vinyl compound is a constituent unit derived from at least one polymerizable monomer selected from the group consisting of styrene, vinyl toluene, and α-methylstyrene.

(53) The method of manufacturing a semiconductor device according to (51), wherein the aromatic vinyl compound is a constituent unit derived from at least one polymerizable monomer selected from the group consisting of styrene and vinyl toluene.

(54) The method of manufacturing a semiconductor device according to (51), wherein the aromatic vinyl compound is a constituent unit derived from at least one polymerizable monomer selected from the group consisting of styrene and α-methylstyrene.

(55) The method of manufacturing a semiconductor device according to any one of (1) to (54), wherein a softening point of the compound capable of forming a polymer with the polyvalent vinyl ether compound is not lower than 50° C. and not higher than 250° C.

(56) The method of manufacturing a semiconductor device according to any one of (1) to (55), wherein a weight average molecular weight (by the GPC method calibrated with polystyrene standards) of the compound capable of forming a polymer with the polyvalent vinyl ether compound is not lower than 1500.

(57) The method of manufacturing a semiconductor device according to any one of (1) to (56), wherein the thermoplastic resin is at least one selected from the group consisting of polyvinyl acetal resins, polyester resins, polyurethane resins, and polyamide resins.

(58) The method of manufacturing a semiconductor device according to any one of (1) to (56), wherein the thermoplastic resin is at least one selected from the group consisting of polyvinyl acetal resins and polyester resins.

(59) The method of manufacturing a semiconductor device according to (57) or (58), wherein the polyvinyl acetal resin is at least one selected from the group consisting of polyvinyl formal and polyvinyl butyral.

(60) The method of manufacturing a semiconductor device according to (57) or (58), wherein the polyester resin is a polyester obtained by ring-opening polymerization of lactone.

(61) The method of manufacturing a semiconductor device according to (57) or (58), wherein the polyester resin is a polyester obtained by ring-opening polymerization of at least one selected from the group consisting of ε-caprolactone, δ-valerolactone, and γ-butyrolactone.

(62) The method of manufacturing a semiconductor device according to (57) or (58), wherein the polyester resin is a polyester obtained by ring-opening polymerization of at least one selected from the group consisting of ε-caprolactone and γ-butyrolactone.

(63) The method of manufacturing a semiconductor device according to (57) or (58), wherein the polyester resin is a polyester obtained by ring-opening polymerization of at least one selected from the group consisting of ε-caprolactone and δ-valerolactone.

(64) The method of manufacturing a semiconductor device according to any one of (1) to (63), wherein a weight average molecular weight Mw (by the GPC method calibrated with polystyrene standards) of the thermoplastic resin is from 1500 to 100000.

(65) The method of manufacturing a semiconductor device according to any one of (1) to (64), wherein a content of the thermoplastic resin in the temporary adhesive is from 0.1 to 3 mass relative to 1 part by mass of the compound capable of forming a polymer with the polyvalent vinyl ether compound.

(66) The method of manufacturing a semiconductor device according to any one of (1) to (65), wherein the temporary adhesive further contains a monohydric alcohol and/or a monovalent carboxylic acid.

(67) The method of manufacturing a semiconductor device according to any one of (1) to (66), wherein a softening point of the temporary adhesive is from 130 to 250° C.

(68) The method of manufacturing a semiconductor device according to any one of (1) to (67), wherein a thickness of the thinned wafer is from 1 to 20 μm.

(69) The method of manufacturing a semiconductor device according to any one of (1) to (68), wherein the polymerizable group-containing polyorganosilsesquioxane contains constituent units represented by Formula (1) above and Formula (2) above.

(70) The method of manufacturing a semiconductor device according to any one of (1) to (69), wherein $R^1$ in Formula (1) above and Formula (2) above is a group containing an epoxy group or a (meth)acryloyl group.

(71) The method of manufacturing a semiconductor device according to (70), wherein the group containing an epoxy group is at least one of groups represented by Formulas (3) to (6) above.

(72) The method of manufacturing a semiconductor device according to (70), wherein the group containing an epoxy group is at least one of groups represented by Formulas (3), (4), and (5) above.

(73) The method of manufacturing a semiconductor device according to (70), wherein the group containing an epoxy group is at least one of groups represented by Formulas (3), (5), and (6) above.

(74) The method of manufacturing a semiconductor device according to (70), wherein the group containing an epoxy group is at least one of groups represented by Formulas (3), (4), and (6) above.

(75) The method of manufacturing a semiconductor device according to (70), wherein the group containing an epoxy group is at least one of groups represented by Formulas (3) and (4) above.

(76) The method of manufacturing a semiconductor device according to (70), wherein the group containing an epoxy group is at least one of groups represented by Formulas (3) and (5) above.

(77) The method of manufacturing a semiconductor device according to (70), wherein the group containing an epoxy group is at least one of groups represented by Formulas (3) and (6) above.

(78) The method of manufacturing a semiconductor device according to (70), wherein the group containing an epoxy group is a 2-(3,4-epoxycyclohexyl)ethyl group.

(79) The method of manufacturing a semiconductor device according to any one of (1) to (78), wherein a number average molecular weight Mn (by the GPC method calibrated with polystyrene standards) of the polymerizable group-containing polyorganosilsesquioxane is from 1000 to 50000.

(80) The method of manufacturing a semiconductor device according to any one of (1) to (79), wherein a molecular weight dispersity (Mw/Mn) of the polymerizable group-containing polyorganosilsesquioxane is from 1.0 to 4.0.

(81) The method of manufacturing a semiconductor device according to any one of (1) to (80), wherein a thickness of the base wafer is not less than 300 μm and not greater than 1000 μm in the bonding step.

(82) The method of manufacturing a semiconductor device according to any one of (2) to (81), wherein a temperature of the curing treatment is from 30 to 200° C.

(83) The method of manufacturing a semiconductor device according to any one of (1) to (82), wherein a thickness of the adhesive layer after the curing is from 0.5 to 20 μm.

(84) The method of manufacturing a semiconductor device according to any one of (2) to (83), wherein a temperature of the softening treatment is not lower than 170° C. and not higher than 250° C.

(85) The method of manufacturing a semiconductor device according to any one of (1) to (84), the method further including forming a through electrode extending inside a wafer laminate that is obtained through the removing step, the through electrode extending from an element forming surface of a thinned wafer located at one end of the wafer laminate in a lamination direction through an element forming surface of a base wafer located at another end of the wafer laminate.

(86) The method of manufacturing a semiconductor device according to any one of (1) to (85), the method further including thinning the base wafer by grinding on the back surface side of the base wafer.

(87) The method of manufacturing a semiconductor device according to (86), wherein a thickness of the base wafer is from 5 to 400 μm in the thinning step of the base wafer.

(88) The method of manufacturing a semiconductor device according to any one of (1) to (84), the method further including:
forming a through electrode inside a wafer laminate that is obtained through the removing step, the through electrode extending from an element forming surface of a thinned wafer located at one end of the wafer laminate in a lamination direction through a position passing an element forming surface of a base wafer located at another end of the wafer laminate; and
base wafer thinning to thin the base wafer by grinding the back surface side of the base wafer so as to expose the through electrode on the back surface side.

(89) The method of manufacturing a semiconductor device according to (88), wherein a thickness of the base wafer is from 5 to 200 μm in the base wafer thinning.

(90) The method of manufacturing a semiconductor device according to (88) or (89), the method further including bonding an element forming surface side of a thinned wafer located at one end of a wafer laminate in a lamination direction, the wafer laminate being obtained through one of the base wafer thinning steps, to an element forming surface side of a thinned wafer located at one end of a wafer laminate in a lamination direction, the wafer laminate being obtained through the other one of the base wafer thinning steps.

(90) The method of manufacturing a semiconductor device according to (88) or (89), the method further including bonding an element forming surface side of a thinned wafer located at one end of a wafer laminate in a lamination direction, the wafer laminate being obtained through one of the base wafer thinning steps, to a back surface side of a base wafer located at one end of a wafer laminate in a lamination direction, the wafer laminate being obtained through the other one of the base wafer thinning steps.

(91) The method of manufacturing a semiconductor device according to (88) or (89), the method further including bonding a back surface side of a base wafer located at one end of a wafer laminate in a lamination direction, the wafer laminate being obtained through one of the base wafer thinning steps, to a back surface side of a base wafer located at one end of a wafer laminate in a lamination direction, the wafer laminate being obtained through the other one of the base wafer thinning steps.

INDUSTRIAL APPLICABILITY

The manufacturing method of the present invention is suitable for achieving good adhesive bonding of the thinned wafer to the base wafer while maintaining the temporary adhesion of the supporting substrate and the thinned wafer in the reinforced wafer, and suitable for removing the supporting substrate from the thinned wafer by softening the temporary adhesive layer while maintaining the adhesive bonding between the base wafer and the thinned wafer in the subsequent removing. Thus, the manufacturing method of the present invention can multilayer thin wafers via an adhesive while avoiding wafer damage in a method of manufacturing a semiconductor device, the method in which semiconductor elements are multilayered through laminating wafers in which the semiconductor elements are fabricated. Thus, the present invention has industrial applicability.

REFERENCE SIGNS LIST

S Supporting substrate
1 Wafer
1T Thinned wafer
1a, 3a Element forming surface
1b, 3b Back surface
1R Reinforced wafer
3 Wafer (base wafer)
2 Temporary adhesive layer
4 Adhesive
5 Through electrode
Y Wafer laminate

The invention claimed is:

1. A method of manufacturing a semiconductor device, the method comprising:
preparing a reinforced wafer having a laminated structure, the laminated structure comprising a wafer including an element forming surface and a back surface opposite from the element forming surface, a supporting substrate, and a temporary adhesive layer located between the element forming surface side of the wafer and the supporting substrate;
forming a thinned wafer by grinding the wafer in the reinforced wafer from the back surface side of the wafer;
bonding an element forming surface side of a base wafer to the back surface side of the thinned wafer of the reinforced wafer via an adhesive, so that the temporary adhesive layer is located between the element forming surface side of the thinned wafer and the supporting substrate, and the adhesive is located between the element forming surface side of the base wafer and the back surface side of the thinned wafer, the base wafer including the element forming surface and a back surface opposite from the element forming surface; and
removing the supporting substrate by releasing a temporary adhesion in the temporary adhesive layer located between the supporting substrate and the thinned wafer in the reinforced wafer;
wherein a temporary adhesive for forming the temporary adhesive layer contains a polyvalent vinyl ether compound, a compound including two or more hydroxy groups or carboxy groups that are capable of forming an acetal bond by reacting with a vinyl ether group of the polyvalent vinyl ether compound so as to form a polymer with the polyvalent vinyl ether compound, and a thermoplastic resin,
the temporary adhesive for forming the temporary adhesive layer is coated on the supporting substrate to form the temporary adhesive coating, and
the adhesive contains a polymerizable group-containing polyorganosilsesquioxane.

2. The method of manufacturing a semiconductor device according to claim 1, wherein
the bonding comprises a curing treatment to cure the adhesive at a temperature lower than a softening point of the polymer, and
the removing comprises a softening treatment to soften the temporary adhesive layer at a temperature higher than the softening point of the polymer.

3. The method of manufacturing a semiconductor device according to claim 2, wherein
the adhesive has a polymerization temperature or a curing temperature of 30 to 200° C., and
the temporary adhesive layer has a softening temperature of 130 to 250° C.

4. The method of manufacturing a semiconductor device according to claim 1, the method further comprising:
preparing at least one additional reinforced wafer having a laminated structure, the laminated structure comprising a wafer including an element forming surface and a back surface opposite from the element forming surface, a supporting substrate, and a temporary adhesive layer formed of the temporary adhesive, the temporary adhesive layer being located between the element forming surface side of the wafer and the supporting substrate;
forming a thinned wafer by grinding the wafer in each of the at least one additional reinforced wafer from the back surface side of the wafer;
at least one additional bonding to bond the back surface side of the thinned wafer in the additional reinforced wafer to the element forming surface side of the thinned wafer that is on the base wafer via the adhesive; and
at least one removing performed for each of the at least one additional bonding to remove the supporting substrate by releasing a temporary adhesion in the temporary adhesive layer located between the supporting substrate and the thinned wafer in the additional reinforced wafer.

5. The method of manufacturing a semiconductor device according to claim 4, wherein
the at least one additional bonding comprises a curing treatment to cure the adhesive at a temperature lower than a softening point of the polymer, and
the removing performed for each of the additional bonding comprises a softening treatment to soften the temporary adhesive layer at a temperature higher than the softening point of the polymer.

6. The method of manufacturing a semiconductor device according to claim 1, the method further comprising forming a through electrode inside a wafer laminate that is obtained through the removing step, the through electrode extending from an element forming surface of a thinned wafer located at one end of the wafer laminate in a lamination direction through an element forming surface of a base wafer located at another end of the wafer laminate.

7. The method of manufacturing a semiconductor device according to claim 1, the method further comprising thinning the base wafer by grinding the back surface side of the base wafer.

8. The method of manufacturing a semiconductor device according to claim 1, the method further comprising:
forming a through electrode inside a wafer laminate that is obtained through the removing step, the through electrode extending from an element forming surface of a thinned wafer located at one end of the wafer laminate in a lamination direction through a position passing an element forming surface of a base wafer located at another end of the wafer laminate; and
base wafer thinning to thin the base wafer by grinding the back surface side of the base wafer so as to expose the through electrode on the back surface side.

9. The method of manufacturing a semiconductor device according to claim 8, the method further comprising bonding an element forming surface side of a thinned wafer located at one end of a wafer laminate in a lamination direction, the wafer laminate being obtained through one of the base wafer thinning steps, to an element forming surface side of a thinned wafer located at one end of a wafer laminate in a lamination direction, the wafer laminate being obtained through the other one of the base wafer thinning steps.

10. The method of manufacturing a semiconductor device according to claim 8, the method further comprising bonding an element forming surface side of a thinned wafer located at one end of a wafer laminate in a lamination direction, the wafer laminate being obtained through one of the base wafer thinning steps, to a back surface side of a base wafer located at one end of a wafer laminate in a lamination direction, the wafer laminate being obtained through the other one of the base wafer thinning steps.

11. The method of manufacturing a semiconductor device according to claim 8, the method further comprising bonding a back surface side of a base wafer located at one end of a wafer laminate in a lamination direction, the wafer laminate being obtained through one of the base wafer thinning steps, to a back surface side of a base wafer located at one end of a wafer laminate in a lamination direction, the wafer laminate being obtained through the other one of the base wafer thinning steps.

12. The method of manufacturing a semiconductor device according to claim 1, wherein the polyvalent vinyl ether compound is a compound having two or more vinyl ether groups in a molecule represented by Formula (a) below:

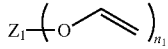
(a)

where $Z_1$ represents a group in which $n_1$ hydrogen atoms are removed from a structural formula of a saturated or unsaturated aliphatic hydrocarbon, a saturated or unsaturated alicyclic hydrocarbon, an aromatic hydrocarbon, a heterocyclic compound, or a bonded body in which any of these are bonded via a single bond or a linking group; and $n_1$ represents an integer of 2 or greater.

13. The method of manufacturing a semiconductor device according to claim 1, wherein the polyvalent vinyl ether compound is at least one compound selected from the group consisting of 1,4-butanediol divinyl ether, diethylene glycol divinyl ether, and triethylene glycol divinyl ether.

14. The method of manufacturing a semiconductor device according to claim 1, wherein the compound capable of forming a polymer with the polyvalent vinyl ether compound is a compound having two or more constituent units (repeating units) represented by Formula (b) below:

(b)

where X represents a hydroxy group or a carboxy group; and $n_2$ represents an integer of 1 or greater; and $n_2$ X's may be identical or different from each other; and $Z_2$ represents a group in which ($n_2$+2) hydrogen atoms are removed from a structural formula of a saturated or unsaturated aliphatic hydrocarbon, a saturated or unsaturated alicyclic hydrocarbon, an aromatic hydrocarbon, a heterocyclic compound, or a bonded body in which any of these are bonded via a single bond or a linking group.

15. The method of manufacturing a semiconductor device according to claim 14, wherein the constituent units (repeating units) represented by Formula (b) above are at least one type of constituent unit selected from the group consisting of constituent units represented by Formulas (b-1) to (b-6) below:

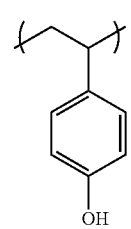
(b-1)

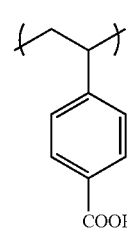
(b-2)

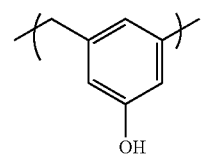
(b-3)

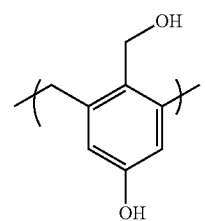
(b-4)

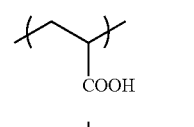
(b-5)

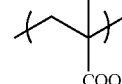
(b-6)

16. The method of manufacturing a semiconductor device according to claim 1, wherein the thermoplastic resin is at least one selected from the group consisting of polyvinyl acetal resins, polyester resins, polyurethane resins, and polyamide resins.

17. The method of manufacturing a semiconductor device according to claim 16, wherein the polyvinyl acetal resin is at least one selected from the group consisting of polyvinyl formal and polyvinyl butyral.

18. The method of manufacturing a semiconductor device according to claim 16, wherein the polyester resin is a polyester obtained by ring-opening polymerization of at least one selected from the group consisting of ε-caprolactone, δ-valerolactone, and γ-butyrolactone.

19. The method of manufacturing a semiconductor device according to claim 1, wherein the polymerizable group-containing polyorganosilsesquioxane contains constituent units represented by Formula (1) and Formula (2) below:

$$[R^1SiO_{3/2}] \quad (1)$$

$$[R^1SiO_{2/2}(OR^2)] \quad (2)$$

where $R^1$ represents a group containing an epoxy group or a (meth)acryloyloxy group; and $R^2$ represents a hydrogen atom or an alkyl group having from 1 to 4 carbon atoms.

20. The method of manufacturing a semiconductor device according to claim 1, wherein the group containing an epoxy group is at least one of groups represented by Formulas (3) to (6) below:

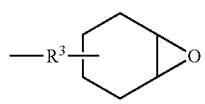

(3)

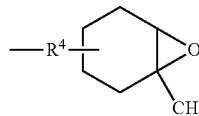

(4)

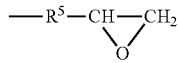

(5)

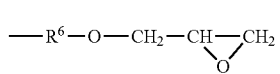

(6)

where each of $R^3$, $R^4$, $R^5$, and $R^6$ represents a linear or branched alkylene group having from 1 to 10 carbon atoms.

21. The method of manufacturing a semiconductor device according to claim 19, wherein the polymerizable group-containing polyorganosilsesquioxane contains constituent units represented by Formula (7) and Formula (8) below:

$$[R^7SiO_{3/2}] \quad (7)$$

$$[R^7SiO_{2/2}(OR^2)] \quad (8)$$

where $R^7$ represents a hydrogen atom, a substituted or unsubstituted alkyl group, a substituted or unsubstituted alkenyl group, a substituted or unsubstituted cycloalkyl group, a substituted or unsubstituted aryl group, or a substituted or unsubstituted aralkyl group; and $R^2$ represents a hydrogen atom or an alkyl group having from 1 to 4 carbon atoms.

* * * * *